US008441837B2

(12) United States Patent
Ikeda et al.

(10) Patent No.: US 8,441,837 B2
(45) Date of Patent: May 14, 2013

(54) VARIABLE RESISTANCE NONVOLATILE MEMORY DEVICE

(75) Inventors: Yuuichirou Ikeda, Hyogo (JP);
Kazuhiko Shimakawa, Osaka (JP);
Yoshihiko Kanzawa, Osaka (JP);
Shunsaku Muraoka, Osaka (JP);
Ryotaro Azuma, Osaka (JP)

(73) Assignee: Panasonic Corporation, Osaka (JP)

( * ) Notice: Subject to any disclaimer, the term of this patent is extended or adjusted under 35 U.S.C. 154(b) by 209 days.

(21) Appl. No.: 13/054,312

(22) PCT Filed: Apr. 14, 2010

(86) PCT No.: PCT/JP2010/002683
§ 371 (c)(1),
(2), (4) Date: Jan. 14, 2011

(87) PCT Pub. No.: WO2010/119671
PCT Pub. Date: Oct. 21, 2010

(65) Prior Publication Data
US 2011/0122680 A1    May 26, 2011

(30) Foreign Application Priority Data

Apr. 15, 2009   (JP) ................................. 2009-099325

(51) Int. Cl.
*G11C 11/00*    (2006.01)

(52) U.S. Cl.
USPC .. 365/148; 365/200; 365/185.22; 365/185.11; 365/230.03; 365/163

(58) Field of Classification Search .................. 365/200, 365/185.22, 185.11, 230.03, 148, 163
See application file for complete search history.

(56) References Cited

U.S. PATENT DOCUMENTS

| 7,426,128 B2 | 9/2008 | Scheuerlein |
| 7,633,820 B2 | 12/2009 | Tsukada |

(Continued)

FOREIGN PATENT DOCUMENTS

| CN | 1897155 | 1/2007 |
| CN | 101258600 | 9/2008 |

(Continued)

OTHER PUBLICATIONS

International Search Report issued Aug. 3, 2010 in International (PCT) Application No. PCT/JP2010/002683.

(Continued)

*Primary Examiner* — Fernando Hidalgo
(74) *Attorney, Agent, or Firm* — Wenderoth, Lind & Ponack, L.L.P.

(57) ABSTRACT

A nonvolatile resistance variable memory device (100) includes memory cells (M11, M12, . . . ) in each of which a variable resistance element (R11, R12, . . . ) including a variable resistance layer placed between and in contact with a first electrode and a second electrode, and a current steering element (D11, D12, . . . ) including a current steering layer placed between and in contact with a third electrode and a fourth electrode, are connected in series, and the device is driven by a first LR drive circuit (105*a*1) via a current limit circuit (105*b*) to decrease resistance of the variable resistance element while the device is driven by a second HR drive circuit (105*a*2) to increase resistance of the variable resistance element, thus using the current limit circuit (105*b*) to make a current for decreasing resistance of the variable resistance element lower than a current for increasing resistance of the variable resistance element.

38 Claims, 43 Drawing Sheets

U.S. PATENT DOCUMENTS

| | | |
|---|---|---|
| 7,869,258 B2 | 1/2011 | Scheuerlein et al. |
| 7,944,728 B2 | 5/2011 | Nian et al. |
| 7,978,507 B2 | 7/2011 | Scheuerlein |
| 8,059,447 B2 | 11/2011 | Scheuerlein et al. |
| 8,098,511 B2 | 1/2012 | Scheuerlein et al. |
| 8,111,539 B2 | 2/2012 | Fasoli et al. |
| 8,270,210 B2 | 9/2012 | Scheuerlein |
| 8,310,892 B2 | 11/2012 | Scheuerlein et al. |
| 8,354,877 B2 | 1/2013 | Tsukada |
| 2004/0114444 A1 | 6/2004 | Matsuoka |
| 2004/0264244 A1 | 12/2004 | Morimoto |
| 2005/0174840 A1 | 8/2005 | Tsushima et al. |
| 2006/0250836 A1 | 11/2006 | Herner et al. |
| 2007/0008773 A1 | 1/2007 | Scheuerlein |
| 2007/0008795 A1 | 1/2007 | Tsukada |
| 2007/0165442 A1 | 7/2007 | Hosoi et al. |
| 2007/0195581 A1 | 8/2007 | Morimoto |
| 2009/0052225 A1 | 2/2009 | Morimoto |
| 2009/0097300 A1* | 4/2009 | Ishihara et al. ............... 365/148 |
| 2009/0283736 A1 | 11/2009 | Kanzawa et al. |
| 2009/0323391 A1 | 12/2009 | Scheuerlein et al. |
| 2009/0323392 A1 | 12/2009 | Fasoli et al. |
| 2009/0323393 A1 | 12/2009 | Scheuerlein et al. |
| 2009/0323394 A1 | 12/2009 | Scheuerlein |
| 2010/0039171 A1 | 2/2010 | Tsukada |
| 2010/0157652 A1 | 6/2010 | Nian et al. |
| 2010/0172170 A1 | 7/2010 | Tamai et al. |
| 2010/0188884 A1 | 7/2010 | Mitani et al. |
| 2010/0207094 A1 | 8/2010 | Kanzawa et al. |
| 2011/0075468 A1 | 3/2011 | Scheuerlein et al. |
| 2011/0235404 A1 | 9/2011 | Scheuerlein |
| 2011/0267872 A1* | 11/2011 | Toda ............................ 365/148 |
| 2012/0008373 A1 | 1/2012 | Scheuerlein et al. |

FOREIGN PATENT DOCUMENTS

| | | |
|---|---|---|
| CN | 102077295 | 5/2011 |
| JP | 2004-234707 | 8/2004 |
| JP | 2005-25914 | 1/2005 |
| JP | 2005-235360 | 9/2005 |
| JP | 2006-203098 | 8/2006 |
| JP | 2007-188603 | 7/2007 |
| JP | 2007-226883 | 9/2007 |
| JP | 2008-123690 | 5/2008 |
| JP | 4253038 | 4/2009 |
| JP | 2010-21381 | 1/2010 |
| WO | 2007/008902 | 1/2007 |
| WO | 2008/012871 | 1/2008 |
| WO | 2008/142919 | 11/2008 |
| WO | 2008/149484 | 12/2008 |
| WO | 2009/050833 | 4/2009 |
| WO | 2009/136467 | 11/2009 |
| WO | 2009/158677 | 12/2009 |
| WO | 2010/004705 | 1/2010 |

OTHER PUBLICATIONS

David R. Lide, Editor-in-Chief, "*CRC Handbook of Chemistry and Physics*", 84$^{th}$ Edition 2003-2004, CRC Press.

* cited by examiner (a)

(b)

(a)

(b)

(b)

(a)

1503
1504
1502
1501

(a)

(b)

(a)

(b)

(a)

(b)

(a)

(b)

(a)

(b)

(a)

(b)

(c)

VARIABLE RESISTANCE NONVOLATILE MEMORY DEVICE

TECHNICAL FIELD

The present invention relates to a variable resistance nonvolatile memory device having memory cells each of which includes a current steering element and a variable resistance element in which a resistance value reversibly changes based on electrical signals.

BACKGROUND ART

In recent years, research and development projects regarding nonvolatile memory devices having memory cells structured with variable resistance elements have been moved forward. A variable resistance element is an element which has a property that a resistance value reversibly changes based on electrical signals and further can store data corresponding to the resistance value in a nonvolatile manner.

Commonly known as a nonvolatile memory device including variable resistance elements is a nonvolatile memory device including memory cells, that is, so-called 1T1R memory cells each formed by connecting in series a transistor and a variable resistance element, each of which is array-arranged in a matrix at a position where a bit line intersects a word line arranged to be orthogonal to the bit line. For higher integration, also known are a nonvolatile memory device including memory cells, that is, so-called cross point 1D1R memory cells, array-arranged in a matrix, and a nonvolatile memory device including a plurality of layers of the 1D1R cross point memory cells. Each of the 1D1R cross point memory cells is formed by connecting in series a variable resistance element and a diode functioning as a current steering element, and is provided at a position where a bit line intersects a word line arranged to be orthogonal to the bit line.

PTL 1 discloses a nonvolatile memory device including 1T1R memory cells in which amorphous thin films such as rare-earth oxide films are used as variable resistance elements.

FIG. 41 is a circuit diagram of the memory cell of the nonvolatile memory device disclosed by PTL 1.

A memory cell 1001 is composed of a transistor 1002 and a variable resistance element 1003 which are electrically connected in series.

PTL 1 discloses, as a material for the variable resistance element 1003, an amorphous thin film such as a rare-earth oxide film, and discloses, as a material for an electrode, copper, silver, and zinc.

FIG. 42 is a graph showing a voltage-current change of the variable resistance element 1003 which is used in the memory cell of the nonvolatile memory device disclosed by PTL 1. At the time of writing, a potential difference is applied between V1 and V2 of FIG. 41 so that a voltage of +1.1X [V] or higher and a small amount of current are applied to the variable resistance element 1003 which thereby changes from a high resistance state to a low resistance state. At the time of erasing, a voltage having reverse polarity to that of writing is applied so that a voltage of −1.1X [V] and a current of −1.5Y [A] are applied to the variable resistance element 1003 which thereby changes from a low resistance state to a high resistance state.

PTL 1 discloses that at the time of writing, controlling the value of current upon the change of the variable resistance element 103 to the low resistance state according to a change in the on-resistance value of the transistor 1002 of FIG. 41 with its gate voltage controlled or in the like method allows a control on the resistance value of the variable resistance element 1003 in the low resistance state, and discloses applying this principle to multi-valued memories.

PTL 2 discloses a nonvolatile memory device which includes 1D1R cross point memory cells using, as a variable resistance element, a material having a perovskite type crystalline structure, and using a varistor as a bi-directional diode.

FIG. 43 schematically shows a memory cell array of a nonvolatile memory device 1200 disclosed by PTL 2. A memory cell 1280 is composed of a diode 1270 and a variable resistance element 1260 which are electrically connected in series. Numerals 1210 and 1220 denote a bit line and a word line, respectively.

In the variable resistance element 1260, a variable resistance layer 1230 of which resistance is changed by voltage application is held between an upper electrode 1240 and a lower electrode 1250.

FIG. 44 shows voltage-current characteristics of a diode 1270. As shown in FIG. 44, the diode is bi-directional and has symmetrical and non-linear voltage-current characteristics allowing a drastic increase in current at a voltage equal to or higher than a threshold voltage Vth.

PTL 2 discloses, as a material for the variable resistance layer 1230, manganese, titanium, zirconia, and a high-temperature superconducting material, manganese oxide obtained by combining the rare-earth metals such as La or Pr or a mixed crystal of La and Pr, the alkaline earth metals such as Ca or Sr or a mixed crystal of Ca and Sr, and $Pr_{1-x}Ca_xMnO_3$ (x=0.3, 0.5), and discloses, as a material for the upper electrode 1240 and the lower electrode 1250, a simple substance or alloy of Pt, Ir, Ph, and Pd, an oxide conductor such as Ir and Ru, SRO and YBCO. As a material or device for the diode, PTL 2 discloses a ZnO varistor prepared by sintering a metal oxide such as zinc oxide and a small amount of bismuth oxide, and a $SrTiO_3$ varistor.

Furthermore, PTL 2 discloses that at the time of writing, Vpp is applied to the selected bit lines, ½ Vpp is applied to the non-selected bit line, 0 V is applied to the selected word lines, and ½ Vpp is applied to the non-selected word lines, and at the time of erasing, Vpp is applied to the selected word lines, ½ Vpp is applied to the non-selected word lines, 0 V is applied to the selected bit lines, and ½ Vpp is applied to the non-selected bit lines.

Thus, PTL 2 discloses that by using, as the diode of the 1D1R cross point memory cell, a non-linear element such as a varistor allowing the currents to flow bi-directionally, necessary currents can be flown bi-directionally at the time of writing, and moreover, optimizing the threshold voltage Vth so that the voltage ½ Vpp applied to the non-selected lines is lower than the threshold voltage Vth of the non-linear element solves the problem of current leakage to the non-selected cells, with the result that the array size of the memory cell array can be made larger and a high integration can be achieved.

[Citation List]
[Patent Literature]
  [PTL 1]
Japanese Unexamined Patent Application Publication No. 2005-235360 (FIGS. 1 and 2)
  [PTL 2]
Japanese Unexamined Patent Application Publication No. 2006-203098 (FIGS. 2 and 4)

SUMMARY OF INVENTION

Technical Problem

Inventors of the present application have examined, as one of variable resistance nonvolatile memory devices, a variable resistance nonvolatile memory device including 1D1R cross point memory cells each having a variable resistance layer comprising an oxygen-deficient oxide of a transition metal.

Here, the oxygen-deficient oxide is an oxide whose composition is deficient of oxygen compared to its stoichiometric composition. In an example of tantalum that is one of transition metals, $Ta_2O_5$ is the oxide having the stoichiometric composition. $Ta_2O_5$ contains oxygen 2.5 times greater than the tantalum, which is 71.4% when expressed with an oxygen content atomic percentage. An oxide whose oxygen content atomic percentage is lower than the oxygen content atomic percentage 71.4%, that is, a Ta oxide having non-stoichiometric composition which is expressed as $TaO_x$ and satisfies $0<x<2.5$ is called an oxygen-deficient Ta oxide. Generally, many transition metal oxides having respective stoichiometric compositions are insulators, but oxygen-deficient oxides exhibit a semiconductive or conductive property.

The following describes properties of a variable resistance element having a variable resistance layer comprising the oxygen-deficient Ta oxide, in order to facilitate description of problems to be solved.

FIG. 1 schematically shows a basic structure of the variable resistance element used for the measurement. An oxygen-deficient Ta oxide is used for a variable resistance layer 3302 of the variable resistance element. The variable resistance element is structured to be top-and-bottom symmetry by locating the variable resistance layer 3302 between a lower electrode 3301 and an upper electrode 3303, both of which contain Pt.

Hereinafter, the nonvolatile element is called an element A. It is to be noted that Table 1 shows a relationship between names of elements and electrode materials including elements to be described in an embodiment.

TABLE 1

| Name of Element | Lower Electrode Material | Upper Electrode Material |
|---|---|---|
| A | Pt | Pt |
| B | Pt | Pt |
| C | W | W |
| D | Ta | Ta |
| E | TaN | TaN |
| F | W | Pt |
| G | W | Ir |
| H | W | Ag |
| I | W | Cu |
| J | W | Ni |
| K | W | Ta |
| L | W | Ti |
| M | W | Al |
| N | W | TaN |

FIG. 2 is a graph showing hysteretic current-voltage characteristics showing an example of a situation of a resistance change of the element A. The horizontal axis of the graph indicates a voltage of the upper electrode 3303 with reference to the lower electrode 3301, and the vertical axis of the same indicates a value of a current flowing through the element A.

In FIG. 2, it is assumed that the variable resistance element is initially on a point O with a voltage of 0 V in a low resistance state. As the upper electrode 3303 is given a positive voltage with respect to the lower electrode 3301, a current increases substantially in proportion to the voltage, but with a voltage over the positive voltage on a point A, the current decrease sharply to a point D. That is, this shows a change (an increase in resistance) from a low resistance state to a high resistance state.

On the other hand, in the point O in a high resistance state, as the upper electrode 3303 is given a negative voltage with respect to the lower electrode 3301 (which is equivalent to giving the lower electrode 3301a positive voltage with respect to the upper electrode 3303), the current increases sharply with a voltage over the negative voltage on a point B. That is, this shows a change (a decrease in resistance) from a high resistance state to a low resistance state. In addition, a phenomenon was observed that the low resistance value on a terminal point C of FIG. 2 depended on the value of current flowing in the resistance-decreasing state (equivalent to the state on the point C of FIG. 2) as in the phenomenon disclosed by PTL 1.

Furthermore, in the resistance change characteristics shown in FIG. 2, the terminal point C of the resistance-decreasing state and the starting point A of the resistance-increasing state are located roughly symmetrically. That is, it can be seen that applying a current controlled to a predetermined level (approximately −15 mA at the point C) at the resistance-decreasing point corresponding to the point C results in a desired low resistance, while applying a current more than the above at the voltage corresponding to the point A results in an increase in resistance so that a stable resistance change operation can be achieved.

The inventors of the present application have discovered during the examination that a voltage application direction (driving polarity) stably causing a resistance change in a direction (a decrease in resistance and an increase in resistance) is not always uniform, and that variable resistance elements differ in the driving polarity, the variable resistance elements comprising the same material using Pt for the upper and lower electrodes and the oxygen-deficient Ta oxide for the variable resistance layer.

For instance, a variable resistance element has been verified to decrease in resistance by applying a pulse voltage of +2.0V amplitude and 100 ns width to an upper electrode 3303 and a lower electrode 3301, and to increase in resistance by applying a pulse voltage of −2.6V amplitude and 100 ns width thereto, with a high voltage of the upper electrode 3303 being positive with reference to the lower electrode 3301.

In addition, another variable resistance element has been verified to decrease in resistance by applying a pulse voltage of −2.0V amplitude and 100 ns width to an upper electrode 3303 and a lower electrode 3301, and to increase in resistance by applying a pulse voltage of +2.7V amplitude and 100 ns width thereto, with a high voltage of the per electrode 3303 being positive with reference to the lower electrode 3301.

FIGS. 3(a) and 3(b) are graphs each showing a resistance value of each of these variable resistance elements every time alternate application of a pulse voltage causing a decrease in resistance and a pulse voltage causing an increase in resistance is continuously performed. The horizontal axis of the graph indicates the number of electric pulses, and the vertical axis of the same indicates the resistance value.

As shown in FIG. 3(a), the variable resistance element is initially in a high resistance state of approximately 33 kΩ, application of a pulse voltage of +2.0V causes the variable resistance element to be in a low resistance of approximately 500 Ω, and then after application of a pulse voltage of −2.6V causes the variable resistance element to be in a high resistance state of approximately 40 kΩ, a decrease in resistance by applying the positive pulse voltage to the upper electrode 3303 with reference to the lower electrode 3301 and an increase in resistance by applying the negative pulse voltage to the upper electrode 3303 with reference to the lower electrode 3301 are repeated.

The relationship between a direction of the resistance change and a polarity of an applied voltage mentioned above is called A mode for descriptive purposes.

As shown in FIG. 3(b), another variable resistance element is initially in a high resistance state of approximately 42 kΩ, application of a pulse voltage of −2.0V causes another variable resistance element to be in a low resistance state of approximately 600 Ω, and then after application of a pulse voltage of +2.7V causes another variable resistance element to be in a high resistance state of approximately 40 kΩ, a decrease in resistance by applying the negative pulse voltage to the upper electrode 3303 with reference to the lower electrode 3301 and an increase in resistance by applying the positive pulse voltage to upper electrode 3303 with reference to the lower electrode 3301 are repeated.

The relationship between a direction of the resistance change and a polarity of an applied voltage mentioned above is called B mode for descriptive purposes. The hysteretic current-voltage characteristics shown in FIG. 2 correspond to the B mode.

It is to be noted that the above pulse voltage value denotes a set output voltage value of a pulse generator, and that an effective voltage value applied to both end terminals of a variable resistance element is considered to be a voltage value smaller than the pulse voltage value due to a voltage drop across a measurement system.

In the element A from which such a result is obtained, the upper electrode 3303 and the lower electrode 3301 contain Pt, and the variable resistance layer 3302 which contains the oxygen-deficient Ta oxide and is located between the upper and lower electrodes has a top and bottom symmetry relationship with the electrodes electrically.

Accordingly, it is not always self-evident as to which of the A mode and the B mode appears as resistance change characteristics, and it is determined based on an empirical rule or an experimental measurement result. It is expected that these phenomena are determined by some sort of an anisotropy factor which is unexplained in a resistance change mechanism.

In the case of the write operation of the 1D1R cross point memory including the variable resistance element of a bipolar type, the memory cell selected for writing and the other non-selected memory cells are distinguished by a difference in voltage between both ends of the memory cells, which is different from the case of the 1T1R memory including a transistor, as disclosed by the PTL 2.

Furthermore, the low resistance value set for the variable resistance element is determined according to the amount of current flowing in a low resistance state and therefore, the bit line drive circuit is a drive circuit (hereinafter referred to as "LR drive circuit") which applies a voltage in the direction in which the resistance decreases, for example, a positive voltage to the bit lines with respect to the word lines so that an amount of current corresponding to a desired setting of the low resistance value flows. Because the increase in resistance is a roughly symmetric change in voltage and current in the voltage-current characteristics of the variable resistance elements, the word line drive circuit is a drive circuit (hereinafter referred to as "HR drive circuit") capable of applying a voltage in the direction opposite to the direction in which the resistance decreases, for example, a positive voltage to the word lines with respect to the bit lines, and moreover capable of allowing current of which amount is at least more than the amount of current for decreasing the resistance. Furthermore, it is conceivable that the non-selected memory cell includes a current steering element having such a threshold voltage Vth that no current flows even when the voltage having these values is applied.

However, when the direction in which the resistance of the variable resistance element changes, i.e., the A mode or the B mode, is not always uniformly fixed, there would be the following problems.

The first problem is that, when, of the A mode and the B mode, the mode appeared is opposite to the mode expected, it is impossible to set a desired resistance value for the variable resistance element.

When the mode, i.e., A or B mode, appeared is opposite to the mode expected, the resistance-decreasing writing is performed by the HR drive circuit having a higher capability of driving current than required, which results in setting of a lower resistance value than expected. Moreover, the resistance-increasing writing is performed by the LR drive circuit having a lower capability of driving current than required. It is therefore necessary to increase resistance of the variable resistance element which is set at the resistance value lower than expected, but the amount of current may not be enough for that, which causes a problem that the resistance change operation is not stable.

In such a case, it is conceivable to achieve a stable resistance change operation by applying a higher voltage and thereby allowing current to flow to increase resistance. However, because a resistance value different from a desired resistance value is written, the read performance will not be uniform, which causes a problem that it is not possible to provide products with stable performance. Moreover, the need of a high voltage leads to a problem of impeding a decrease in the operation voltage and the second problem which will be described hereinbelow.

Another conceivable method is, with an assumption that both of the A mode and the B mode are possible to appear, providing each of the word line drive circuit and the bit line drive circuit with both of the LR drive circuit and the HR drive circuit and switching between these circuits according to which mode appears of the A mode and the B mode, but this causes a problem of complexity in the switching of setting according to the current state and a problem of inducing an increase in chip area.

The second problem is related to reliability of the memory cell, especially the current steering element. PTL 2 discloses that a predetermined current can be supplied when a diode such as a ZnO varistor or a $SrTiO_3$ varistor is used as the current steering element of the 1D1R cross point memory. The inventors of the present application advance research on the use of later-described SiN materials as the current steering element comprising a material more compatible with a semiconductor process.

Generally, a diode element has non-linear current-voltage characteristics in which a current drastically increases with a predetermined threshold voltage Vth or higher. The controllability of setting of this threshold voltage Vth and how large amount of current can flow at a voltage equal to or higher than the threshold voltage Vth are important for higher integration and lower voltage operation. However, an increase in current density leads to performance degradation of the diode due to a thermal factor, and it is therefore important in terms of reliability to provide a configuration in which no more current than necessary will flow.

In the case where the mode, i.e., A or B mode, is opposite to the mode expected, it is possible to increase resistance by applying a higher voltage and thereby allowing a larger amount of current to flow, as described about the first problem, but there is a problem that this may deteriorate diode characteristics.

The present invention has been devised in view of the above circumstances, and an object of the present invention is to provide a nonvolatile memory device including 1D1R cross point memories each using a variable resistance element, with a control technique of setting a desired resistance value of the variable resistance element to stably change resistance, by making it possible to control a mode of resistance change characteristics of the variable resistance element between an A mode and a B mode and determining relation of connection between drive circuits and memory cells, and with a control technique of increasing reliability of a current steering element.

Solution to Problem

In order to solve the above problems, a nonvolatile memory device according to an aspect of the present invention includes: a first electrode; a second electrode; and a variable resistance film placed between the first electrode and the second electrode, and the nonvolatile memory device includes: a plurality of memory cells in each of which a variable resistance element and a current steering element having two terminals are connected in series, the variable resistance element changing, when a first voltage having a predetermined polarity is applied between the first electrode and the second electrode, to a low resistance state with a resistance value in a first range, and changing, when a second voltage having a second polarity opposite to the polarity is applied between the first electrode and the second electrode, to a high resistance state with a resistance value in a second range higher than the first range; a plurality of first signal lines and a plurality of second signal lines crossing the first signal lines; a memory cell array in which the memory cells are arranged at cross-points of the first signal lines and the second signal lines and each of the memory cells has ends connected to a set of one of the first signal lines and one of the second signal lines which crosses the first signal line; a write circuit which generates a bipolar voltage to be applied to the memory cells through the first signal lines and the second signal lines; and a current limit circuit placed in a path of a current flowing from the write circuit to the memory cells, the current limit circuit limiting only the current flowing in a direction for changing the memory cells to the low resistance state, wherein in each of the memory cells, aid variable resistance element includes: the first electrode; the second electrode; and the variable resistance layer placed between and in contact with the first electrode and the second electrode, the variable resistance layer contains an oxide of metal as a primary variable resistance material, the first electrode and the second electrode are made of materials of different elements, and relations $V_t<V_2$ and $V_1<V_2$ are satisfied where $V_1$ represents a standard electrode potential of the first electrode, $V_2$ represents a standard electrode potential of the second electrode, and $V_t$ represents a standard electrode potential of the metal primarily comprised in the variable resistance layer.

With this structure, where the plurality of the first signal lines and the plurality of the second signal lines correspond to a plurality of bit lines and a plurality of word lines, respectively, each of the memory cells can be configured such that the variable resistance element changes to the low resistance state by application of a positive voltage to the bit line with respect to the word line while the variable resistance element changes to the high resistance state by application of a positive voltage to the word line with respect to the bit line.

Thus, when the direction of current for changing the plurality of memory cells to the low resistance state is fixed, and the current limit circuit limits the current flowing in the fixed direction so that an amount of current provided for the change to the low resistance state is smaller than an amount of current provided for the change to the high resistance state, it is possible to prevent more current than expected from flowing to the memory cells.

As a result, the variable resistance elements can have desired resistance values with small variation and moreover, it is possible to prevent the current steering elements from degraded reliability and breakage.

ADVANTAGEOUS EFFECTS OF INVENTION

In the nonvolatile memory device according to an aspect of the present invention, the variable resistance element in each of the memory cells is configured such that resistance increases by application of a positive voltage to the second electrode with respect to the first electrode of the variable resistance element while resistance decreases by application of a positive voltage to the first electrode with respect to the second electrode of the variable resistance element, and the LR drive circuit is connected to the first electrode via the current limit circuit while the HR drive circuit is connected to the second electrode.

Generally, when the resistance of the variable resistance element is increased, in comparison with a case of decreasing the resistance, a higher driving current is required to generate a voltage necessary for causing the resistance change in the variable resistance element in a state of a low resistance value.

Thus, current is provided from the HR drive circuit connected on the side of the second electrode of the variable resistance element, to increase resistance while current is provided via the current limit circuit from the LR drive circuit connected on the side of the first electrode of the variable resistance element, to decrease resistance, and by controlling the current limit circuit so that less current flows as compared to the case of increasing resistance, the memory cells can be prevented from current more than expected, and it is possible to set desired resistance values with small variation among the variable resistance elements. Likewise, because of no current more than expected flowing to the memory cells, it is possible to prevent the current steering elements from degraded reliability and breakage.

Further, the resistance change phenomenon is an interaction between the variable resistance layer and electrode materials, and not only variable resistance materials but also a combination of a variable resistance material with a specific electrode material become of importance. For example, when the variable resistance material is combined with a relatively expensive material such as Pt (platinum) and Ir (iridium), preferably, the relatively expensive materials is used for one electrode, and a material as inexpensive as possible such as W (tungsten) is used for the other electrode. In such a case, it is possible to surely determine the connection between the electrodes and the drive circuits.

BRIEF DESCRIPTION OF DRAWINGS

FIG. 2 is a diagram showing an example of hysteretic current-voltage characteristics in a resistance change of the nonvolatile memory element as basic data of the present invention.

FIGS. 3(a) and 3(b) are diagrams each showing an example of a relationship between a resistance value of the nonvolatile memory element and the number of applied electrical pulses as basic data of the present invention.

FIG. 4 is a diagram showing an analysis result of a composition of a Ta oxide layer of the nonvolatile memory element as basic data of the present invention.

FIG. 5 is a cross-sectional diagram showing a structure of the nonvolatile memory element as basic data for the present invention.

FIGS. 6(a) and 6(b) are diagrams each showing an example of a relationship between a resistance value of the nonvolatile memory element and the number of applied electrical pulses as basic data of the present invention.

FIGS. 7(a) and 7(b) are diagrams each showing an example of a relationship between a resistance value of the nonvolatile memory element and the number of applied electrical pulses as basic data of the present invention.

FIGS. 8(a) and 8(b) are diagrams each showing an example of a relationship between a resistance value of the nonvolatile memory element and the number of applied electrical pulses as basic data of the present invention.

FIGS. 9(a) and 9(b) are diagrams each showing an example of a relationship between a resistance value of the nonvolatile memory element and the number of applied electrical pulses as basic data of the present invention.

FIGS. 10(a) and 10(b) are diagrams each showing an example of a relationship between a resistance value of the nonvolatile memory element and the number of applied electrical pulses as basic data of the present invention.

FIGS. 11(a) and 11(b) are diagrams each showing an example of a relationship between a resistance value of the nonvolatile memory element and the number of applied electrical pulses as basic data of the present invention.

FIGS. 12(a) and 12(b) are diagrams each showing an example of a relationship between a resistance value of the nonvolatile memory element and the number of applied electrical pulses as basic data of the present invention.

FIGS. 13(a) to 13(h) are diagrams each showing an example of a relationship between a resistance value of the nonvolatile memory element and the number of applied electrical pulses as basic data of the present invention.

FIG. 14 is a diagram showing a relationship between electrode material of the nonvolatile memory element and a standard electrode potential as basic data of the present invention.

FIGS. 15(a) and 15(b) are cross-sectional schematic diagrams for describing operations of the nonvolatile memory element as basic data of the present invention.

FIGS. 16(a) and 16(b) are cross-sectional schematic diagrams for describing operations of the nonvolatile memory element as basic data of the present invention.

FIG. 17 is a diagram showing an analysis result of a composition of a Hf oxide layer of the nonvolatile memory element as basic data of the present invention.

FIGS. 18(a) and 18(b) are diagrams each showing an example of a relationship between a resistance value of the nonvolatile memory element and the number of applied electrical pulses as basic data of the present invention.

FIGS. 19(a) to 19(g) are diagrams each showing an example of a relationship between a resistance value of the nonvolatile memory element and the number of applied electrical pulses as basic data of the present invention.

FIG. 20 is a diagram showing a relationship between electrode material of the nonvolatile memory element and a standard electrode potential as basic data of the present invention.

FIG. 21 is a configuration diagram of a variable resistance nonvolatile memory device according to the first embodiment of the present invention.

FIG. 22 is a cross-sectional diagram showing a configuration of a memory cell according to the first embodiment.

FIG. 23 is a circuit diagram showing the implementation of a write circuit according to an embodiment of the present invention.

FIG. 24 shows observed data indicating current-voltage characteristics of the memory cell according to an embodiment of the present invention.

FIG. 25(a) shows an equivalent circuit diagram of a current path for writing according to an embodiment of the present invention and FIG. 25(b) shows characteristics of the equivalent circuit.

FIG. 26 is another configuration diagram of the variable resistance nonvolatile memory device according to the first embodiment of the present invention.

FIG. 27 is yet another configuration diagram of the variable resistance nonvolatile memory device according to the first embodiment of the present invention.

FIG. 28(a) shows another equivalent circuit diagram of a current path for writing according to an embodiment of the present invention and FIG. 28(b) shows characteristics of the equivalent circuit.

FIG. 29(a) shows yet another equivalent circuit diagram of a current path for writing according to an embodiment of the present invention and FIG. 29(b) shows characteristics of the equivalent circuit.

FIG. 30 is another configuration diagram of the variable resistance nonvolatile memory device according to the first embodiment of the present invention.

FIGS. 32(a) to 32(d) are each a cross-sectional diagram showing a development example of the memory cell according to the first embodiment of the present invention.

FIG. 33 is a cross-sectional diagram showing another configuration of the memory cell according to the first embodiment of the present invention.

FIGS. 34(a) to 34(c) are each a cross-sectional diagram showing a development example of the memory cell according to the first embodiment of the present invention.

FIG. 35 is a configuration diagram of a variable resistance nonvolatile memory device according to the second embodiment of the present invention.

FIG. 36 is a cross-sectional diagram showing a configuration of a memory cell according to the second embodiment of the present invention.

FIGS. 37(a) and 37(b) each show behavior timing of the variable resistance nonvolatile memory device according to the second embodiment of the present invention.

FIGS. 38(a) to 38(d) are each a cross-sectional diagram showing a development example of the memory cell according to the second embodiment of the present invention.

FIG. 39 is a cross-sectional diagram showing another configuration of the memory cell according to the second embodiment of the present invention.

FIGS. 40(a) to 40(c) are each a cross-sectional diagram showing a development example of the memory cell according to the second embodiment of the present invention.

FIG. 41 is a circuit diagram of a memory cell of a conventional variable resistance nonvolatile memory device.

FIG. 42 is a graph showing voltage-current characteristics of a variable resistance element of the conventional variable resistance nonvolatile memory device.

FIG. 43 schematically shows a memory cell of a conventional variable resistance nonvolatile memory device.

FIG. 44 is a graph showing voltage-current characteristics of a non-linear element of the conventional variable resistance nonvolatile memory device.

DESCRIPTION OF EMBODIMENTS

Figure 1:
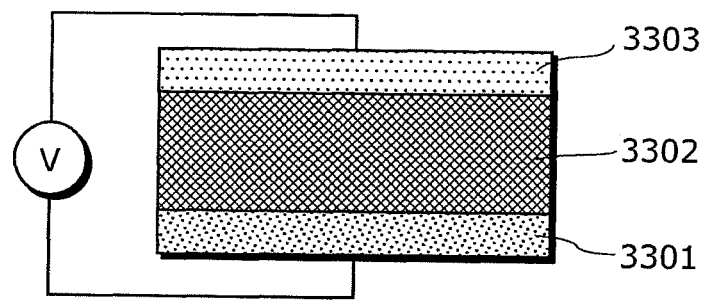
[FIG. 1]
FIG. 1 schematically shows a basic structure of a nonvolatile memory element as basic data for the present invention.
Figure 2:
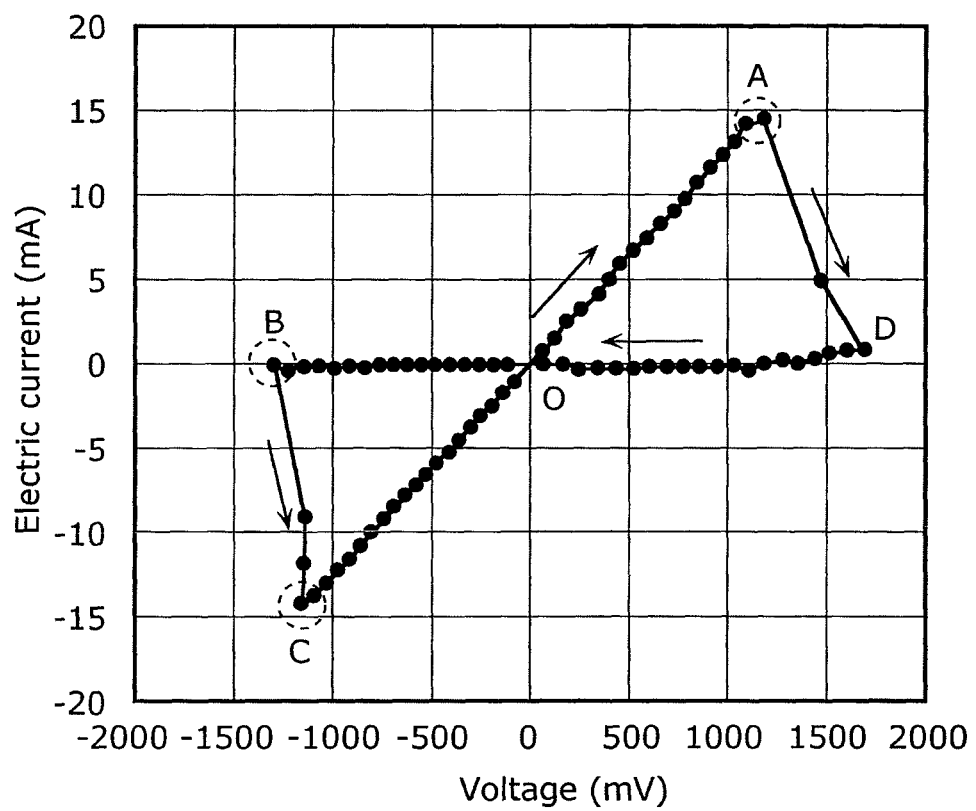
[FIG. 2]
Figure 3:
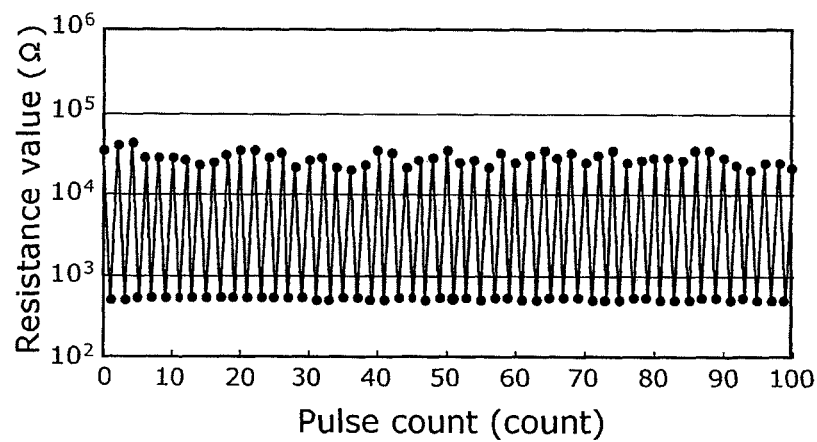
[FIG. 3]
Figure 3:
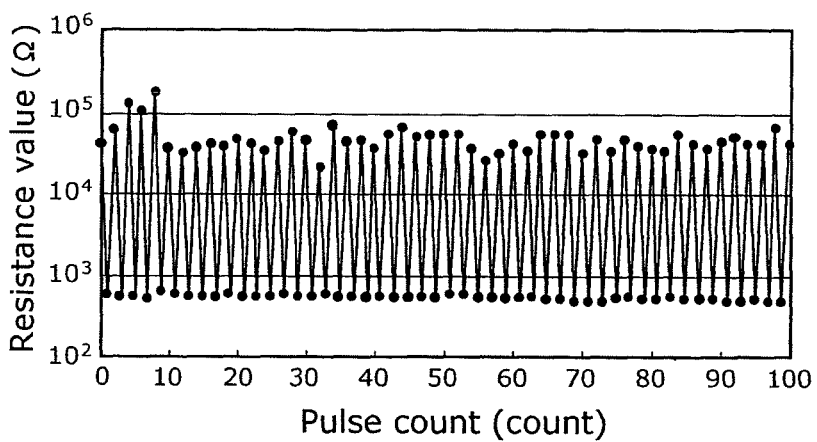

The following describes in detail embodiments of the present invention with reference to the drawings.

A variable resistance nonvolatile memory device according to the embodiment of the present invention is a cross point nonvolatile memory device using a plurality of 1D1R memory cells each structured by connecting a variable resistance element and a current steering element in series, which device fixes a mode of resistance change characteristics of the variable resistance element and optimizes a structure of a drive circuit according to the fixed mode.

[Basic Data of the Present Invention]

The following describes, as preparation, basic data regarding two types of variable resistance materials for the variable resistance element of the variable resistance nonvolatile memory device according to an implementation of the present invention are described.

One of the variable resistance elements is structured by locating a variable resistance layer comprising an oxygen-deficient tantalum oxide between an upper electrode and a lower electrode that contain a different material, and the other one of the variable resistance elements is structured by locating a variable resistance layer comprising an oxygen-deficient hafnium oxide between an upper electrode and a lower electrode that contain a different material.

The variable resistance elements have been invented by the inventors of the present application in order to obtain a nonvolatile memory element having reversible and stable rewriting characteristics and using a resistance change phenomenon, and are respectively described in detail in international publications of related patent applications WO2009/050833 and WO2009/136467.

A feature that the resistance change characteristics held by the variable resistance elements can be fixed to either the aforementioned A mode or B mode is applied to the variable resistance nonvolatile memory device of the present invention. Hereinafter, parts of the related patent applications are cited for purposes of illustration.

It is to be noted that the phrase "variable resistance element" and the phrase "variable resistance nonvolatile memory element (or, briefly, nonvolatile memory element)" are used synonymously in the present description.

[Variable Resistance Element in which Oxygen-deficient Tantalum (Ta) Oxide is Used for Variable Resistance Layer]

First, the following describes the first experiment regarding a variable resistance element for which an oxygen-deficient Ta oxide is used and which performs a bipolar operation.

In this experiment, it is verified whether reversible and stable rewriting characteristics are obtained by structuring the nonvolatile memory element for which the oxygen-deficient Ta oxide is used and which performs the bipolar operation, such that a resistance change easily occurs only in the vicinity of one of the upper electrode and the lower electrode.

For the verification, assuming that a tendency for the resistance change to occur varies depending on an electrode material type, a variable resistance element structured by locating an oxygen-deficient tantalum oxide between an upper electrode and a lower electrode that comprise a different material is formed, and resistance change characteristics are measured.

The following describes a result of this experiment.

It is to be noted that, before describing a result of the verification, a method for forming an oxygen-deficient tantalum oxide layer and a preferred range of an oxygen content atomic percentage are described.

Then, described is a result of forming a structure in which a $TaO_x$ layer is located between electrodes comprising platinum (Pt), tungsten (W), tantalum (Ta), or tantalum nitride (TaN) and of examining a situation of a resistance change phenomenon caused by an electrical pulse, in order to verify whether tendency for a resistance change to occur depends on the electrode materials.

Lastly, described is a measurement result of a resistance change of a variable resistance element structured by locating an oxygen-deficient Ta oxide between an influential electrode material and a non-influential electrode material.

[Relationship Between Oxygen Flow Ratio at Time of Sputtering and Oxygen Content Atomic Percentage of Ta Oxide Layer]

First, the following describes an analysis result of forming conditions and an oxygen content atomic percentage of an oxygen-deficient Ta oxide layer in this experiment.

The oxygen-deficient Ta oxide layer is formed by sputtering a Ta target in argon (Ar) gas and $O_2$ (oxygen) gas atmosphere, that is, reactive sputtering. A specific method of forming the oxygen-deficient Ta oxide in this experiment is as follows.

A substrate is initially placed in a sputtering apparatus, and inside the sputtering apparatus is vacuumed to almost $7 \times 10^{-4}$ Pa. Sputtering is performed with Ta used as a target, power set to 250 W, a total gas pressure of the Ar gas and the oxygen gas set to 3.3 Pa, and a preset temperature of the substrate set to 30° C. Here, the flow ratio of the $O_2$ gas to the Ar gas is changed from 0.8% to 6.7%.

First, because of the purpose of examining a composition, silicon (Si) on which 200 nm of silicon oxide ($SiO_2$) is deposited is used as the substrate, and a sputtering time period is adjusted so that a film thickness of the Ta oxide layer is approximately 100 nm at a thickness of the Ta oxide layer becomes around 100 nm.

Figure 4:
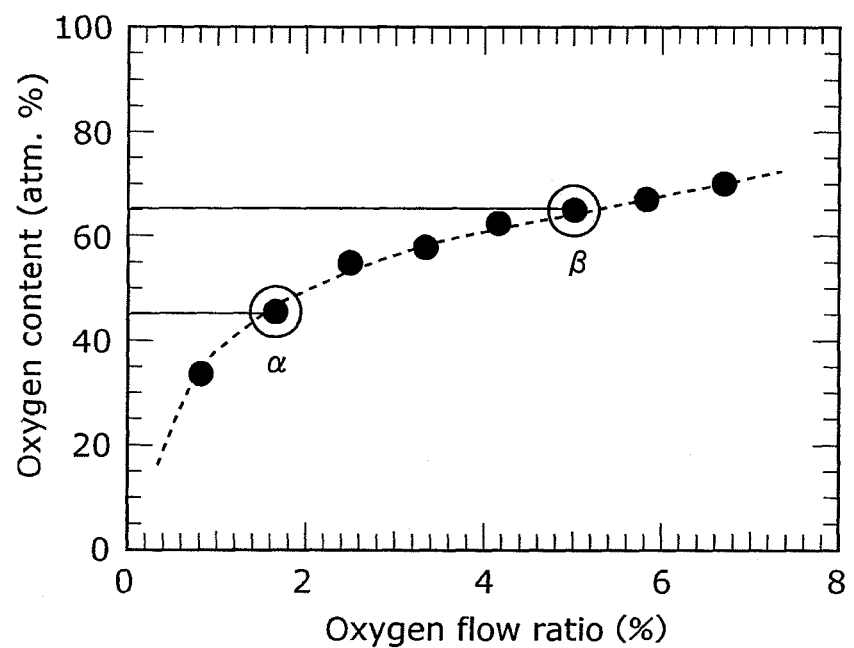
[FIG. 4]

FIG. 4 shows a result of analyzing, with the Rutherford Backscattering Spectrometry (RBS) and the Auger Electron Spectroscopy (AES), the composition of the Ta oxide layer formed in the above manner.

The figure shows that an oxygen content atomic percentage of the Ta oxide layer is changed from approximately 35 at. % ($TaO_{0.66}$) to approximately 70 at. % ($TaO_{2.3}$) when the oxygen flow ratio is changed from 0.8% to 6.7%.

Based on the above result, the following has been clarified: it is possible to control the oxygen content atomic percentage of the Ta oxide layer with the oxygen flow ratio; and the oxygen-deficient Ta oxide, in which oxygen is more deficient than oxygen content atomic percentage 71.4 at. % of $Ta_2O_5$ ($TaO_{2.5}$) that is a stoichiometric oxide of Ta, is formed.

It is to be noted that although the Rutherford Backscattering Spectrometry (RBS) and the Auger Electron Spectroscopy (AES) are employed in analyzing the Ta oxide layer in this experiment, it is also possible to employ an apparatus analytical method such as the X-ray Photoelectron Spectroscopy (XPS) and the Electron Probe Microanalysis (EPMA).

[Composition and Resistance Change Characteristics of Oxygen-deficient Ta Oxide Layer]

It is examined which oxygen-deficient Ta oxide having how much oxygen content atomic percentage among the oxygen-deficient tantalum oxide formed in the above manner shows a resistance change. Here, platinum (Pt) is used as an electrode material for both an upper electrode and a lower electrode between which an oxygen-deficient tantalum oxide layer is located.

Using Pt for the upper electrode and the lower electrode, as stated above, is inappropriate for a bipolar variable resistance nonvolatile element. However, as will be described, Pt is an electrode material which easily shows a resistance change, and is the most suitable material for determining whether or not an oxygen-deficient Ta oxide having a certain oxygen content atomic percentage shows the resistance change.

Figure 5:
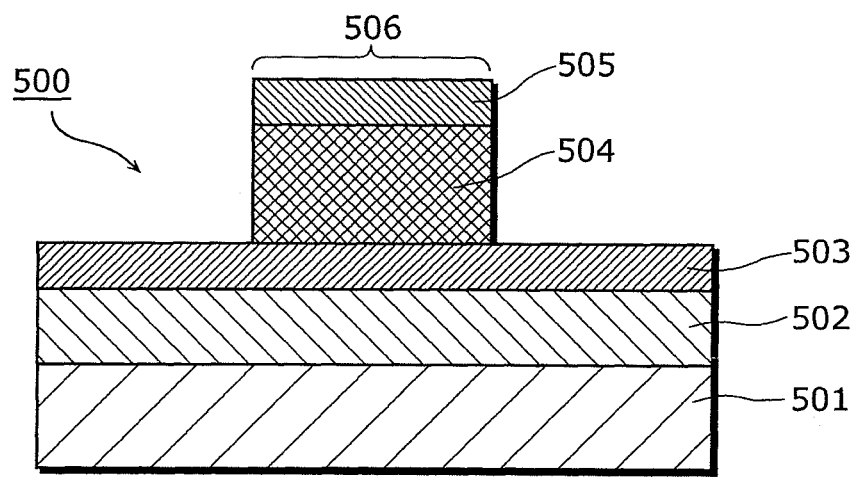
[FIG. 5]

For all of these reasons, a nonvolatile memory element 500 as shown in FIG. 5 is formed.

In other words, an oxide layer 502 having a thickness of 200 nm is formed on a single-crystal silicon substrate 501 with a thermal oxidation method, and a Pt thin film having a thickness of 100 nm is formed as a lower electrode 503 on the oxide layer 502 with a sputtering method.

Then, an oxygen-deficient Ta oxide layer 504 is formed with reactive sputtering, with Ta used as a target. In the range examined in this experiment, the nonvolatile memory element is formed by changing an oxygen gas flow ratio from 0.8% to 6.7% in the same manner as the above analysis sample. A film thickness of the oxygen-deficient Ta oxide layer 504 is 30 nm.

Then, a Pt thin film having a thickness of 150 nm is deposited as an upper electrode 505 on the oxygen-deficient Ta oxide layer 504 with the sputtering method.

Lastly, an element region 506 is formed by a photolithography process and a dry-etching process. It is to be noted that the element region 506 has a circular pattern having a diameter of 3 μm.

A resistance change phenomenon of the nonvolatile memory element formed in the above manner is measured. As a result, it is satisfactory that a high resistance value is more than five times as large as a low resistance value in the nonvolatile memory element for which a Ta oxide film represented by from point α (an oxygen flow ratio of approximately 1.7% and an oxygen content atomic percentage of approximately 45 at. %) to point β (an oxygen flow ratio of approximately 5% and an oxygen content atomic percentage of approximately 65 at. %) shown in FIG. 4 is used.

Figure 6:
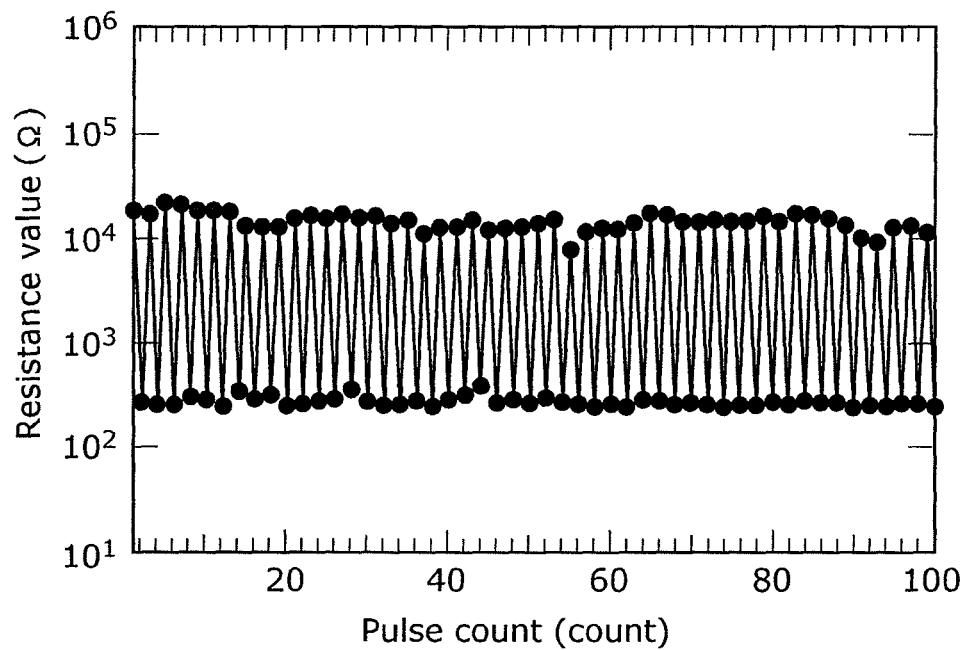
[FIG. 6]
Figure 6:
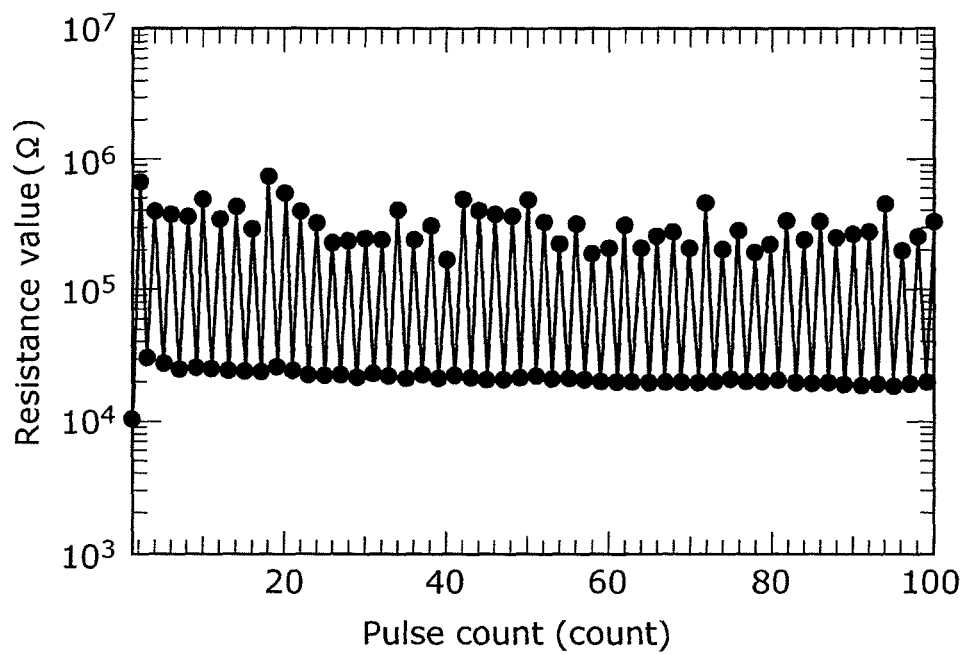

FIGS. 6(a) and 6(b) each show a result of measuring the resistance change characteristics of the nonvolatile memory element for which the Ta oxide layer having the oxygen content atomic percentage represented by either the point a or the point β is used with reference to the number of applied pulses.

FIGS. 6(a) and 6(b) each show that it is satisfactory that the high resistance value is more than five times as large as the low resistance value in the element for which the Ta oxide layer having the oxygen content atomic percentage represented by either the point α or the point β is used.

Thus, it can be said that a composition range in which the oxygen content atomic percentage is 45 at. % to 65 at. %, that is, a range of x, $0.8 \leq x \leq 1.9$, when the variable resistance layer is shown as $TaO_x$, is a more appropriate range of the variable resistance layer (the oxygen content atomic percentage=45 at. % and the oxygen content atomic percentage=65 at. % correspond to x=0.8 and x=1.9, respectively). This optimum condition is described in detail in an international publication of patent application WO2008/059701.

[Resistance Change Characteristics of Variable Resistance Element in which W, Ta or TaN is Used as Material of Upper Electrode and Lower Electrode]

Next, the following describes a result of forming a structure in which the oxygen-deficient Ta oxide layer 504 is located between the lower electrode 503 and the upper electrode 505 that contain Pt, W, Ta or TaN as a material other than Pt and of examining a situation of a resistance change caused by an electrical pulse, in order to verify whether the tendency for the resistance change to occur depends on the electrode material.

It is to be noted that since an experiment is also performed to evaluate the tendency for the resistance change to occur, the material of the upper and lower electrodes is the same. In addition, an oxygen content atomic percentage of a used oxygen-deficient Ta oxide is 58 at. % ($TaO_{1.38}$) that is almost in the middle of the preferred range of the oxygen content atomic percentage. A method for forming an element is almost same as the method described above, and Pt, W, Ta or TaN is deposited by the sputtering method.

First, for comparison, the following describes resistance change characteristics of a nonvolatile memory element (hereinafter, referred to as element B) including the lower electrode 503 and the upper electrode 505 each of which is a thin film comprising Pt.

Figure 7:
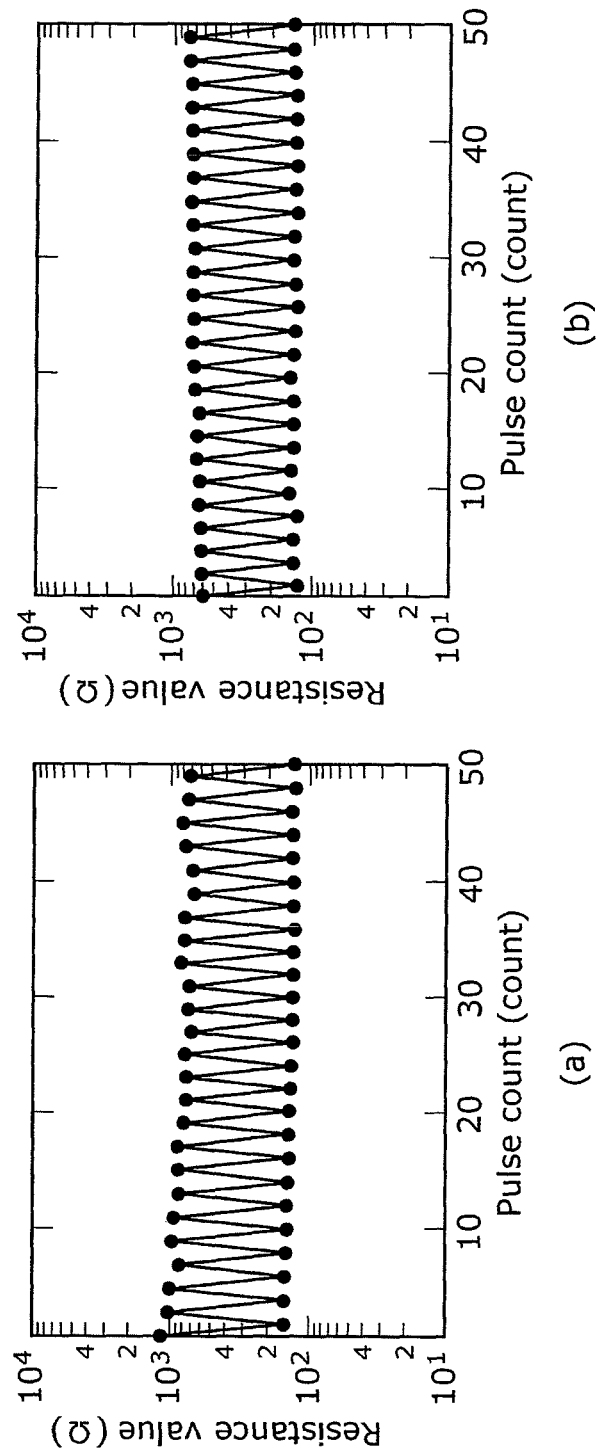
[FIG. 7]

FIGS. 7(a) and 7(b) each show a measurement result of a resistance change caused by an electrical pulse in the element B formed in the above manner.

FIG. 7(a) shows a measurement result of resistance when an electrical pulse having a voltage of +3.0 V and an electrical pulse having a voltage of −1.5 V are alternately applied to the upper electrode 505 with reference to the lower electrode 503, the electrical pulses each having a pulse width of 100 ns.

In this case, a resistance value becomes approximately 800 $\Omega$ to 1000 $\Omega$ by the application of the electrical pulse having the voltage of +3.0 V, and when the electrical pulse having the voltage of −1.5 V is applied, the resistance value is changed to approximately 150 $\Omega$. To put it differently, when an electrical pulse having a higher voltage than a voltage at the lower electrode 503 is applied to the upper electrode 505, characteristics of the B mode with an increasing in resistance were observed.

Furthermore, though details are omitted, a result of presuming that the resistance change occurs in the vicinity of the upper electrode 505 is obtained from an additional experiment.

Next, FIG. 7(b) shows a result of a case where a negative voltage is increased by changing a balance of a voltage to be applied. In this case, an electrical pulse having a voltage of −3.0 V and an electrical pulse having a voltage of +1.5 V are applied to the upper electrode 505 with reference to the lower electrode 503. When the electrical pulse of −3.0V is applied, an increase in resistance occurs and a resistance value is approximately 600 $\Omega$ to 800 $\Omega$, and when the electrical pulse of −1.5 V is applied, a decrease in resistance occurs and the resistance value is approximately 150 $\Omega$. Stated differently, the decrease in resistance occurs when the electrical pulse having the higher voltage than the voltage at the lower electrode 503 is applied to the upper electrode 505, which exhibits characteristics of the A mode opposite to the characteristics at the time of measurement shown in FIG. 7(a).

Moreover, though details are omitted, a result of presuming that the resistance change occurs in the vicinity of the lower electrode 503 is obtained from an additional experiment.

Next, the following describes resistance change characteristics of a nonvolatile memory element (hereinafter, referred to as element C) including the lower electrode 503 and the upper electrode 505 each of which is a thin film comprising W.

Figure 8:
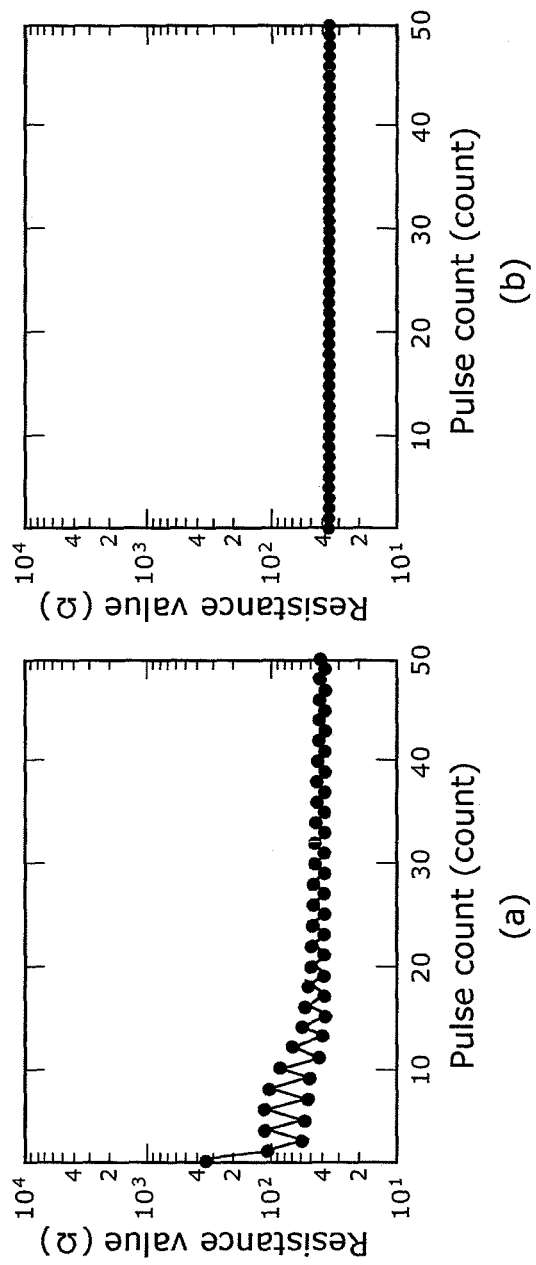
[FIG. 8]

FIGS. 8(a) and 8(b) show a measurement result of a resistance change caused by an electrical pulse in the element C formed in the above manner.

FIG. 8(a) shows a change in a resistance value when +7 V and −5 V are alternately applied to the upper electrode 505 with reference to the lower electrode 503 in order to cause the B mode that attributes to a resistance change in the vicinity of the upper electrode 505 (upper electrode mode).

As shown in FIG. 8(a), the resistance change, though weak, is observed in the B mode until when the number of pulses is approximately 30, an increase in resistance occurs when an electrical pulse of +7 V is applied, and a decrease in resistance occurs when an electrical pulse of −5 V is applied. However, when the number of pulses exceeds 30, the resistance change is hardly observed.

FIG. 8(b) shows a change in a resistance value when +5 V and −7 V are alternately applied to the upper electrode 505 in order to cause the A mode that attributes to a resistance change in the vicinity of the lower electrode 503 (lower electrode mode).

As shown in FIG. 8(b), the change in the resistance value is hardly observed in this case, and the resistance value is constant at approximately 30 $\Omega$.

Here, when comparing the result of the element B whose upper and lower electrodes contain Pt and the result shown in FIG. 8(a), it is clear that the resistance change clearly does not occur easily when W is used for the electrodes.

Whereas an approximately sevenfold change between the resistance value of the low resistance state, 150 $\Omega$, and the resistance value of the high resistance state, approximately 1000 $\Omega$, is shown in FIG. 7(a) showing the measurement result of the element B, mere occurrence of the resistance change from 50 $\Omega$ to 100 $\Omega$ at most even within a range of a large resistance change, that is, an approximately twofold change is shown in FIG. 8(a) showing the measurement result of the element C in which W is used as the electrode material.

While the applied voltages are respectively +3.0 V and −1.5 V at the time of measurement shown in FIG. 7(a), the resistance change is hardly observed even though very high voltages, +7 V and −5 V, are applied in FIG. 8(a).

As stated above, it is clear that the resistance change does not occur easily when W is used for the electrodes in comparison with the case where Pt is used for the electrodes.

The above results denote that the operation of the variable resistance element in which the oxygen-deficient Ta oxide is used for the variable resistance layer very strongly depends on the electrode material to be used. In other words, at least it is clear that the resistance change occurs easily when Pt is used for the electrode and that the resistance change does not occur easily when W is used for the electrode.

Moreover, though details are omitted, a variable resistance element in which Ta or TaN is used for an upper electrode and a lower electrode is formed, and the resistance change characteristics thereof are measured.

Figure 9:
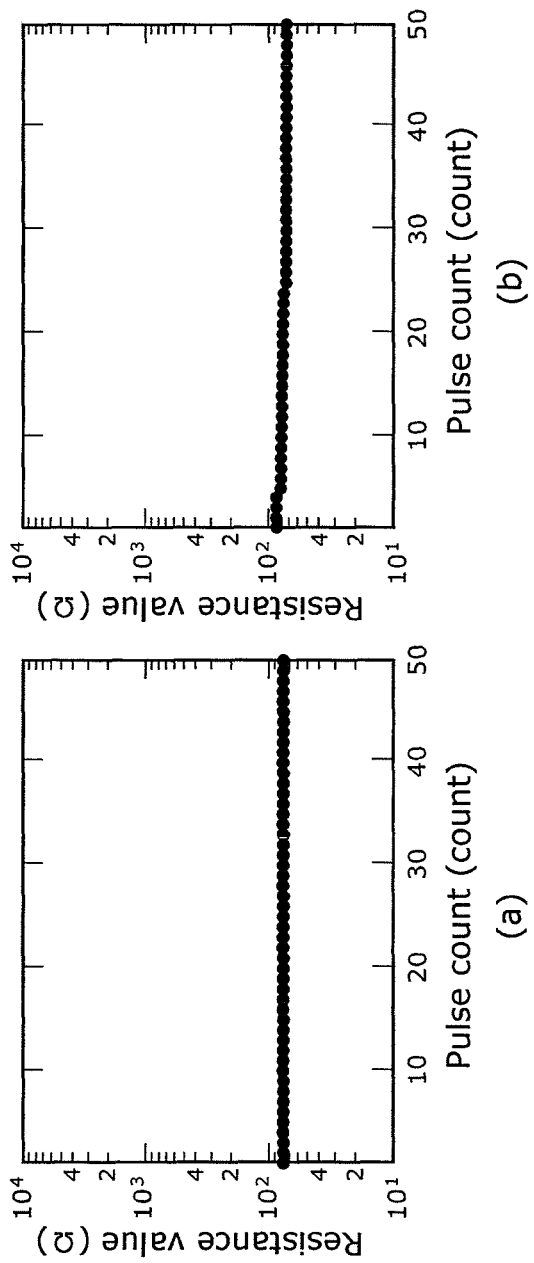
[FIG. 9]

FIGS. 9(a) and 9(b) each show resistance change characteristics of an element D in which Ta is used for both the lower electrode 503 and the upper electrode 505.

FIG. 9(a) shows a measurement result when an electrical pulse of +7 V and an electrical pulse of −5 V are applied to the upper electrode 505, and FIG. 9(b) shows a measurement result when an electrical pulse of +5 V and an electrical pulse of −7 V are applied to the upper electrode 505. In either case, the resistance change hardly occurs.

Figure 10:
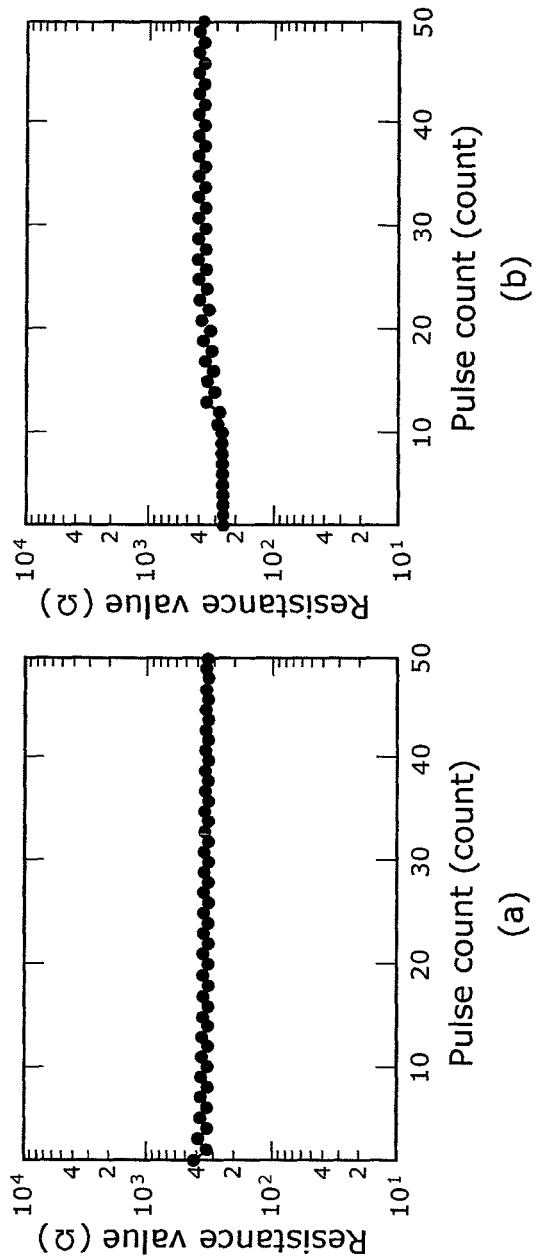
[FIG. 10]

In addition, FIG. 10(a) shows resistance change characteristics of an element E in which TaN is used for both the lower electrode 503 and the upper electrode 505. FIG. 10(a) shows a measurement result when an electrical pulse of +7 V and an electrical pulse of −5 V are applied to the upper electrode 505, and FIG. 10(b) shows a measurement result when an electrical pulse of +5 V and an electrical pulse of −7 V are applied to the upper electrode 505. In this case also, it may be said that the resistance change occurs to an extent that the change hardly occurs.

As stated above, there are materials that are not prone to cause a resistance change, other than W.

[Resistance Change Characteristics of Variable Resistance Element in which W and Pt are Used for Electrode]

Next, the following describes resistance change characteristics of an element F that is a variable resistance element in which an oxygen-deficient Ta oxide is located between Pt and W, Pt being a material that is prone to cause a resistance change and W being a material that is not prone to cause the resistance change and has process stability.

The prepared element is formed by using a W thin film as the lower electrode 503 and a Pt thin film as the upper electrode 505. The W thin film and the Pt thin film each are deposited by sputtering a W target and a Pt target in an Ar gas.

Figure 11:
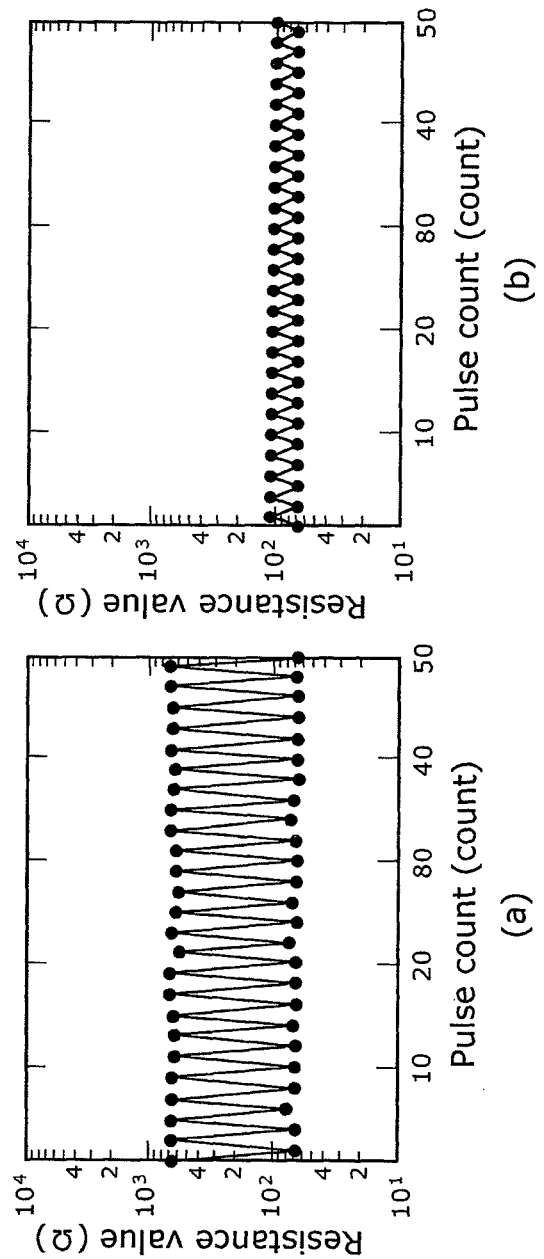
[FIG. 11]

FIGS. 11(a) and 11(b) each show a situation of a resistance change of the element F formed in the above manner, which is caused by an electrical pulse.

FIG. 11(a) shows a change in a resistance value when +2.5 V and −1.5 V are alternately applied to the upper electrode 505 with reference to the lower electrode 503 in order to cause a resistance change in the vicinity of the upper electrode 505 (B mode). In this case, the resistance value is approximately 600 Ω when the electric pulse of +2.5 V is applied, and stably changes to 60 Ω when the electric pulse of −1.5 V is applied.

On the other hand, FIG. 11(b) shows a change in a resistance value when +1.5 V and −2.5 V are alternately applied to the upper electrode 505 with reference to the lower electrode 503 in order to cause a resistance change in the vicinity of the lower electrode 503 (A mode). In this case, the resistance change only occurs between 60 Ω and 100 Ω, and the occurring resistance change is negligible compared with the resistance change that occurs when the voltage for causing the resistance change in the B mode is applied.

The above results in FIGS. 11(a) and 11(b) show that the element F shows ideal operations of a variable resistance nonvolatile memory element which performs a bipolar operation that causes a resistance change only in the vicinity of one of the electrodes.

In addition, a phenomenon in which the A mode and the B mode are kind of blended is not observed.

Figure 12:
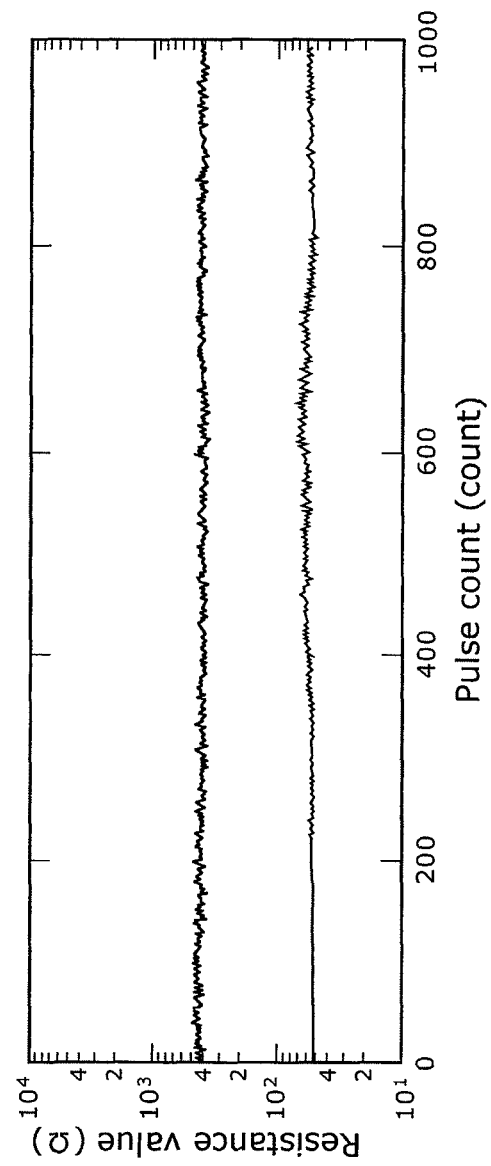
[FIG. 12]

For instance, although FIG. 12 shows a result of applying an electrical pulse for approximately 1000 times to an element different from (but formed on the same substrate as) the element F from which the measurement results of FIGS. 11(a) and 11(b) are obtained, it is seen that the resistance change phenomenon occurs very stably.

Based on the above, it has become clear that the variable resistance nonvolatile memory element operates stably because the resistance change can be caused in the intended one of the electrodes by forming the structure of the variable resistance nonvolatile memory element in which the variable resistance layer is located between the electrode that is prone to cause the resistance change phenomenon and the electrode that is not prone to cause the same, and that the variable resistance nonvolatile memory element indicating a desirable bipolar operation can be formed.

In addition, a relationship between an applied voltage and a resistance value shows an operation in which the resistance value increases when an electrical pulse having a positive voltage is applied to the electrode that is prone to cause the resistance change and the resistance value decreases when an electrical pulse having a negative voltage is applied to the electrode.

[Resistance Change Characteristics of Variable Resistance Element According to Material Type of Upper Electrode and Lower Electrode]

Next, the following shows a result of the second experiment in which elements each having a different electrode material are evaluated for a tendency for a resistance change to occur.

The following describes, as the results of this experiment, situations of the resistance changes of the elements in each of which the lower electrode 503 is fixed to W and the upper electrode 505 contains a different material other than Pt. Here, reasons why the lower electrode 503 is fixed to W are that W is a relatively stable material and that W can be relatively easily processed.

It is to be noted that a method of forming the element is same as the method described in the first experiment, and the lower electrode 503 and the upper electrode 505 are all formed by the sputtering method. In addition, an oxygen-deficient Ta oxide, i.e., a variable resistance material, is formed by sputtering a Ta metal in $O_2$ and Ar.

Composition of the oxygen-deficient Ta oxide is set identical in order to examine resistance change characteristics according to a difference between electrodes. In other words, an oxygen content atomic percentage of the oxygen-deficient Ta oxide is fixed to approximately 58 at. % (when expressed as $TaO_x$, x is 1.38).

Furthermore, because the lower electrode 503 contains W, a non-influential material, in this experiment, a result of the A mode (the mode in which the increase in resistance occurs when the high voltage is applied to the lower electrode with reference to the upper electrode) in which a change in a resistance value hardly occurs is omitted from a description, and only a result of the B mode (the mode in which the increase in resistance occurs when the high voltage is applied to the upper electrode with reference to the lower electrode) is shown. Although there is a slight difference depending on elements in a voltage of an electrical pulse when the resistance change is caused in the B mode, a voltage when the increase in resistance is caused ranges from +1.8 V to +2.0 V, and a voltage when the decrease in resistance is caused ranges from −1.3 V to −1.6 V, with the lower electrode being a reference of the voltage.

FIGS. 13(a) to 13(h) are summaries of the measurement results.

Figure 13:
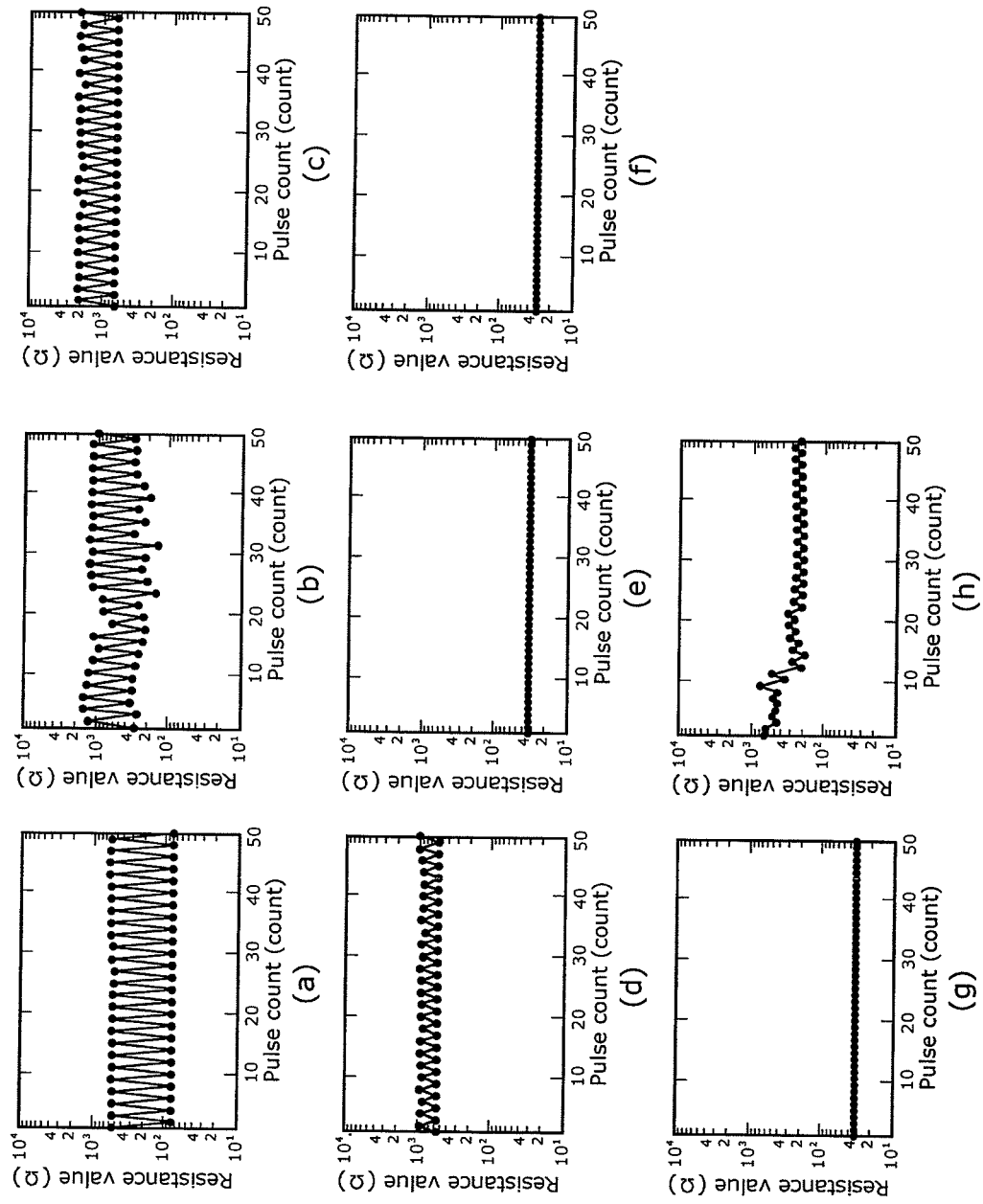
[FIG. 13]

First, by looking at results of an element G of FIG. 13(a) in which iridium (Ir) is used for an upper electrode, an element H of FIG. 13(b) in which silver (Ag) is used for an upper electrode, and an element I of FIG. 13(c) in which copper (Cu) is used for an upper electrode, it is clear that the resistance change occurs in a relatively stable and large varying degree. Next, although a slight resistance change is observed in an element J of FIG. 13(d) in which nickel (Ni) is used for an upper electrode and an element N of FIG. 13(h) in which tantalum nitride (TaN) is used for an upper electrode, a variation range of the resistance change is small.

Next, no resistance change phenomenon is observed in an element K of FIG. 13(e) in which tantalum (Ta) is used for an upper electrode, an element L of FIG. 13(f) in which titanium (Ti) is used for an upper electrode, and an element M in which aluminum (Al) is used for an upper electrode. It is considered that these materials are not inherently prone to cause the resistance change.

As can be seen from the above results, for the nonvolatile memory element for which the oxygen-deficient Ta oxide is used, there are materials that are prone to cause the resistance change phenomenon (influential materials) and materials that are not prone to cause the resistance change phenomenon (non-influential materials). In the range of this experiment, the influential electrode materials are Pt, Ir, Ag, and Cu, and the non-influential electrode materials are W, Ni, Ta, Ti, Al, and TaN.

When a variable resistance element having a structure in which an oxygen-deficient Ta oxide is sandwiched by a combination of these materials is formed, a stable resistance change can be achieved without blending the resistance change modes. However, when FIG. 7(a), FIG. 11(b), and FIGS. 13(d) and 13(h) are referred to, the resistance change, though weak, is observed in the electrode comprising W, Ni or TaN. Accordingly, when any of these materials is used for one of electrodes and when, for example, Ta, Ti or Al, the electrode material with which no resistance change is observed in this experiment, is used for the other electrode, the stable yet weak resistance change can be expected.

The following describes some examinations of a mechanism in which a resistance change itself occurs and a material dependency of a tendency for the resistance change to occur.

Figure 14:
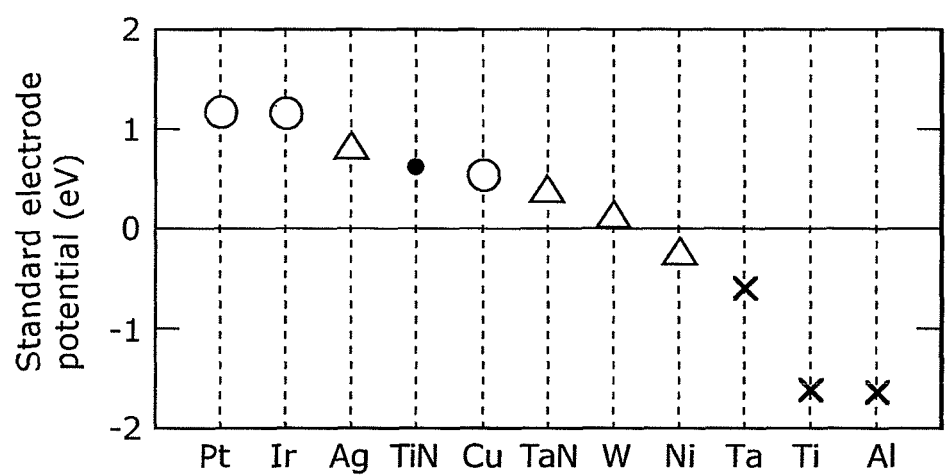
[FIG. 14]

FIG. 14 is a summary of the results of the first and second experiments. The horizontal axis indicates electrode materials, and the vertical axis indicates a standard electrode potential. In FIG. 14, a circle mark denotes that the resistance change occurred easily, a triangle mark denotes that the resistance change occurred though a rate of the change was small, and a cross mark denotes that the resistance change did not occur. It is to be noted that TiN is an electrode material not used in the first and second experiments, and is represented by a dot for reference.

In FIG. 14, the standard electrode potentials of the electrode materials other than TaN and TiN are the literature values disclosed by NPTL 1: "CRC HANDBOOK of CHEMISTRY and PHYSICS, DAVID R. LIDE Editor-in-chief, 84$^{th}$ Edition 2003-2004, CRC PRESS", and standard electrode potentials of TaN and TiN are data measured by the inventors.

The inventors have measured standard electrode potentials of some electrode materials including TaN and TiN with a 3-electrode system potentiostat including Solartron Electrochemical Measurement System SI1280B. A measurement condition is that an electrode material to be measured is used for an action pole, a Pt electrode is used for an antipole, an Ag/AgCl electrode is used for a reference pole, and 1 wt % KCl 7 ml is used under $N_2$ bubbling for an electrolyte solution.

After a potential at a potential equilibrium point with reference to the electrode material of the Ag/AgCl electrode is measured by searching for the potential equilibrium point between the action pole and the antipole under such a condition, a value obtained by adding +0.196 V to the measured potential is set to a potential (that is, standard electrode potential) with reference to an electrode material of a standard hydrogen electrode.

According to FIG. 14, it is clear that the resistance change occurs with the material having the standard electrode potential higher than that of Ta, an constituent element of the variable resistance layer, and the resistance change does not occur easily with the material having the standard electrode potential lower than that of Ta. In addition, it is clear that the resistance change occurs more easily as a difference between the standard electrode potentials becomes greater, and the resistance change does not occur more easily as the difference becomes smaller.

Generally, the standard electrode potential is one of indices for susceptibility to oxidation, and denotes that the larger a value of the index is, the less susceptible to oxidation, and the smaller a value of the index is, the more susceptible to oxidation. Based on the above, it is speculated that the susceptibility to oxidation plays a large role in the mechanism of the resistance change phenomenon.

The mechanism of the resistance change is considered based on the above results. First, the following describes a case where an upper electrode contains a material (material having a large standard electrode potential and not susceptible to oxidation) that is prone to cause the resistance change, using FIGS. 15(a) and 15(b).

Figure 15:
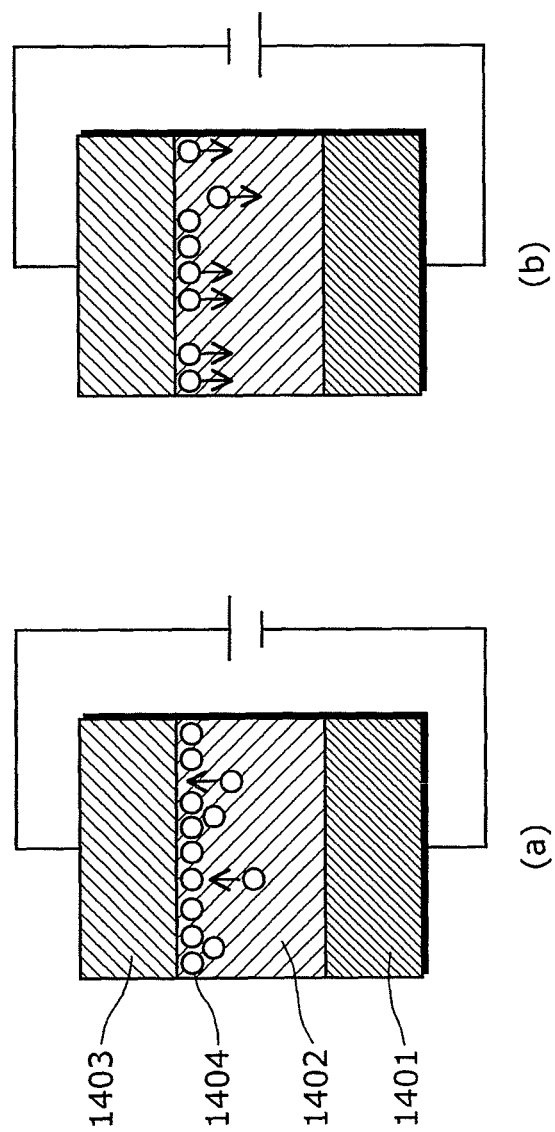
[FIG. 15]

As shown in FIG. 15(a), in a variable resistance element including a lower electrode 1401, an oxygen-deficient Ta oxide layer 1402, and an upper electrode 1403 comprising a material less susceptible to oxidation than Ta, when a high voltage is applied to the upper electrode 1403 with reference to the lower electrode 1401, oxygen atoms in the oxygen-deficient Ta oxide become ions, and the ions are moved by an electric field to gather in the vicinity of an interface of the upper electrode 1403.

However, since a metal comprised in the upper electrode 1403 is not susceptible to oxidation in comparison with Ta, oxygen ions 1404 are accumulated in an interface between the oxygen-deficient Ta oxide layer 1402 and the upper electrode 1403, and are combined with Ta near the interface to form an oxygen-deficient Ta oxide having a high oxygen concentration. This increases a resistance of the element.

Next, as shown in FIG. 15(b), when a high voltage is applied to the lower electrode 1401, oxygen atoms become oxygen ions again, and return to the inside of the oxygen-deficient tantalum oxide layer 1402. With this, it is considered that the decrease in resistance has occurred.

Figure 16:
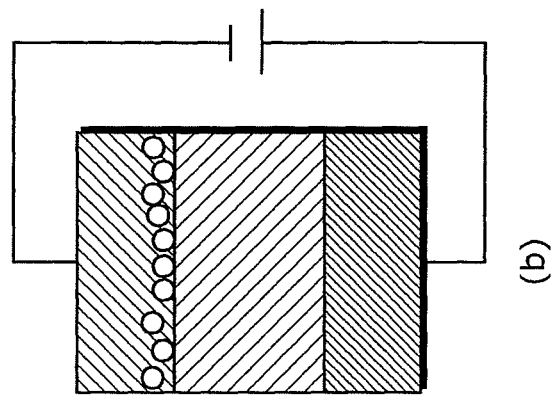
[FIG. 16]
Figure 16:
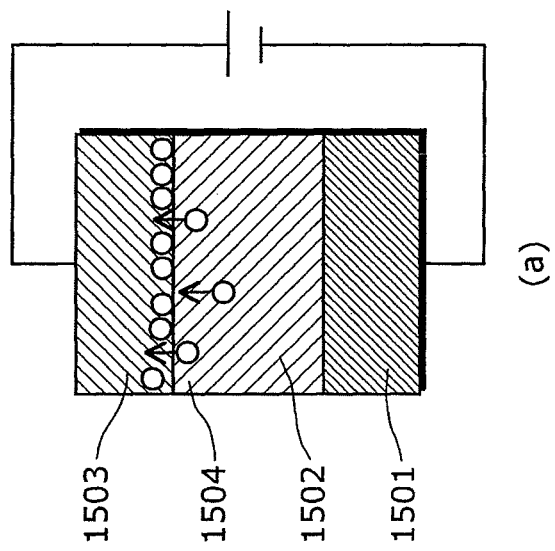

Figures describing a case where an upper electrode contains a material more susceptible to oxidation than Ta are FIGS. 16(a) and 16(b).

As shown in FIG. 16(a), in a variable resistance element including a lower electrode 1501, an oxygen-deficient Ta oxide layer 1502, and an upper electrode 1503 comprising a material more susceptible to oxidation than Ta, when the high voltage is applied to the upper electrode 1503 with reference to the lower electrode 1501, oxygen atoms in the oxygen-deficient Ta oxide become ions, and the ions are moved by an electric field to gather in the vicinity of an interface of the upper electrode 1503.

In this case, since the upper electrode 1503 is more susceptible to oxidation, oxygen ions 1504 are absorbed into the inside of the upper electrode 1503 to be bonded with the material comprised in the upper electrode 1503. In this case, unlike FIG. 15(a), a high resistance layer is not formed in the interface between the oxygen-deficient Ta oxide layer 1502 and the upper electrode 1503, and further a resistance value hardly increases since the number of oxygen ions is fewer with reference to the number of elements comprised in the upper electrode 1503.

Conversely, as shown in FIG. 16(b), when the high voltage is applied to the lower electrode 1501, since the oxygen absorbed by the upper electrode 1503 are stably bonded with the upper electrode material, it is considered that the oxygen atoms do not easily return into the oxygen-deficient Ta oxide layer 1502, and a resistance value does not change significantly.

When the material comprised in the upper electrode is approximately as susceptible to oxidation as Ta in FIGS. 15(a), 15(b), 16(a), and 16(b), it is considered that a change intermediate between the two above examples occurs, and a weak resistance change occurs.

As can be seen from the above results, in the nonvolatile memory element in which the oxygen-deficient Ta oxide is used for the variable resistance layer, the materials having the different standard electrode potentials may be respectively used for the upper electrode and the lower electrode.

With this, the resistance change dominantly occurs in the vicinity of one of the electrodes, which enables an ideal bipolar resistance change to be realized. Further, the resistance change modes are not blended, which enables a stable resistance change operation.

More preferably, a material having a standard electrode potential higher than that of Ta and a large difference between the standard electrode potentials may be used for one of electrodes, and a material having a standard electrode potential higher than that of Ta and a small difference between the standard electrode potentials may be used for the other electrode.

Still more preferably, a material having a standard electrode potential higher than that of Ta may be used for one of the electrodes, and a material having a standard electrode potential lower than that of Ta may be used for the other electrode.

It is to be noted that, though not being described as the result of the second experiment, a good experimental result indicating that a stable resistance change phenomenon has occurred is obtained regarding a variable resistance element in which TaN and Pt are respectively used for a lower electrode and an upper electrode.

The standard electrode potential of TaN is +0.48 eV according to the measurement of the inventors, and the standard electrode potentials of Pt and Ta are +1.18 eV and −0.6 eV, respectively, according to NPTL 1.

This example is an example where Pt, a material having a standard electrode potential higher than that of Ta and a large difference between the standard electrode potentials, is used for the upper electrode, and TaN, a material having a standard electrode potential higher than that of Ta and a small difference between the standard electrode potentials, is used for the lower electrode.

In other words, it is considered that an advantageous effect described as the results of the second experiment is obtained in this example by using, as electrode materials, TaN and Pt that satisfy a condition concerning the above standard electrode potentials.

As for another example, TiN and Pt may be used for a lower electrode and an upper electrode, respectively. The standard electrode potential of TiN is +0.55 eV according to the above measurement of the inventors. Thus, since a combination of TiN and Pt satisfies a condition concerning a standard electrode potential when a tantalum oxide is used for a variable resistance layer, the advantageous effect described as the results of the second experiment can be expected by using TiN and Pt as the electrode materials.

As for still another example, gold (Au) or palladium (Pd) may be used as the electrode material. The standard electrode potentials of Au and Pd are +1.692 eV and +0.951 eV, respectively, according to NPTL 1, and are higher than that of Ta which is −0.6 eV. Thus, when the tantalum oxide is used for the variable resistance layer, the advantageous effect described as the results of the second experiment can be expected by using one of Au and Pd as the electrode material that is prone to cause the resistance change and a material (for instance, W having a standard electrode potential of +0.1 eV) having a standard electrode potential lower than that of the other one of Au and Pd as the electrode material that is not prone to cause the resistance change.

It is to be noted that, though not being described as the result of this experiment, gold (Au) has a standard electrode potential of +1.692 eV, which is higher than −0.6 eV that is the standard electrode potential of Ta. The advantageous effect described as the results of this experiment can be expected even when Au is used as the electrode material that is prone to cause the resistance change in the case where Ta is used as the variable resistance film.

In addition, as can be seen from the above mechanism, shown is the operation in which the resistance value increases when the electrical pulse having the positive voltage is applied to the electrode that is prone to cause the resistance change and the resistance value decreases when the electrical pulse having the negative voltage is applied.

[Variable Resistance Element in which Oxygen-deficient Hafnium (Hf) Oxide is Used for Variable Resistance Layer]

Next, the following describes, as other similar example, the third experiment regarding a nonvolatile memory element in which an oxygen-deficient hafnium (Hf) oxide is used for a variable resistance layer and which performs a bipolar operation.

In the same manner as the description of the first experiment, first, a method of forming an oxygen-deficient Hf oxide layer and a preferred range of an oxygen content atomic percentage are described.

Then, described is a result of forming a structure in which an $HfO_x$ layer is sandwiched by electrodes comprising Al, Ti, Ta, W, Cu or Pt and of examining a situation of a resistance change phenomenon caused by an electrical pulse, in order to verify whether or not a tendency for a resistance change to occur depends on electrode materials. Lastly, described is a measurement result of a resistance change of a variable resistance element structured by locating an oxygen-deficient Hf oxide between an influential electrode material and a non-influential electrode material.

[Relationship Between Oxygen Flow Ratio at Time of Sputtering and Oxygen Content Atomic Percentage of Hf Oxide Layer]

First, the following describes an analysis result of forming conditions and an oxygen content atomic percentage of an oxygen-deficient Hf oxide layer in this experiment.

The oxygen-deficient Hf oxide layer is formed by sputtering an Hf target in argon (Ar) gas and $O_2$ gas atmosphere, that is, reactive sputtering. A specific method of forming the oxygen-deficient Hf oxide in the this experiment is as follows.

A substrate is initially placed in a sputtering apparatus, and inside the sputtering apparatus is vacuumed to almost $3 \times 10^{-5}$ Pa. Sputtering is performed with Hf used as a target, power set to 300 W, a total gas pressure of the argon gas and the oxygen gas set to 0.9 Pa, and a preset temperature of the substrate set to 30° C. Here, the flow ratio of the $O_2$ gas to the Ar gas is changed from 2% to 4.2%.

First, because of the purpose of examining a composition, Si on which 200 nm of $SiO_2$ is deposited is used as the substrate, and a sputtering time period is adjusted so that a film thickness of the Hf oxide layer is approximately 50 nm.

Figure 17:
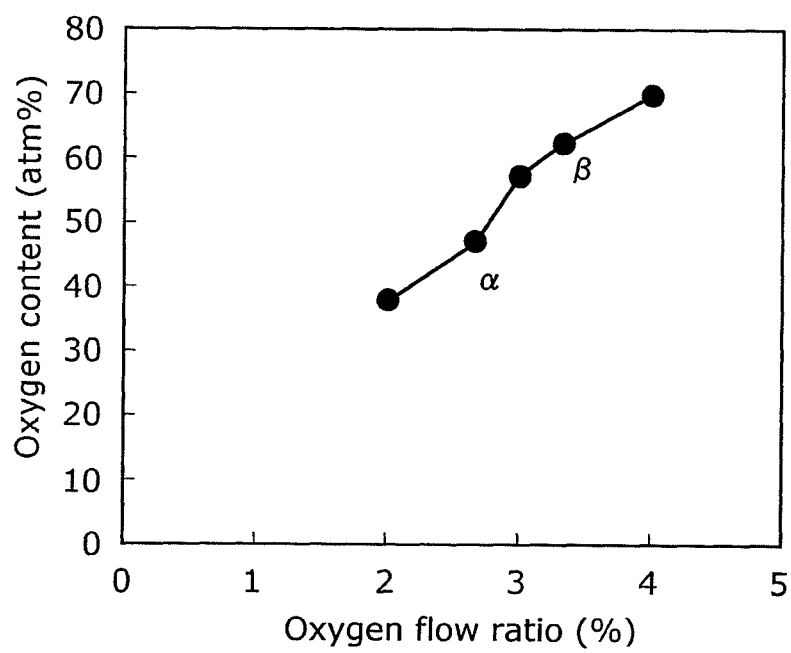
[FIG. 17]

FIG. 17 shows a result of analyzing, with the Rutherford Backscattering Spectrometry (RBS), the composition of the Hf oxide layer formed in the above manner.

The figure shows that an oxygen content atomic percentage of the Hf oxide layer is changed from approximately 37.7 at. % ($HfO_{0.6}$) to approximately 69.4 at. % ($HfO_{2.3}$) when an oxygen flow ratio is changed from 2% to 4.2%.

Based on the above result, the following has been clarified: it is possible to control the oxygen content atomic percentage of the Hf oxide layer with the oxygen flow ratio; and from the oxygen-deficient Hf oxide layer, in which oxygen is more deficient than oxygen content atomic percentage 66.7 at. % of $HfO_2$ that is a stoichiometric oxide of Hf, to even a Hf oxide layer considered to include excessive oxygen are formed.

It is to be noted that although the Rutherford Backscattering Spectrometry (RBS) is employed in analyzing the Hf oxide layer in this experiment, it is also possible to employ an apparatus analytical method such as the Auger Electron Spectroscopy (AES), the X-ray Photoelectron Spectroscopy (XPS), and the Electron Probe Microanalysis (SPMA).

[Resistance Change Characteristics of Oxygen-deficient Hf Oxide Layer]

It is examined which oxygen-deficient Hf oxide layer having how much oxygen content atomic percentage among the oxygen-deficient Hf oxide layers formed in the above manner shows a resistance change. Here, Pt is used as an electrode material for both an upper electrode and a lower electrode between which an oxygen-deficient Hf oxide layer is located.

Using Pt is for the upper electrode and the lower electrode, as stated above, is inappropriate for a bipolar variable resistance nonvolatile element. However, as will be described, Pt is an electrode material which easily shows a resistance change, and is the most suitable material for determining whether or not an oxygen-deficient Hf oxide layer having a certain oxygen content atomic percentage shows the resistance change.

For all of these reasons, the nonvolatile memory element as shown in FIG. 5 is formed.

In other words, the oxide layer 502 having the thickness of 200 nm is formed on the single-crystal silicon substrate 501 with the thermal oxidation method, and the Pt thin film having the thickness of 100 nm is formed as the lower electrode 503 on the oxide layer 502 with the sputtering method.

Then, an oxygen-deficient Hf oxide layer 504 is formed with reactive sputtering, with Hf used as a target. In the range examined in this experiment, the nonvolatile memory element is formed by changing an oxygen gas flow ratio from 2% to 4.2% in the same manner as the above analysis sample. A film thickness of the oxygen-deficient Hf oxide layer 504 is 30 nm.

Then, a Pt thin film having a thickness of 150 nm is deposited as the upper electrode 505 on the oxygen-deficient Hf oxide layer 504 with the sputtering method.

Lastly, the element region 506 is formed by a photolithography process and a dry-etching process. It is to be noted that the element region 506 has a circular pattern having a diameter of 3 μm.

A resistance change phenomenon of the nonvolatile memory element formed in the above manner is measured. As a result, it is satisfactory that a high resistance value is more than four times as large as a low resistance value in the nonvolatile memory element for which a Hf oxide film represented by from point a (an oxygen flow ratio of approximately 2.7% and an oxygen content atomic percentage of approximately 46.6 at. %) to point β (an oxygen flow ratio of approximately 3.3% and an oxygen content atomic percentage of approximately 62 at. %) shown in FIG. 17 is used.

Figure 18:
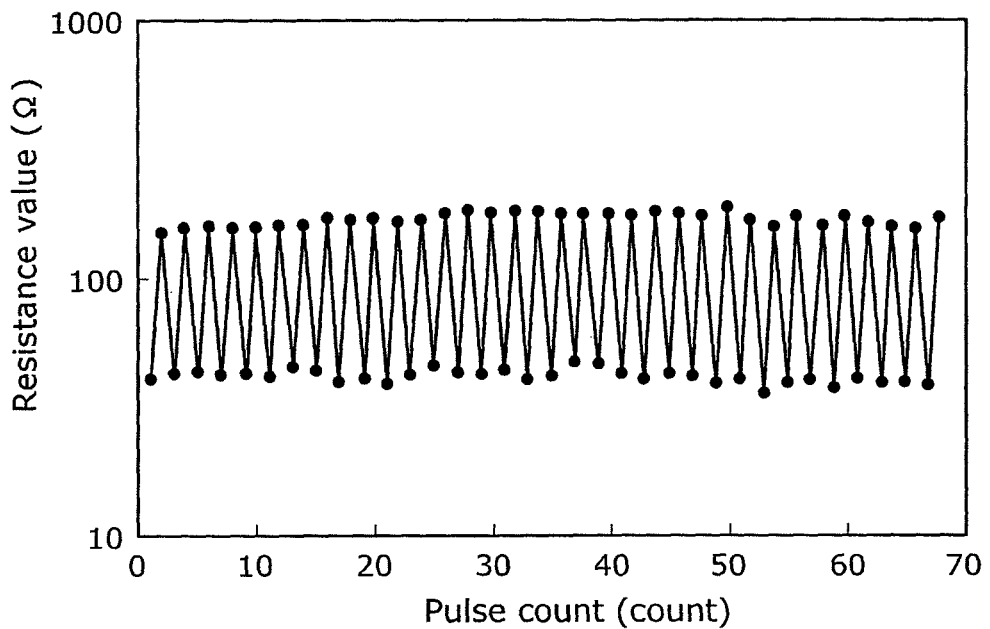
[FIG. 18]
Figure 18:
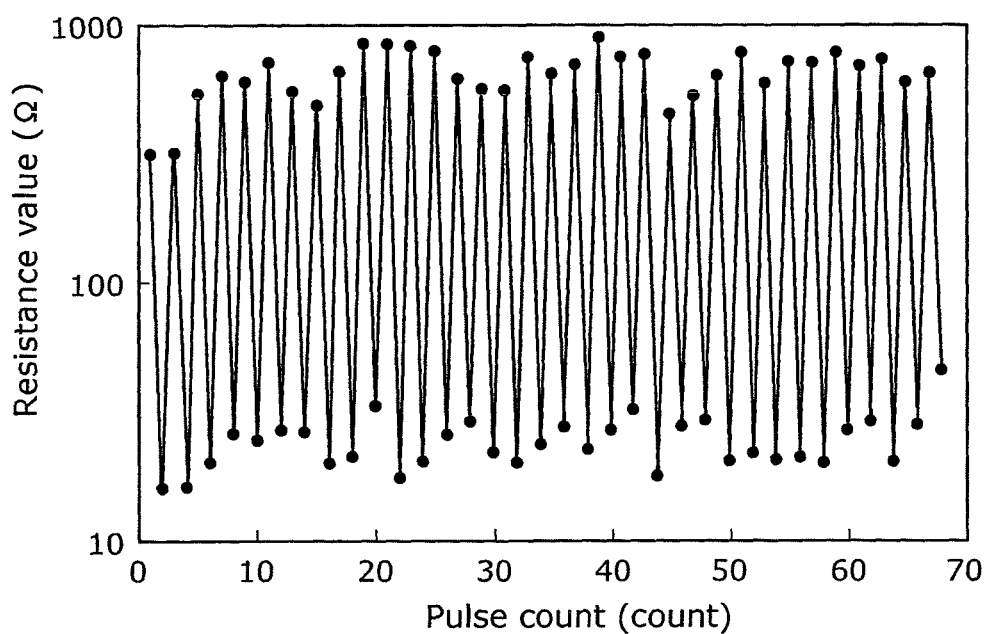

FIGS. 18(a) and 18(b) each show a result of measuring the resistance change characteristics of the nonvolatile memory element for which the Hf oxide layer having the oxygen content atomic percentage represented by either the point α or the point β is used with reference to the number of applied pulses.

FIGS. 18(a) and 18(b) each show that it is satisfactory that the high resistance value is more than four times as large as the low resistance value in the element for which the Hf oxide layer having the oxygen content atomic percentage represented by either the point α or the point β is used.

Thus, it can be said that a composition range in which the oxygen content atomic percentage is 46.6 at. % to 62 at. %, that is, a range of x, $0.9 \leq x \leq 1.6$, when the variable resistance layer is shown as $HfO_x$, is a more appropriate range of the variable resistance layer (the oxygen content atomic percentage=46.6 at. % and the oxygen content atomic percentage=62 at. % correspond to x=0.9 and x=1.6, respectively).

[Resistance Change Characteristics of Variable Resistance Element According to Material Type of Upper Electrode and Lower Electrode]

Next, the following describes a result of forming different types of elements in each of which the oxygen-deficient Hf oxide layer 504 is located between the lower electrode 503 comprising W and the upper electrode 505 comprising one of Al, Ti, Hf, Ta, W, Cu, and Pt, and of examining a situation of a resistance change caused by an electrical pulse, in order to verify whether or not a tendency for the resistance change to occur depends on electrode materials.

The oxygen content atomic percentage of the used oxygen-deficient Hf oxide is 61 at. % ($HfO_{1/56}$) that is close to the upper limit of the preferred range of the oxygen content atomic percentage. Although the method of forming an element is almost same as a method of depositing a Hf oxide, Al, Ti, Hf, Ta, W, Cu, and Pt are released into an atmosphere after the Hf oxide is formed and are then deposited by another sputtering apparatus with the sputtering method.

Table 2 shows materials of the lower electrode and the upper electrode used for formed elements O to U.

TABLE 2

| Name of Element | Lower Electrode Material | Upper Electrode Material |
|---|---|---|
| O | W | Al |
| P | W | Ti |
| Q | W | Hf |
| R | W | Ta |
| S | W | W |
| T | W | Cu |
| U | W | Pt |

A resistance of each of the above elements O to U is changed by giving an electrical pulse having a pulse width of 100 ns at a predetermined amplitude.

In this experiment, because the lower electrode 503 contains W, a non-influential material, a result of the A mode (the mode in which the increase in resistance occurs when the high voltage is applied to the lower electrode with reference to the upper electrode) is omitted from a description, and only a result of the B mode (the mode in which the increase in resistance occurs when the high voltage is applied to the upper electrode with reference to the lower electrode) is shown.

Although there is a slight difference in a voltage of the electrical pulse when the resistance change is caused in the upper electrode mode depending on the elements, a voltage when the increase in resistance is caused ranges from +1.1 V to +1.9 V, and a voltage when the decrease in resistance is caused ranges from −1.1 V to −1.5 V, with the lower electrode being a reference of the voltage.

FIGS. 19(a) to 19(g) are summaries of the measurement results.

Figure 19:
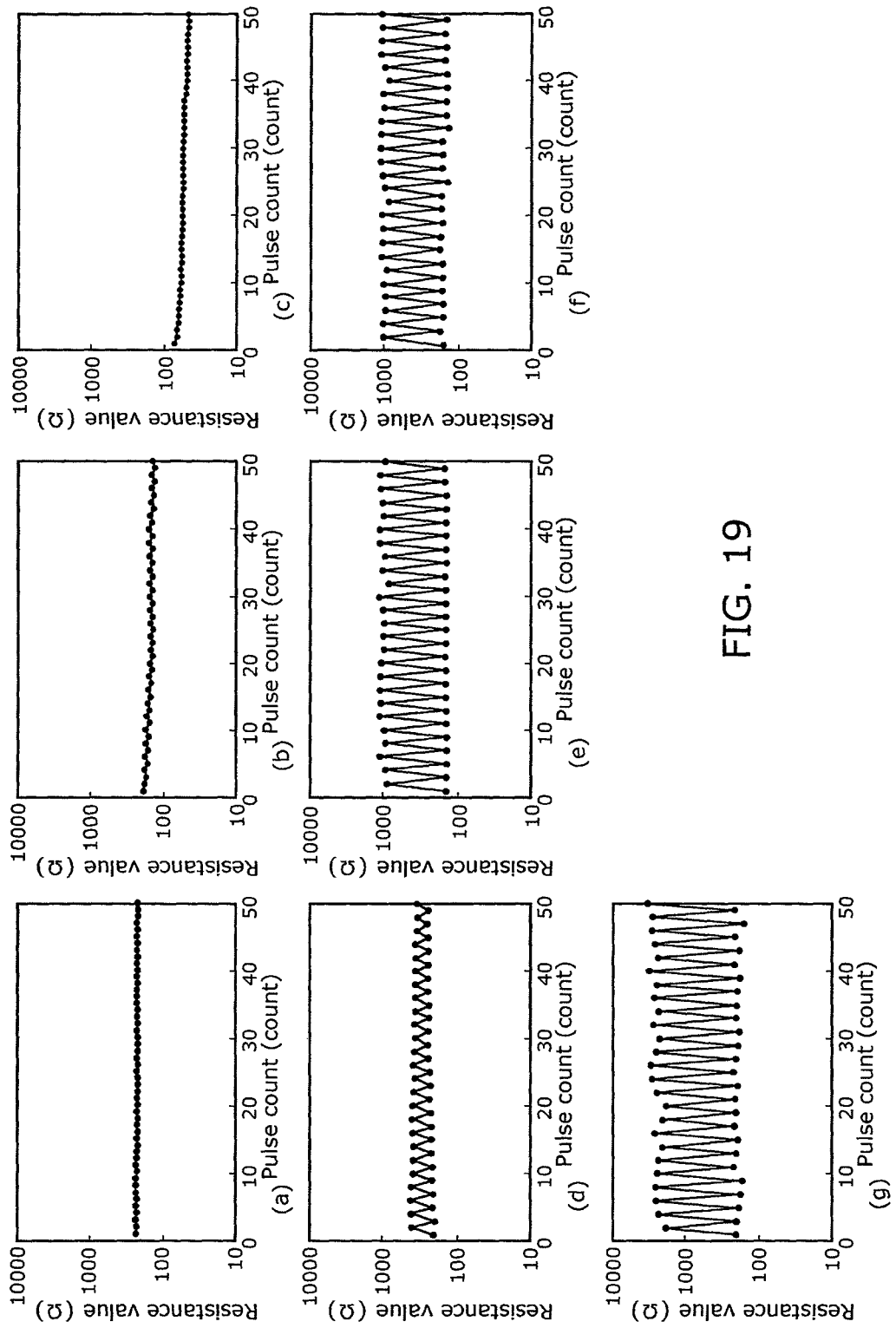
[FIG. 19]

First, by looking at results of the element O of FIG. 19(a) in which Al is used for the upper electrode, the element P of FIG. 19(b) in which Ti is used for the upper electrode, and the element Q of FIG. 19(c) in which Hf is used for the upper electrode, it is clear that the resistance change hardly occurs or does not occur at all. Next, the resistance change, though slight, is initially observed in the element R of FIG. 19(d) in which Ta is used for the upper electrode, but a variation range of the resistance change decreases as the number of pulses decreases, and then the resistance change is hardly observed. It is considered that these materials are not inherently prone to the resistance change.

Next, a relatively stable resistance change has occurred in the element S of FIG. 19(e) in which W is used for the upper electrode, the element T of FIG. 19(f) in which Cu is used for the upper electrode, and the element U in which Pt is used for the upper electrode.

As can be seen from the above results, for the nonvolatile memory element for which the oxygen-deficient Hf oxide is used, there are (influential) materials that are prone to cause the resistance change phenomenon and (non-influential)

materials that are not prone to cause the resistance change phenomenon. In the range of this experiment, the influential electrode materials are Pt, Cu, and W, and the non-influential electrode materials are Ta, Hf, Ti, and Al.

When a variable resistance element having a structure in which an oxygen-deficient Hf oxide is sandwiched by a combination of these materials is formed, a stable resistance change can be achieved without blending the resistance change modes. However, when FIG. 19(d) is referred to, the resistance change, though weak, is observed in the electrode comprising Ta. Accordingly, when this material is used for one of electrodes and when, for example, Ti or Hf, the electrode material with which no resistance change is observed in the this experiment, is used for the other electrode, the stable yet weak resistance change can be expected.

The following describes some examinations of a mechanism in which a resistance change itself occurs and a material dependency of a tendency for the resistance change to occur.

Figure 20:
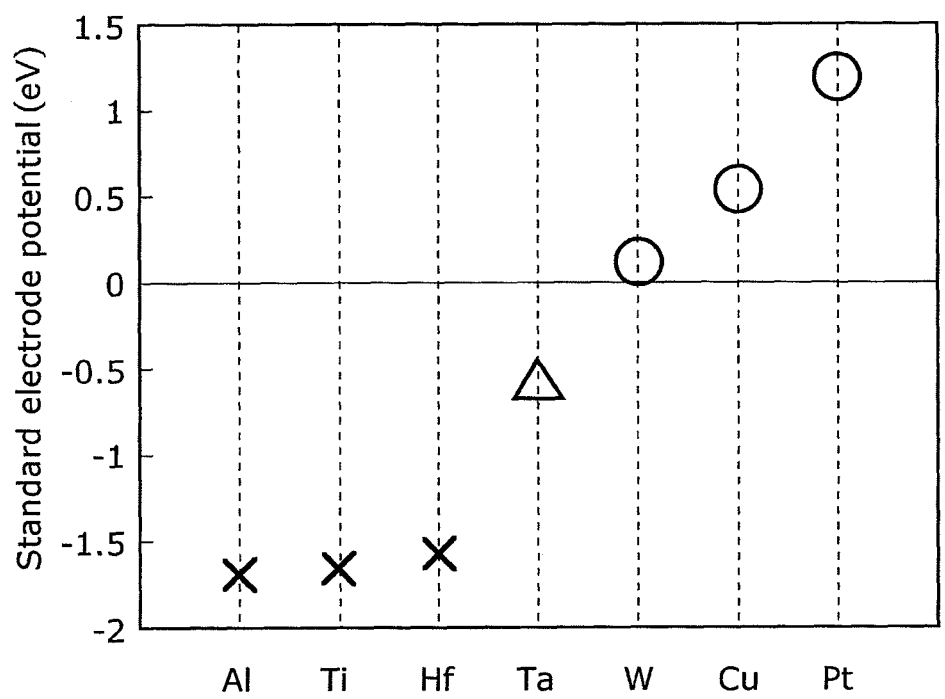
[FIG. 20]

FIG. 20 is a summary of results associated with the nonvolatile memory element for which the oxygen-deficient Hf oxide is used.

The horizontal axis indicates electrode materials, and the vertical axis indicates a standard electrode potential. In FIG. 20, a circle mark denotes that the resistance change occurred easily, a triangle mark denotes that the resistance change occurred though a rate of the change was small, and a cross mark denotes that the resistance change did not occur.

According to FIG. 20, it is clear that the resistance change occurs with the materials each having a standard electrode potential higher than that of Hf, a constituent element of the variable resistance layer, and the resistance change does not occur easily with the materials each having a standard electrode potential lower than that of Hf. In addition, it is clear that the resistance change occurs more easily as a difference between the standard electrode potentials becomes greater, and the resistance change does not occur more easily as the difference becomes smaller.

This result indicates the same tendency as in the result which is described with reference to the second experiment and associated with the nonvolatile memory element for which the oxygen-deficient Ta oxide is used. To put it differently, it is considered that the resistance change mechanism (refer to FIGS. 15(a), 15(b), 16(a) and 16(b)), which is described regarding the nonvolatile memory element for which the oxygen-deficient Ta oxide is used, functions, in the same manner, in the nonvolatile memory element for which the oxygen-deficient Hf oxide is used.

As can be seen from the above results, in the nonvolatile memory element in which the oxygen-deficient Hf oxide is used for the variable resistance layer, the materials each having the different standard electrode potential may be used for the upper electrode and the lower electrode, respectively.

With this, the resistance change dominantly occurs in the vicinity of one of the electrodes, which enables an ideal bipolar resistance change to be realized. Further, the resistance change modes are not blended, which enables a stable resistance change operation.

More preferably, a material having a standard electrode potential higher than that of Hf and a large difference between the standard electrode potentials may be used for one of electrodes, and a material having a standard electrode potential higher than that of Hf and a small difference between the standard electrode potentials may be used for the other electrode.

Still more preferably, a material having a standard electrode potential higher than that of Hf may be used for one of the electrodes, and a material having a standard electrode potential equal to or lower than that of Hf may be used for the other electrode.

It is to be noted that, though not being described as the result of this experiment, a good experimental result indicating that a stable resistance change phenomenon has occurred is obtained regarding a variable resistance element in which TaN and Pt are respectively used for a lower electrode and an upper electrode.

The standard electrode potential of TaN is +0.48 eV, and Pt and Hf have standard electrode potentials of +1.18 eV and −1.55 eV.

This example is an example where Pt, a material having a standard electrode potential higher than that of Hf and a large difference between the standard electrode potentials, is used for the upper electrode, and TaN, a material having a standard electrode potential higher than that of Hf and a small difference between the standard electrode potentials, is used for the lower electrode.

In other words, it is considered that an advantageous effect described as the results of this experiment is obtained in this example by using, as electrode materials, TaN and Pt that satisfy a condition concerning the above standard electrode potentials.

As for another example, TiN and Pt may be used for a lower electrode and an upper electrode, respectively. The standard electrode potential of TiN is +0.55 eV. Thus, since a combination of TiN and Pt satisfies a condition concerning a standard electrode potential when a hafnium oxide is used for a variable resistance layer, the advantageous effect described as the results of this experiment can be expected by using TiN and Pt as the electrode materials.

It is to be noted that, though not being described as the result of this experiment, gold (Au) has a standard electrode potential of +1.692 eV, which is higher than −1.55 eV that is the standard electrode potential of Hf. The advantageous effect described as the results of this experiment can be expected even when Au is used as the electrode material that is prone to cause the resistance change in the case where Hf is used as the variable resistance film.

In addition, as can be seen from the above mechanism, shown is the operation in which the resistance value increases when the electrical pulse having the positive voltage is applied to the electrode that is prone to cause the resistance change and the resistance value decreases when the electrical pulse having the negative voltage is applied.

It is to be noted that although the examples where the oxygen-deficient Ta oxide or the Hf oxide is used as the variable resistance layer are described in the first, second, and third experiments, the present invention is not limited to the examples, and since it is considered that an electric field applied to an electrode causes movement of oxygen ions as described above, the present invention can be applied to a nonvolatile memory element in which an oxygen-deficient oxide film of another transition metal is used for a variable resistance layer. In this case, a nonvolatile memory element which operates predominantly with one of electrodes can be formed by selecting an electrode material based on a standard electrode potential of the transition metal material to be used. In addition, a slight amount of dopant may be added to the tantalum oxide or the hafnium oxide which is the variable resistance layer, to an extent that resistance change characteristics are not significantly changed.

[Variable Resistance Element Including Oxygen-deficient Transition Metal Oxide Stacked on Variable Resistance Layer]

The variable resistance element can also be provided with a structure including two variable resistance layers each of which contains one of an oxygen-deficient tantalum oxide, an oxygen-deficient hafnium oxide, and an oxygen-deficient zirconium oxide and which have different oxygen content atomic percentages and are each held between two electrodes.

These variable resistance elements have been devised by the inventors of the present application in order to obtain a nonvolatile memory element having reversible and stable rewriting characteristics and using a variable resistance phenomenon, and are respectively described in detail by the international publications of related applications WO2008/149484, WO2010/004705, and WO2010/21381.

The feature that the resistance change characteristics held by the variable resistance elements can be fixed to either the aforementioned A mode or B mode is applicable to the nonvolatile variable resistance device according to an implementation of the present invention, as in the case of the above variable resistance element including upper and lower electrodes comprising a different material.

The international patent application publication WO2008/149484 discloses in detail the optimum condition of the thickness and composition of each of the two variable resistance layers in the variable resistance element including the oxygen-deficient tantalum oxide.

[Current Steering Element in which $SiN_x$ is Used for Current Steering Layer]

The following describes a current steering element of 1D1R cross point memory device according to an implementation of the present invention.

The international publication of a related application WO2008/117494 of the related applications describes in detail that when a current steering layer is made of silicon nitride $SiN_x$ ($0 < x \leq 0.85$), a current steering element has bidirectional diode properties that exhibit current-voltage characteristics which are electrically non-linear and substantially symmetric to polarity of an applied voltage.

The international publication of a related application WO2010/004675 describes in detail that when at least one of the first electrode and the second electrode of a current steering element is made of α-tungsten (α-W) having a body-centered cubic lattice (bcc) structure, an MSM diode capable of stably supplying a current of 30,000 $A/cm^2$ or more can be obtained.

These bidirectional diode elements having symmetric current-voltage characteristics and high withstand current characteristics of 30,000 $A/cm^2$ or more are applicable as the current steering element of the 1D1R cross point memory according to an implementation of the present invention.

[Variable Resistance Nonvolatile Memory Device According to First Embodiment of the Present Invention]

Next, as an embodiment of the present invention, a 1D1R cross point memory device including the above-described variable resistance element and a current steering element is described.

Figure 21:
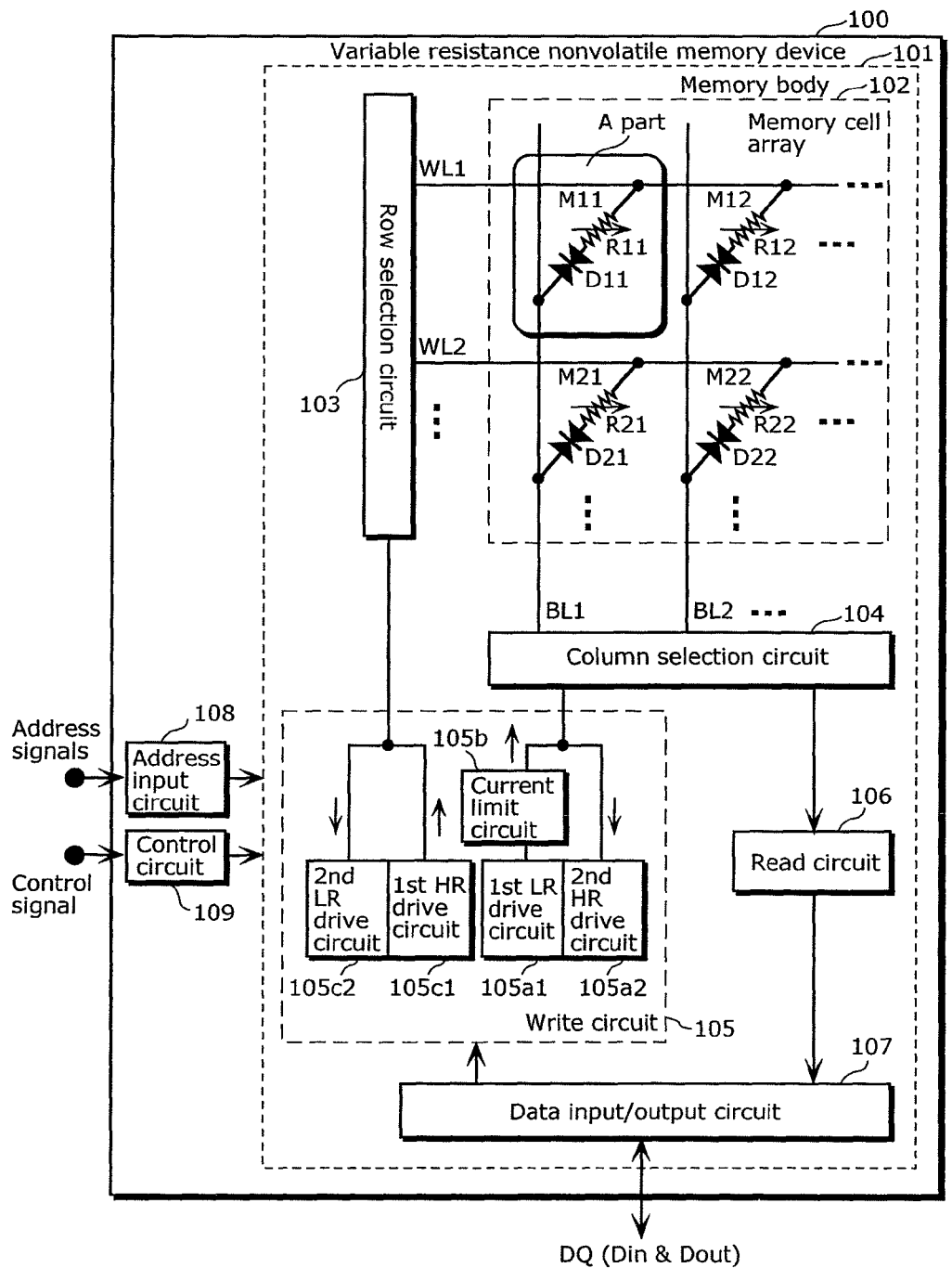
[FIG. 21]

FIG. 21 is a block diagram showing a configuration of the variable resistance nonvolatile memory device according to the first embodiment of the present invention. It shows, as the first embodiment, a configuration of a memory cell that operates in the B mode in which the variable resistance phenomenon occurs presumably in the vicinity of the upper electrode, and an optimum control circuit for the configuration.

In FIG. 21, a variable resistance nonvolatile memory device 100 includes a memory body 101 on a semiconductor substrate, and the memory body 101 includes a memory cell array 102, a row selection circuit 103, a column selection circuit 104, a write circuit 105, a read circuit 106 which detects an amount of current flowing to a selected bit line and determines whether stored data is "1" or "0", and a data input/output circuit 107 which inputs/outputs data via a terminal DQ.

An operation of the memory body 101 is controlled by output supplied thereto from an address input circuit 108 to which address signals are input from outside of the variable resistance nonvolatile memory device 100 and which selects and indicates a predetermined address, and a control circuit 109 to which a control signal is input.

The memory cell array 102 includes memory cells Mij (i and j are natural numbers satisfying $i \leq M$ and $j \leq N$. The same applies to descriptions below.) arranged in M rows and N columns (M and N are natural numbers, and only four bits of 2 rows×2 columns are shown in FIG. 21.). In the memory cell Mij, one terminal of a variable resistance element Rij and one terminal of a current steering element Dij having both positive and negative threshold voltages are connected to each other in series. The other terminal of the variable resistance element Rij is connected to a word line WLi, and the other terminal of the current steering element Dij is connected to a bit line BLj.

In the present configuration, the bit lines BLj are composed of lines of a lower layer and arranged in the vertical direction of the sheet of drawing, and the word lines WLi are composed of lines of an upper layer and arranged in the horizontal direction of the sheet of drawing. The variable resistance element Rij is configured so as to have characteristics of the B mode in which the variable resistance phenomenon occurs in the vicinity of the upper electrode of the variable resistance element, which will be hereinafter described in detail.

The word lines WLi are connected to the row selection circuit 103, and in a read or write mode, one row is selected. The bit lines BLj are connected to the column selection circuit 104, and in a read or write mode, one column is selected.

In the write mode, the data input/output circuit 107 writes data in the variable resistance element Rij of the selected memory cell Mij so as to increase or decrease resistance, according to a write instruction of the data "0" or the data "1" of the data input signal Din. In the present embodiment, writing the data "0" corresponds to resistance-decreasing writing while writing the data "1" corresponds to resistance-increasing writing.

The write circuit 105 is connected to the data input/output circuit 107. The write circuit 105 includes: the first LR drive circuit 105a1 for high voltage level driving in the writing of the data "0", i.e., the resistance-decreasing writing; a current limit circuit 105b to which an output of the first LR drive circuit 105a1 is input; and the second LR drive circuit 105c2 for low voltage level driving in the writing of the data "0", i.e., the resistance-decreasing writing. The write circuit 105 further includes: the first HR drive circuit 105c1 for high voltage level driving in the writing of the data "1", i.e., the resistance-increasing writing; and the second HR drive circuit 105a2 for low voltage level driving in the writing of the data "1", i.e., the resistance-increasing writing.

Upon resistance-decreasing writing, a write pulse having current limited by the current limit circuit 105b is provided to the selected bit line BLj via the column selection circuit 104. On the other hand, upon resistance-increasing writing, the first HR drive circuit 105c1 having no current limiting function provides a write pulse to the selected word line WLi via the row selection circuit 103, which is one of the features.

In the variable resistance nonvolatile memory device 100 thus configured, the bit line BLj and the word line WLi are an example of the first signal line and the second signal line, respectively, according to an implementation of the present invention. The first LR drive circuit 105a1, the first HR drive circuit 105c1, the second LR drive circuit 105c2, and the second HR drive circuit 105a2 are an example of the first drive circuit, the second drive circuit, the third drive circuit, and the fourth drive circuit, respectively, according to an implementation of the present invention. The current limit circuit 105b is an example of the current limit circuit according to an implementation of the present invention. The column selection circuit 104 and the row selection circuit 103 are the examples of the first selection circuit and the second selection circuit according to an implementation of the present invention.

Figure 22:
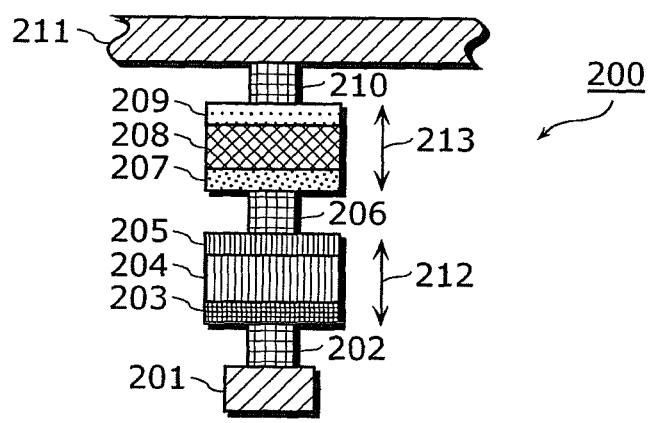
[FIG. 22]

FIG. 22 is a cross-sectional diagram showing a configuration of a memory cell M11 shown as an A part in FIG. 21.

A current steering element 212 and a variable resistance element 213 correspond respectively to the current steering element Dij and the variable resistance element Rij (where i and j are positive integers) shown in FIG. 21.

The memory cell 200 includes, in the following order: a first-layer line 201 comprising aluminum (Al); a first via 202; a third electrode 203 comprising tantalum nitride (TaN), a current steering layer 204 comprising nitrogen-deficient silicon nitride, and the fourth electrode 205 comprising TaN, in the current steering element 212; a second via 206; a first electrode 207 comprising TaN, a variable resistance layer 208 comprising oxygen-deficient tantalum oxide, and a second electrode 209 comprising platinum (Pt), in the variable resistance element 213; a third via 210; and a second-layer line 211 comprising aluminum (Al).

As another feature, the second electrode 209 located in an upper layer and connected on the side of the word line WLi contains Pt having a higher standard electrode potential than the first electrode 207 connected on the side of the bit line BLj.

In the structure of this memory cell, as described above in the basic data of the present invention, the resistance change occurs in the vicinity of the interface between the variable resistance layer 208 and the second electrode comprising Pt having a higher standard electrode potential than TaN comprised in the first electrode, and this variation corresponds to the B mode.

As the first-layer line 201 of FIG. 22 corresponds to the bit line BL1 and the second-layer line 211 of FIG. 22 corresponds to the word line WL1, the variable resistance element 213 changes to the low resistance state when a voltage of the first-layer line 201 relative to a voltage of the second-layer line 211 becomes a predetermined voltage VLth or higher, and the variable resistance element 213 changes to the high resistance state when a voltage of the second-layer line 211 relative to a voltage of the first-layer line 201 becomes a predetermined voltage VHth or higher.

It is to be noted that in FIG. 22, the positions of the current steering element 212 and the variable resistance element 213 may turn upside down, and the positions of the first electrode 207 and the second electrode 209 in the variable resistance element 213 may be opposite.

Figure 23:
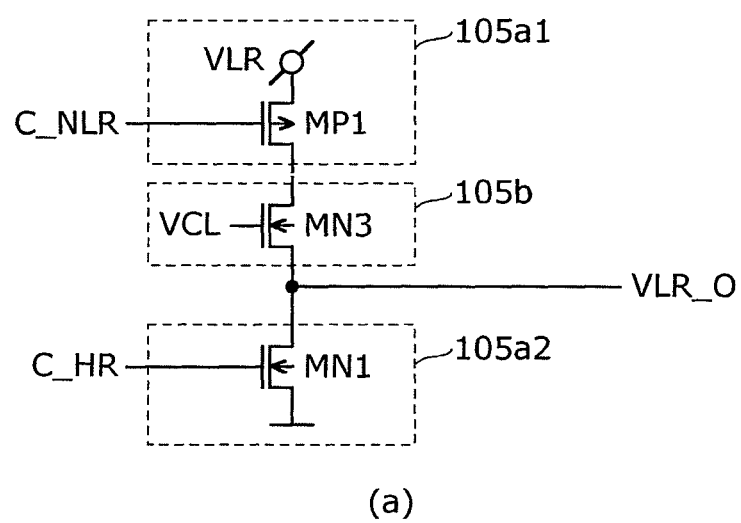
[FIG. 23]
Figure 23:
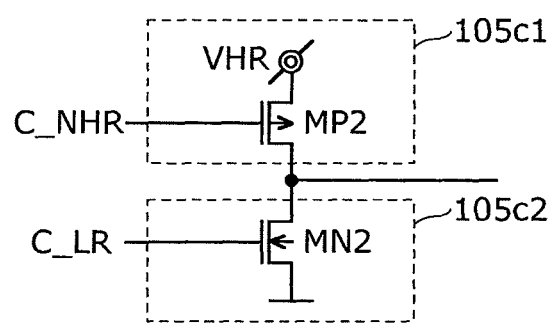

FIG. 23 shows one example of a specific circuitry layout of the write circuit 105 of FIG. 21.

FIG. 23(a) shows one example of the first LR drive circuit 105a1, the second HR drive circuit 105a2, and the current limit circuit 105b.

The first LR drive circuit 105a1 includes a P-type MOS transistor MP1, the second HR drive circuit 105a2 includes an N-type MOS transistor MN1, and the current limit circuit 105b includes an N-type MOS transistor MN3.

C_NLR indicates a write control signal which is at low voltage level with pulses for resistance-decreasing writing, and C_HR indicates a write control signal which is at high voltage level with pulses for resistance-increasing writing. VCL is a gate voltage for steering current in decreasing resistance and is at a predetermined constant level.

Furthermore, the source of the P-type MOS transistor MP1 is supplied with a resistance-decreasing writing power supply voltage VLR so that the P-type MOS transistor MP1 is capable of supplying voltage and current enough to drive the variable resistance element 213 to decrease its resistance.

FIG. 23(b) shows one example of the first HR drive circuit 105c1 and the second HR drive circuit 105c2.

The first HR drive circuit 105c1 includes a P-type MOS transistor MP2, and the second LR drive circuit 105c2 includes an N-type MOS transistor MN2.

C_NHR indicates a write control signal which is at low voltage level with pulses for resistance-increasing writing, and C_LR indicates a write control signal which is at high voltage level with pulses for resistance-decreasing writing.

Furthermore, the source of the P-type MOS transistor MP2 is supplied with a resistance-increasing writing power supply voltage VHR so that the P-type MOS transistor MP2 is capable of supplying voltage and current enough to drive the variable resistance element 213 to increase its resistance.

In the write mode, when an instruction is issued to write the data "0", that is, when the resistance-decreasing writing is instructed, C_NLR is set at low voltage level and C_LR is set at high voltage level so that the P-type MOS transistor MP1 of the first LR drive circuit 105a1 and the N-type MOS transistor MN2 of the second LR drive circuit 105c2 turn on, which form a current path for a current output from the first LR drive circuit 105a1, to flow into the second LR drive circuit 105c2 by way of a main path including the current limit circuit 105b, the bit line BLj, the memory cell Mij, and the word line WLi.

As to the output of the current limit circuit 105b, the current is limited by the N-type MOS transistor MN3, and the output voltage VLR_O has an upper limit determined by VCL−Vth_MN3 where Vth_MN3 represents a threshold voltage of MN3. The current limit circuit 105b has the source follower characteristics as well and therefore operates as a constant power supply so that the current is constant, when the resistance-decreasing writing power supply voltage VLR is set to a predetermined level or higher.

In the write mode, when an instruction is issued to write the data "1", that is, when the resistance-increasing writing is instructed, C_NHR is set at low voltage level and C_HR is set at high voltage level so that the P-type MOS transistor MP2 of the first HR drive circuit 105a1 and the N-type MOS transistor MN1 of the second HR drive circuit 105a2 turn on, which form a current path for a current output from the first HR drive circuit 105c1, to flow into the second HR drive circuit 105a2 by way of a main path including the word line WLi, the memory cell Mij, and the bit line BLj. This current path includes no current limit circuit, with the result that the current increases monotonically as the resistance-increasing writing power-supply VHR increases.

[Operation of Variable Resistance Nonvolatile Memory Device According to First Embodiment of the Present Invention]

An operation of the variable resistance nonvolatile memory device 100 configured as above is described.

Figure 24:
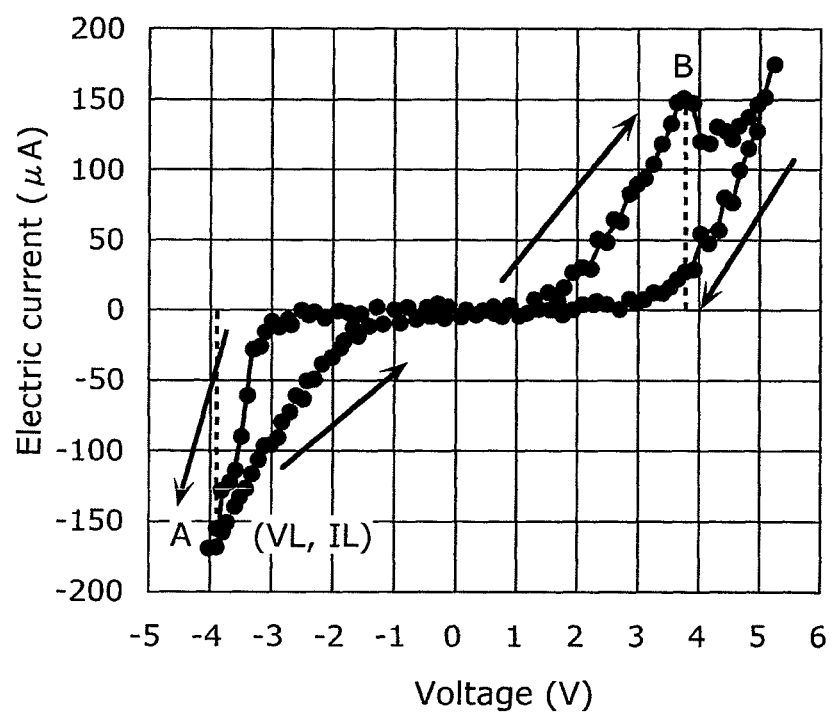
[FIG. 24]

First, an operation of the memory cell is described. FIG. 24 shows a voltage-current relation of a memory cell having the structure of FIG. 22, observed when a voltage is applied under the assumption that the polarity of the voltage is positive when the second-layer line 211 has a higher voltage than the first-layer line 201.

When a voltage having negative polarity by which the first-layer line 201 has a higher voltage than the second-layer line 211 is applied to the memory cell 200, the variable resistance element starts to change from the high resistance state to the low resistance state at a voltage around −3.2 V. As the voltage is applied up to −3.9 V (Point A), the resistance gradually decreases according to the applied voltage.

On the other hand, when a voltage having positive polarity by which the second-layer line 211 has a higher voltage than the first-layer line 201 is applied to the memory cell 200, the variable resistance element starts to change from the low resistance state to the high resistance state at a voltage around 3.8 V (Point B), of which position is roughly symmetrical to the voltage for the change to the low resistance state. When the voltage is further applied up to 5.1 V, an increase in current is observed, and it can be seen that a decrease in the applied voltage after this causes a change to the high resistance state because the current is smaller than that with an increase in the applied voltage.

In summary, the observed data of FIG. 24 shows that the memory cell 200 having the structure of FIG. 22 exhibits the B mode in which it changes to the low resistance state when the voltage of the first-layer line 201 is equal to or higher than the predetermined voltage VLth with respect to the voltage of the second-layer line 211 while it changes to the high resistance state when the voltage of the second-layer line 211 is equal to or higher than the predetermined voltage VHth with respect to the voltage of the first-layer line 201, and also shows that the voltage (Point A) to be applied for the low resistance state and the voltage (Point B) at which the change to the high resistance state starts are roughly symmetrical.

Next, an operation of the variable resistance nonvolatile memory device configured as above is described.

First, characteristics of the write circuit 105 are described.

FIG. 25(a) shows an equivalent circuit diagram of only a current path involved in writing, cut out in order to explain the operation of the nonvolatile memory device shown in FIG. 21 with use of the first specific write circuit shown in FIG. 23. FIG. 25(b) shows characteristics of the equivalent circuit which are a relation between a voltage given from the write circuit 105 and a current flowing through the memory cell 200 observed in a simulation, in a state where the variable resistance element of the memory cell 200 has a fixed resistance of 10 kΩ for the low resistance state, for example, and is connected in series to the bi-directional current steering element.

In FIG. 25(b), a negative voltage region (A) indicates characteristics for driving, by the first LR drive circuit 105a1, the memory cell in the low resistance state at, for example, 10 kΩ, changed from the high resistance state (For example, −3 V means driving with 3 V given to VLR). A positive voltage region (B) indicates characteristics for driving, by the first HR drive circuit 105c1, the memory cell in the low resistance state at, for example, 10 kΩ, for the high resistance state. It is to be noted that the voltage of the drive circuit corresponds to the resistance-decreasing writing power supply voltage VLR when the voltage is in the negative voltage region (A) while the voltage of the drive circuit corresponds to the resistance-increasing writing power supply voltage VHR when the voltage is in the positive voltage region (B). A broken line in the negative voltage region (A) indicates, for comparison, characteristics in the case where no current limit circuit 105b is placed.

Referring to FIG. 25(b), it is found that, when the resistance of the memory cell decreases, the current flowing to the memory cell increases as the low-resistance power supply voltage VLR increases, and with no current limit circuit 105b placed, the current increases monotonically as indicated by the broken line, while, with the current limit circuit 105b, its current limiting effect results in an inflection point C, and from approximately 3.5 V, the current is limited to a constant current of 130 μA.

On the other hand, it is found that, when the resistance of the memory cell increases, the application of the high-resistance power supply voltage VHR of 3.5 V causes a flow of current of 150 μA, that is, a current larger than that for decreasing the resistance, because there is no current limit circuit.

Now, settings of the N-type MOS transistor MN3 of the current limit circuit 105b in this circuit layout are discussed.

In the discussion of a low resistance value which is to be set for the memory cell, suppose the low resistance state with a current supplied until a voltage across the memory cell becomes −3.9 V which is a voltage applied in the low resistance state indicated by the point A in the characteristics of memory cell shown in FIG. 24. As described above, in the case where the voltage applied in this low resistance state is low and a smaller amount of current flows, the low resistance state is set to be close to the high resistance, while, in the case where the voltage is high and a larger amount of current flows, the resistance decreases to a further extent. For formulation, the voltage at the point A is denoted by VL and the current at the point A is denoted by IL. In the discussion, suppose that no voltage drop occurs in diodes.

Referring to FIG. 25(a), the voltage at the inflection point C shown in FIG. 25(b) is approximate to VCL−Vth_MN3 when VLR≧VCL where Vth_MN3 represents a threshold voltage of the N-type MOS transistor MN3 in the current limit circuit 105b, VCL represents a gate voltage of the N-type MOS transistor MN3 in the current limit circuit 105b, and VLR represents a voltage of the LR power supply voltage.

When the voltage (VL=VLth) at the low resistance point of the memory cell, indicated as the point A in FIG. 24, and the voltage VCL−Vth_MN3 at the inflection point C of the current limit circuit 105b in FIG. 25(b) are set to be equal to each other, the memory cell may be set at the supposed low resistance state at the inflection point C of the current limit circuit 105b. Thus, VCL is set so as to satisfy the following:

$$VLth = VCL - Vth\_MN3 \text{ and } VLR \geq VCL$$

That is, $$VCL = VLth + Vth\_MN3 \text{ and } VLR \geq VCL \quad \text{(Expression 1)}$$

In this case, it is assumed that a voltage drop in the N-type MOS transistor MN2 is negligible. Furthermore, in this setting, a gate width and a gate length of the N-type MOS transistor MN3 in the current limit circuit 105b are adjusted so that the current IL at the point A can be supplied.

With this setting, it is possible to set the resistance value in the low resistance state to a constant value in a stabilized manner, because the current is constant with a voltage over the inflection point C even when the low-resistance power supply voltage VLR is set to be relatively high in response to concerns about voltage fluctuation and speed degradation.

[First Variation of Variable Resistance Nonvolatile Memory Device According to First Embodiment of the Present Invention]

Figure 26:
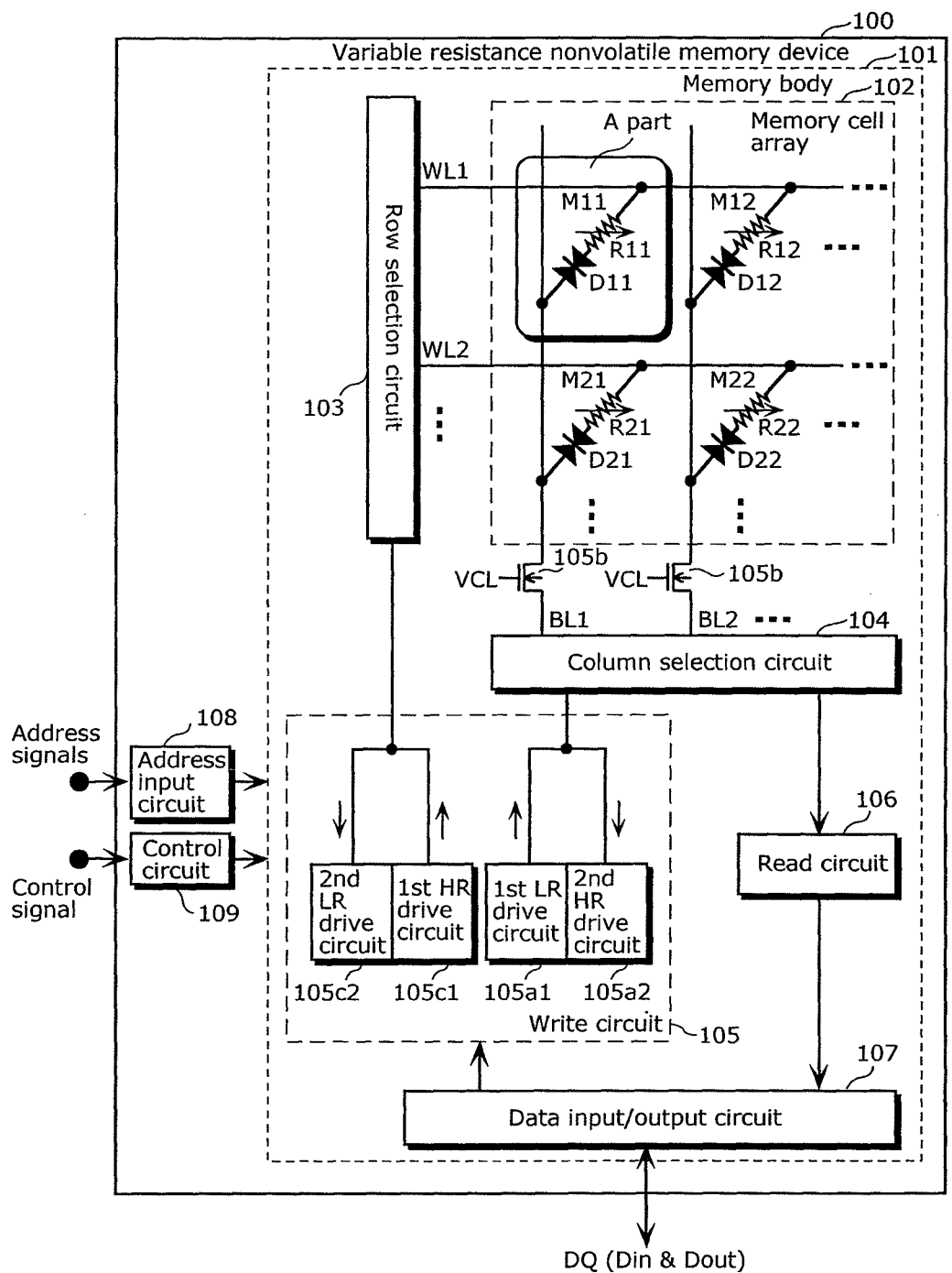
[FIG. 26]

FIG. 26 shows the first variation of the first embodiment which is different from FIG. 21, in which variation the current limit circuit 105b in the first embodiment includes the N-type MOS transistor. It is characteristic that the current limit circuit 105b is positioned between the first electrode of the variable resistance element and the write circuit. In the configuration of FIG. 26, the current limit circuit 105b is positioned close to the memory cell array, which makes it possible to limit the current at a position closer to the memory cell as compared to the case of FIG. 21. As a result, upon resistance-decreasing writing, the load for charging and discharging via the current limit circuit 105b can be smaller, and the current can be limited according to the change of the memory cell toward the low resistance state, which allow for more accurate setting of the supposed resistance value.

When the LR drive circuit performs writing, the current limit circuit 105b becomes a source follower and thus exhibits constant-current characteristics, thereby being capable of setting the resistance value in the low resistance state to a constant value in a stabilized manner, and when the HR drive circuit performs writing, the current limit circuit 105b does not become the source follower and therefore is capable of supplying a larger amount of current than the case of decreasing the resistance.

The column selection circuit 104 generally includes a P-type MOS transistor, an N-type MOS transistor, and a decoder circuit, and one bit line corresponding to a selected memory cell is selected. As including only the N-type MOS transistor, the column selection circuit 104 becomes a source follower when the LR drive circuit performs writing, which means that the column selection circuit 104 can be provided with not only a function of selecting a column but also a function of limiting the current. In this case, it is no longer necessary to provide the current limit circuit 105b, allowing for a reduction in area.

[Second Variation of Variable Resistance Nonvolatile Memory Device According to First Embodiment of the Present Invention]

Figure 27:
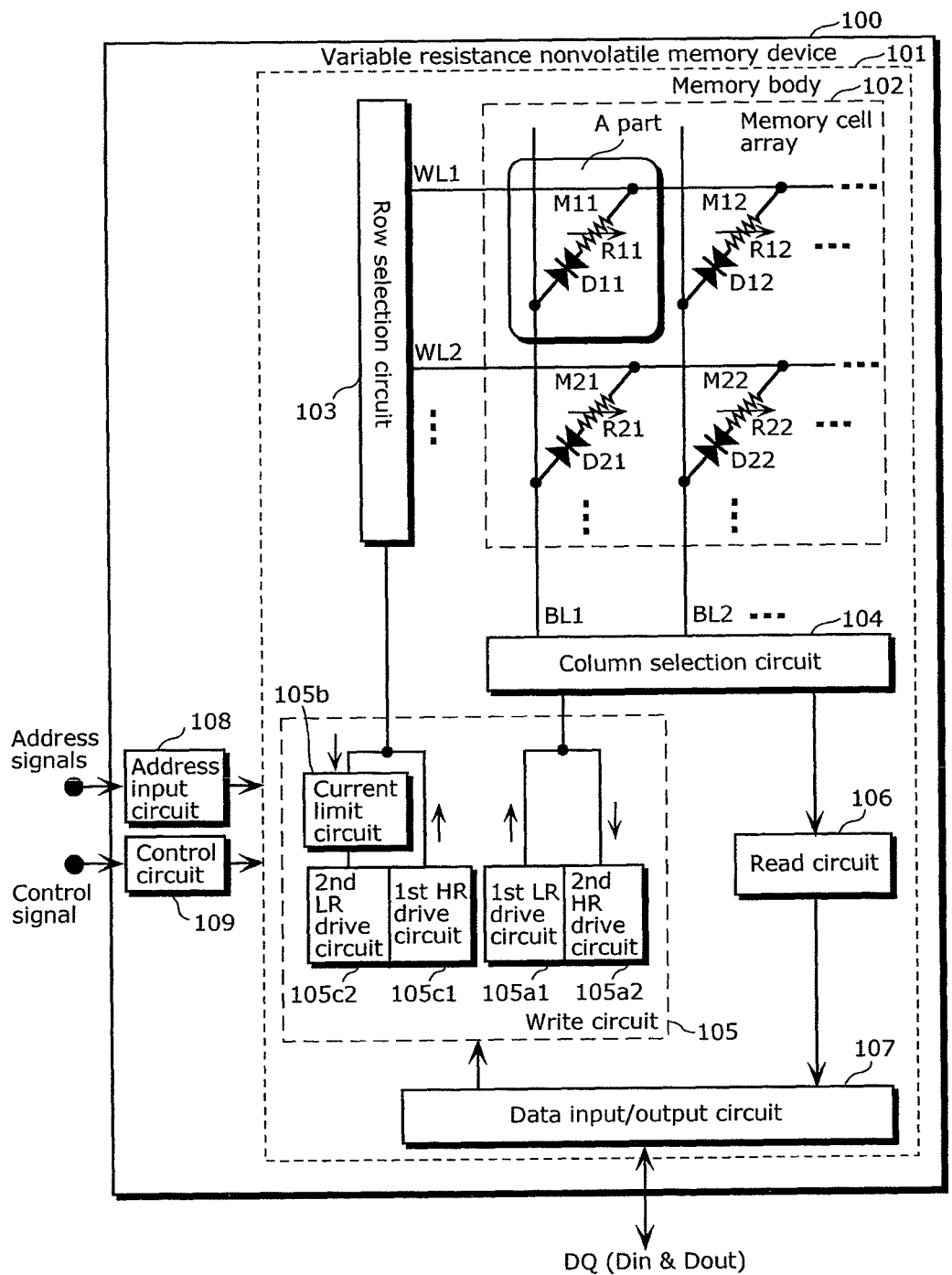
[FIG. 27]

The current limit circuit 105b may be provided on the side of the second LR drive circuit 105c2 instead of the first LR drive circuit 105a1. FIG. 27 shows the second variation of the first embodiment. FIG. 28(a) shows one example of the first specific circuitry layout of the write circuit 105 of FIG. 27, in which the current limit circuit 105b including an N-type MOS transistor is provided. FIG. 28(b) shows, as in the case of FIG. 25(b), characteristics of the example which are a relation between a voltage given from the write circuit 105 and a current flowing through the memory cell 200 observed in a simulation, in a state where the variable resistance element of the memory cell 200 has a fixed resistance of 10 kΩ for the low resistance state, for example, and is connected in series to the bi-directional current steering element.

In FIG. 28(b), a negative voltage region (A) indicates characteristics for driving, by the first LR drive circuit 105a1, the memory cell in the low resistance state at, for example, 10 kΩ, changed from the high resistance state (For example, −3 V means driving with 3 V given to VLR), and a positive voltage region (B) indicates characteristics for driving, by the first HR drive circuit 105c1, the memory cell in the low resistance state at, for example, 10 kΩ, for the high resistance state. A broken line in the negative voltage region (A) indicates, for comparison, characteristics in the case where no current limit circuit 105b is placed.

Referring to FIG. 28(b), it is found that, when the resistance of the memory cell decreases, the current flowing to the memory cell increases as the low-resistance power supply voltage VLR increases, and with no current limit circuit 105b placed, the current increases monotonically as indicated by the broken line, while, with the current limit circuit 105b, its current limiting effect results in an inflection point C, and from approximately 3.9 V, the current is limited to a constant current of 130 µA.

On the other hand, it is found that, when the resistance of the memory cell increases, the application of the high-resistance power supply voltage VHR of 3.5 V causes a flow of current of 150 µA, that is, a current larger than that for decreasing resistance, because there is no current limit circuit.

Referring to FIG. 28(a), the voltage at the inflection point C shown in FIG. 28(b) is approximate to VCL−Vth_MN3+VL where Vth_MN3 represents a threshold voltage of the N-type MOS transistor MN3 in the current limit circuit 105b, VCL represents a gate voltage of the N-type MOS transistor MN3 in the current limit circuit 105b, VLR represents a voltage of the LR power supply voltage, and VL=VLth represents a voltage at a low-resistance point of the memory cell. By setting VCL so as to satisfy the following:

$$VLR = VCL - Vth\_MN3 + VL = VCL - Vth\_MN3 + VLth$$

That is, $$VCL = VLR - VLth + Vth\_MN3 \quad \text{(Expression 2)}$$

so that the voltage VCL−Vth_MN3+VLth at the inflection point C is equal to the voltage VLR of the LR power supply, it is possible to decrease the resistance of the memory cell at the inflection point C of the current limit circuit 105b, that is, to set the memory cell in the supposed low resistance state, when VLR is given as a voltage of the LR power supply. In this case, it is assumed that a voltage drop in the P-type MOS transistor MP1 is negligible. Furthermore, in this setting, a gate width and a gate length of the N-type MOS transistor MN3 in the current limit circuit 105b are adjusted so that the current IL at the point A of FIG. 24 can be supplied.

Moreover, when the current limit circuit 105b is made as a constant current circuit using a current mirror circuit or the like, instead of the N-type MOS transistor, and thus, the current is controlled to a constant level, it is possible to set the supposed resistance value with more accuracy.

With this setting, it is possible to set the resistance value in the low resistance state to a constant value in a stabilized manner, because the current is constant with a voltage over the inflection point C even when the low-resistance power supply voltage VLR is set to be relatively high in response to concerns about voltage fluctuation and speed degradation.

In the above, the threshold voltage of the N-type MOS transistor MN3 is set at Vth_MN3, which indicates the threshold voltage in the state where the source voltage is higher than the substrate voltage, that is, in the state where the substrate bias effect is obtained. Setting not only VCL but also the threshold voltage Vth_MN3 so as to satisfy the relations of (Expression 1) and (Expression 2) is effective for a reduction in operating voltage.

Characteristics of the memory cells, for example, current values at the low resistance points of the memory cells, indicated by the point A in FIG. 24, have intrinsic variation among respective memory cells. This variation causes variation of the inflection point C, which needs to be taken into account upon setting of VCL. Specific description is given below.

First, as to a lower limit, the read circuit 106 generally needs a read current equal to or more than a certain level, to read the memory cell in the low resistance state. It is therefore necessary to set VCL such that even the memory cell having the minimum read current, that is, the memory cell having the highest resistance among the memory cells in the low resistance state, has resistance lower than a certain level, in order to keep the read current.

As to an upper limit, in the case where a current more than the certain level repeatedly flows to the memory cell 200, undesirable results may be obtained in terms of reliability of the memory cell, especially, the current steering element 212. In such a case, VCL is set so that no current more than a withstand current (the maximum current which does not break the current steering element) flows to the current steering element, that is, the variable resistance element remains in the low resistance state with resistance higher than the certain level.

In setting of the lower limit, as means generally used in a nonvolatile memory device, the resistance values may be verified to perform additional writing on the memory cell which is in an insufficient low resistance state, for example. In such a case, the memory cell on which the additional writing is performed may be given a higher VCL so as to promote a decrease in resistance.

Figure 29:
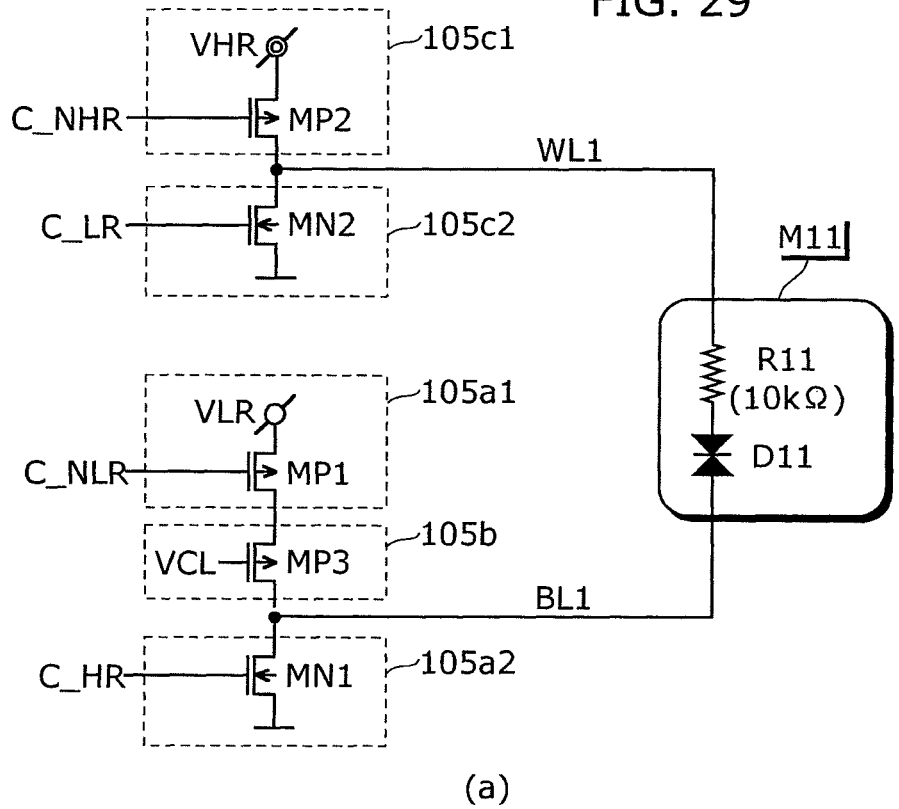
[FIG. 29]
Figure 29:
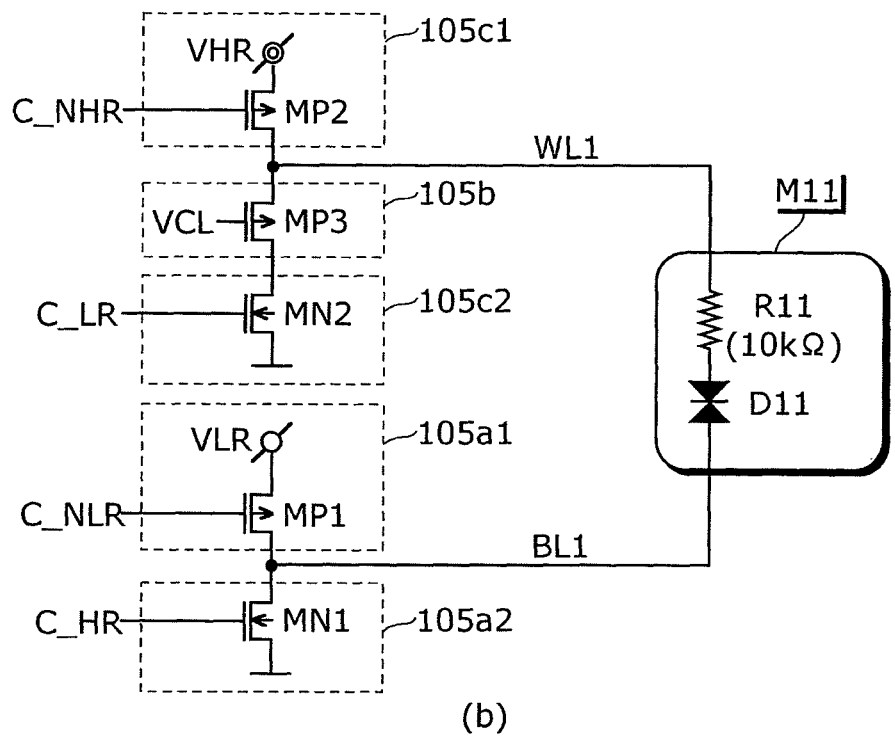

The current limit circuit 105*b*, which includes the N-type MOS transistor in the above description, may include a P-type MOS transistor. FIG. 29(*a*) shows an example of the second specific circuitry layout of the write circuit 105 of FIG. 21, in the case where the current limit circuit 105*b* including the P-type MOS transistor is provided on the side of the first LR drive circuit 105*a*1, and FIG. 29(*b*) shows an example of the second specific circuitry layout of the write circuit 105 of FIG. 27, in the case where the current limit circuit 105*b* including the P-type MOS transistor is provided on the side of the second LR drive circuit 105*c*2.

Figure 28:
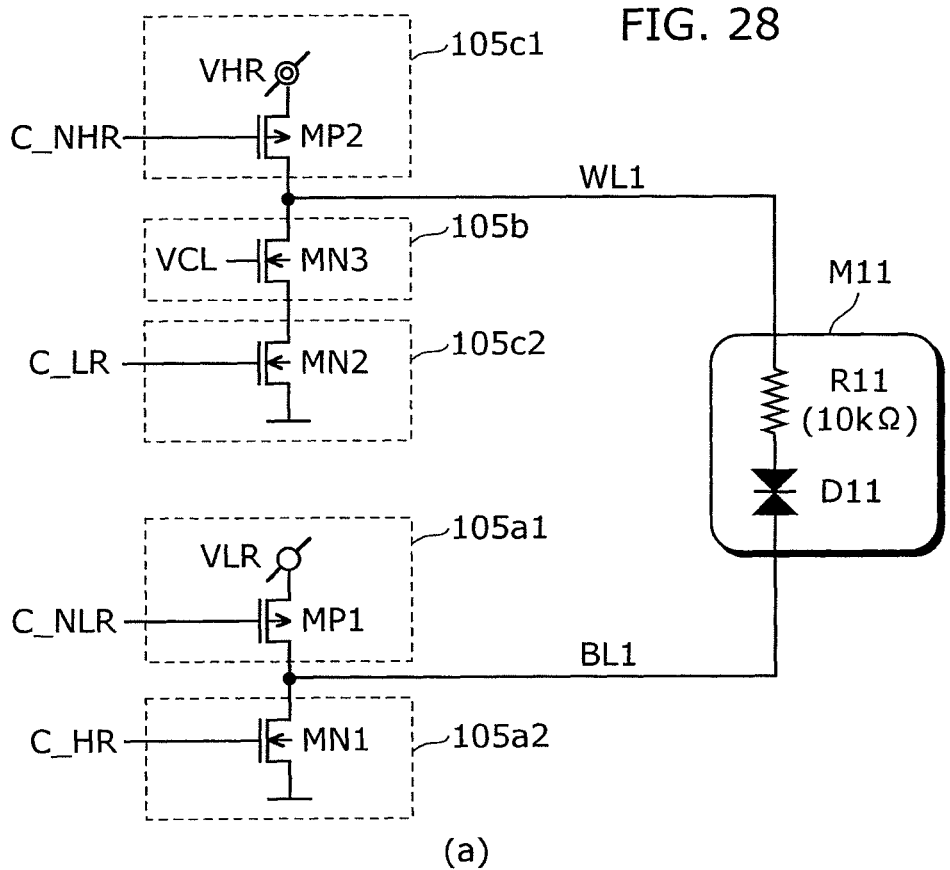
[FIG. 28]
Figure 28:
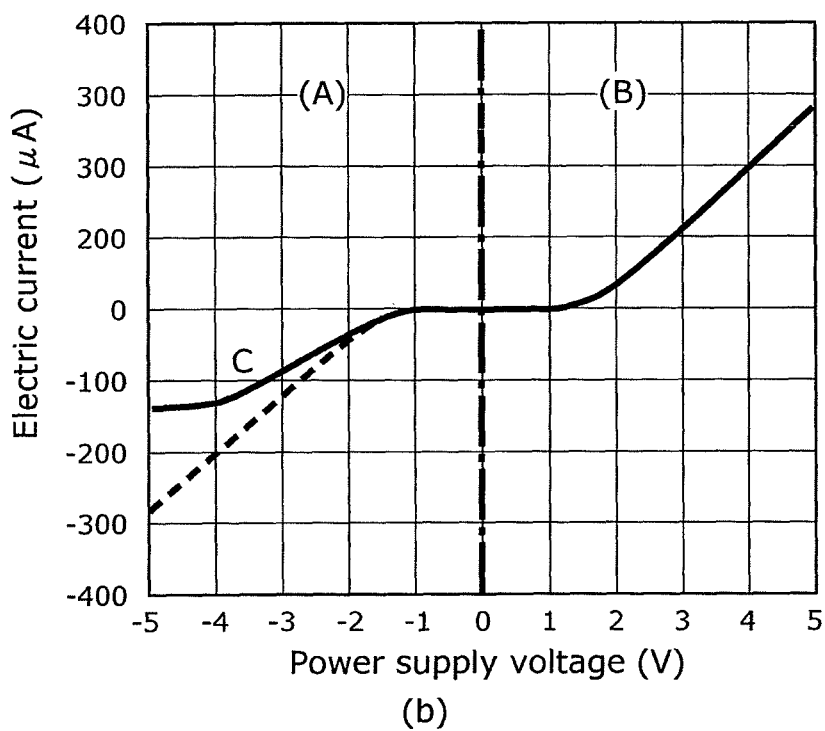

In the case of FIG. 29(*a*), the setting of the P-type MOS transistor in the current limit circuit 105*b* can be determined in the same manner as the case of FIG. 28 in which the current limit circuit 105*b* includes the N-type MOS transistor. In FIG. 29(*a*), the voltage at the inflection point C of the current limit circuit 105*b* is approximate to VCL+Vth_MP3 where Vth_MP3 (Vth_MP3 is positive) represents a threshold voltage of the P-type MOS transistor MP3 in the current limit circuit 105*b*, VCL represents a gate voltage of the P-type MOS transistor MP3 in the current limit circuit 105*b*, VLR represents a voltage of the LR power supply voltage, and VL represents a voltage applied to the memory cell. When the voltage (VL=VLth) at the low resistance point of the memory cell is equal to the voltage (=VCL+Vth_MP3) at the inflection point C of this current limit circuit 105*b*, it is possible to set the memory cell in the supposed low resistance state at the inflection point C of the current limit circuit 105*b*. Therefore, VCL is set so as to satisfy the following:

$$VL = VLth = VCL + Vth\_MP3$$

That is, $$VCL = VLth - Vth\_MN3 \quad \text{(Expression 3)}$$

In this case, it is assumed that a voltage drop in the N-type MOS transistor MN2 is negligible. Furthermore, in this setting, a gate width and a gate length of the P-type MOS transistor MP3 in the current limit circuit 105*b* are adjusted so that the current IL at the point A can be supplied.

Moreover, when the current limit circuit 105*b* is made as a constant current circuit using a current mirror circuit or the like, instead of the P-type MOS transistor, and thus, the current is controlled to a constant level, it is possible to set the supposed resistance value with more accuracy.

With this setting, it is possible to set the resistance value in the low resistance state to a constant value in a stabilized manner, because the current is constant with a voltage over the inflection point C even when the low-resistance power supply voltage VLR is set to be relatively high in response to concerns about voltage fluctuation and speed degradation.

Figure 25:
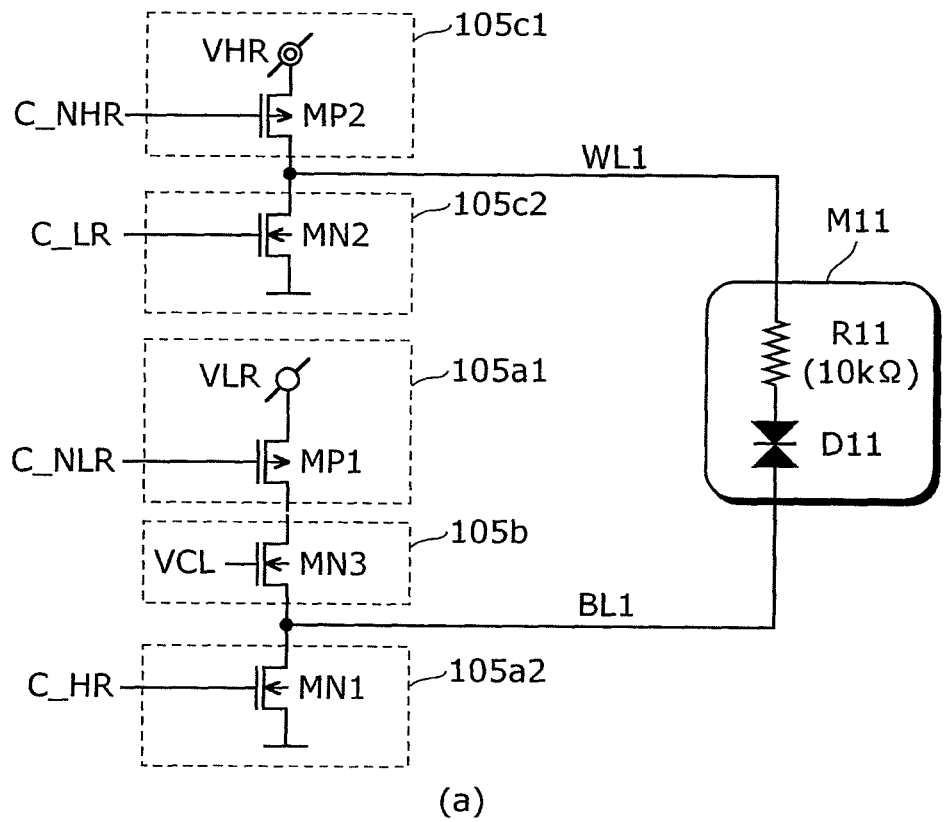
[FIG. 25]
Figure 25:
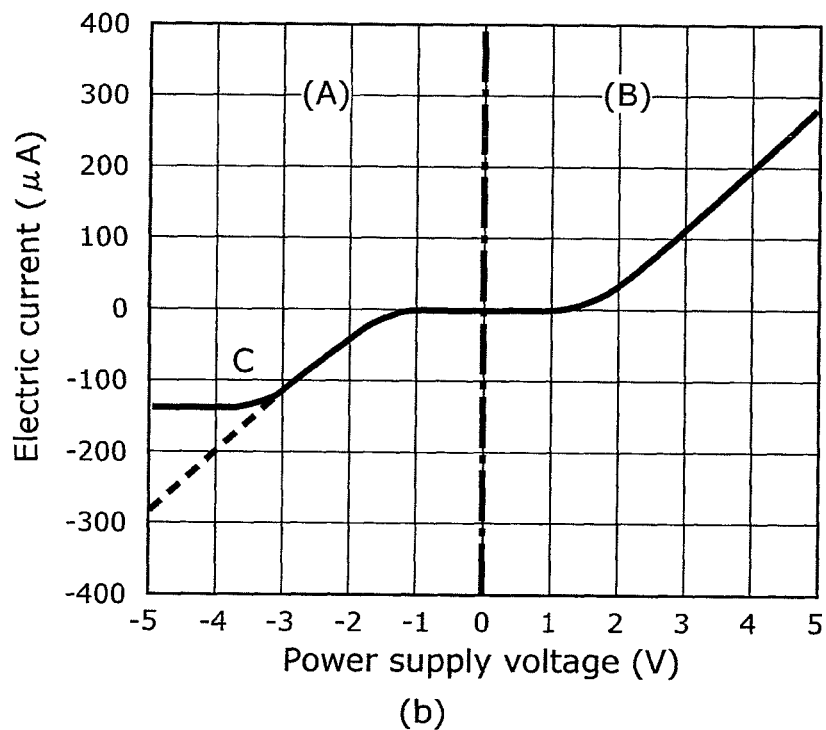

In the case of FIG. 29(*b*), the setting can be determined in the same manner as the case of FIG. 25. That is, in FIG. 29(*b*), the voltage at the inflection point C of the current limit circuit 105*b* is approximate to VCL+Vth_MP3+VL when VCL ≧ 0 where Vth_MP3 represents a threshold voltage of the P-type MOS transistor MP3 in the current limit circuit 105*b*, VCL represents a gate voltage of the P-type MOS transistor MP3 in the current limit circuit 105*b*, VLR represents a voltage of the LR power supply voltage, VL represents a voltage applied to the memory cell, and VL=VLth represents a voltage at the low resistance point of the memory cell. By setting VCL so as to satisfy the following:

$$VLR = VCL + Vth\_MP3 + VL = VCL + Vth\_MN3 + VLth-$$

and VCL ≧ 0

That is, $$VCL = VLR - VLth - Vth\_MP3 \text{ and } VCL \geq 0 \quad \text{(Expression 4)}$$

so that the voltage at the inflection point C is equal to the voltage VLR (=VCL+Vth_MP3+VL) of the LR power supply, it is possible to decrease the resistance of the memory cell at the inflection point C of the current limit circuit 105*b*, that is, to set the memory cell in the supposed low resistance state, when VLR is given as a voltage of the LR power supply. In this case, it is assumed that a voltage drop in the P-type MOS transistor MP2 is negligible. Furthermore, in this setting, a gate width and a gate length of the P-type MOS transistor MP3 in the current limit circuit 105*b* are adjusted so that the current IL at the point A of FIG. 24 can be supplied. A of FIG. 24 can be supplied With this setting, it is possible to set the resistance value in the low resistance state to a constant value in a stabilized manner, because the current is constant with a voltage over the inflection point C even when the low-resistance power supply voltage VLR is set to be relatively high in response to concerns about voltage fluctuation and speed degradation.

[Third Variation of Variable Resistance Nonvolatile Memory Device According to First Embodiment of the Present Invention]

Figure 30:
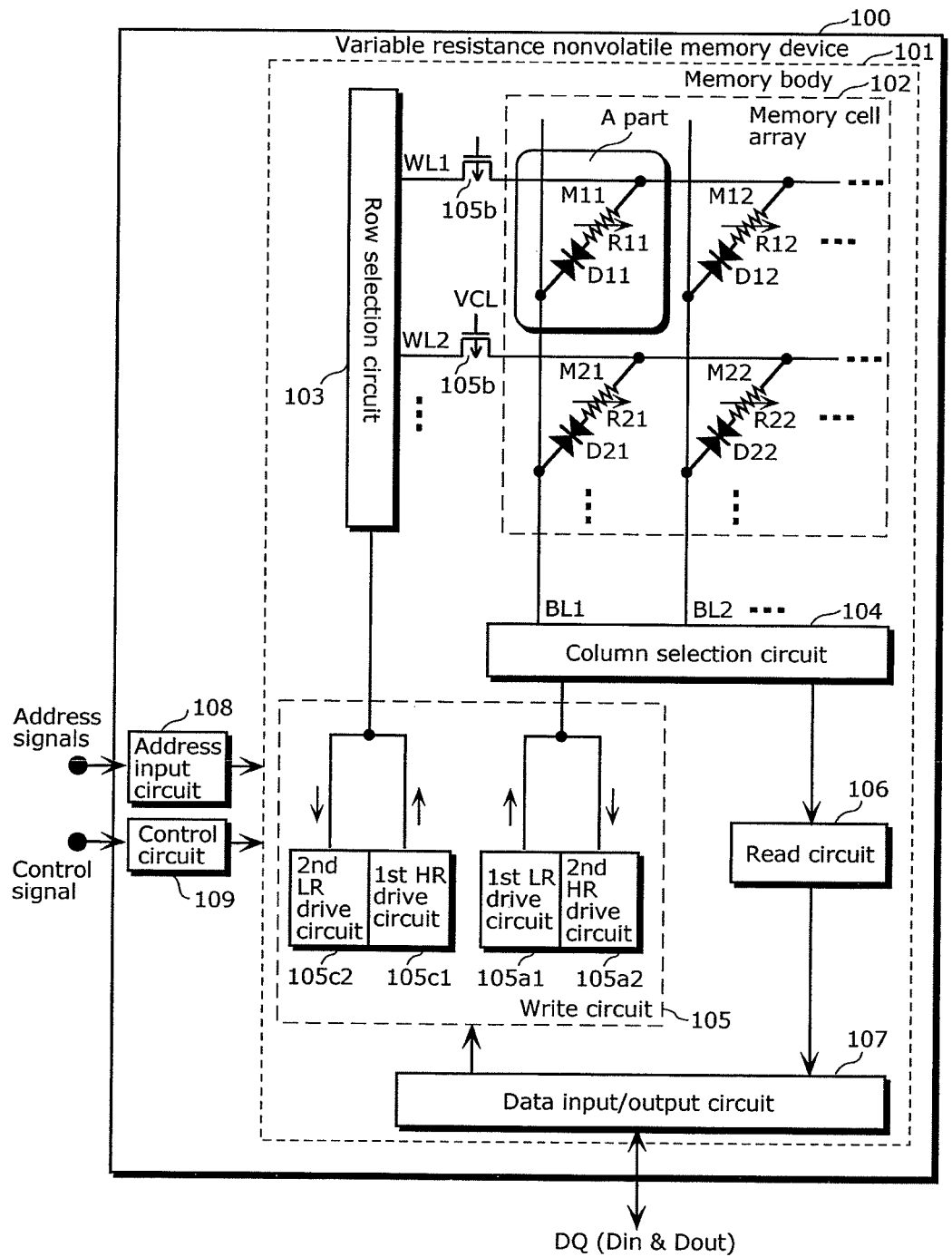
[FIG. 30]

FIG. 30 shows an implementation example which is different from FIG. 21, in which the current limit circuit 105*b* includes the P-type MOS transistor, and it is characteristic that the current limit circuit 105*b* is positioned between the second electrode of the variable resistance element and the write circuit. In FIG. 30, the current limit circuit 105*b* is positioned close to the memory cell array, which makes it possible to limit the current at a position closer to the memory cell as compared to the case of FIG. 27. As a result, upon resistance-decreasing writing, the load for charging and discharging via the current limit circuit 105*b* can be smaller, and the current can be limited according to the change of the memory cell toward the low resistance state, which allow for more accurate setting of the supposed resistance value.

When the second LR drive circuit 105*c*2 performs writing, the current limit circuit 105*b* becomes a source follower and thus exhibits constant-current characteristics, thereby being capable of setting the resistance value in the low resistance state to a constant value in a stabilized manner, and when the first HR drive circuit 105*c*1 performs writing, the current limit circuit 105*b* does not become the source follower and therefore is capable of supplying a larger amount of current than the case of decreasing the resistance.

The row selection circuit 103 generally includes a P-type MOS transistor, an N-type MOS transistor, and a decoder circuit, and one bit line corresponding to a selected memory cell is selected. As including only the P-type MOS transistor, the row selection circuit 103 becomes a source follower when the second LR drive circuit 105c2 performs writing, which means that the row selection circuit 103 can be provided with not only a function of selecting a column but also a function of limiting the current. In this case, it is no longer necessary to provide the current limit circuit 105b, allowing for a reduction in area.

In the above, the threshold voltage of the P-type MOS transistor MP3 of FIG. 29 is set at Vth_MN3, which indicates the threshold voltage in the state where the source voltage is lower than the substrate voltage, that is, in the state where the substrate bias effect is obtained. Setting not only VCL but also the threshold voltage Vth_MN3 to be lower than another transistor, so as to satisfy the relations of (Expression 3) and (Expression 4) is effective for a reduction in operating voltage.

In the case where the current limit circuit is provided as shown in FIGS. 25, 28 and 29, it is possible to limit the current more simply and easily by appropriately selecting, upon designing the circuit, a size of the MOS transistor included in the current limit circuit.

Specifically, the current capability of the drive circuit for increasing resistance of the variable resistance element is defined by a smaller one of W2/L2 and W4/L4, where W2 represents a gate width of the P-type MOS transistor included in the first HR drive circuit 105c1, L2 represents a gate length of the P-type MOS transistor included in the first HR drive circuit 105c1, W4 represents a gate width of the N-type MOS transistor included in the second HR drive circuit 105a2, and L4 represents a gate length of the N-type MOS transistor included in the second HR drive circuit 105a2.

The current capability of the current limit circuit is defined by WC/LC where WC and LC represent a gate width and a gate length, respectively, of the MOS transistor included in the current limit circuit 105b which is used to decrease the resistance of the variable resistance element, and by designing the transistor of the current limit circuit to have such a size that the current capability of the current limit circuit is smaller than the current capability of the drive circuit for increasing resistance of the variable resistance element, that is, so as to satisfy $$W2/L2 > WC/LC \text{ and } W4/L4 > WC/LC \quad \text{(Expression 5)},$$

the current capability of the drive circuit for decreasing resistance of the variable resistance element can be smaller than the current capability of the drive circuit for increasing variable resistance element.

Furthermore, needless to say, it is possible to set a resistance value of the variable resistance element with more accuracy by designing the MOS transistor included in the current limit circuit so as to have a size satisfying (Expression 5), and in addition, by controlling a gate voltage of the MOS transistor included in the current limit circuit 105b so that the current capacity of the drive circuit for decreasing resistance is smaller than the current capacity of the drive circuit for increasing resistance.

Next, a behavior example, in a write cycle, of the variable resistance nonvolatile memory device 100 according to the first embodiment in the case where data is written in the device is described with reference to the timing chart shown in FIG. 31.

FIGS. 31(a) and 31(b) are timing charts showing a behavior example of the nonvolatile memory device according to the first embodiment of the present invention. FIG. 31(a) shows the case where data "0", i.e., low resistance (LR) state, is written, and FIG. 31(b) shows the case where data "1", i.e., high resistance (HR), is written.

The following describes only the case where the memory cell M11 is selected and the writing and reading of data are performed. When M11 is a selected cell, M12 is a non-selected cell with a selected voltage in the word line and a non-selected voltage in the bit line, M21 is a non-selected cell with a non-selected voltage in the word line and a selected voltage in the bit line, and M22 is a non-selected cell with non-selected voltages in both of the word line and the bit line.

FIGS. 31(a) and 31(b) show also current which flows to the non-selected cells M12, M21 and M22 according to current flowing to the selected M11. In the current waveform, the current flowing in the direction from the word line to the bit line, that is, in the direction from the second electrode to the first electrode of the variable resistance element has positive polarity.

Figure 31:
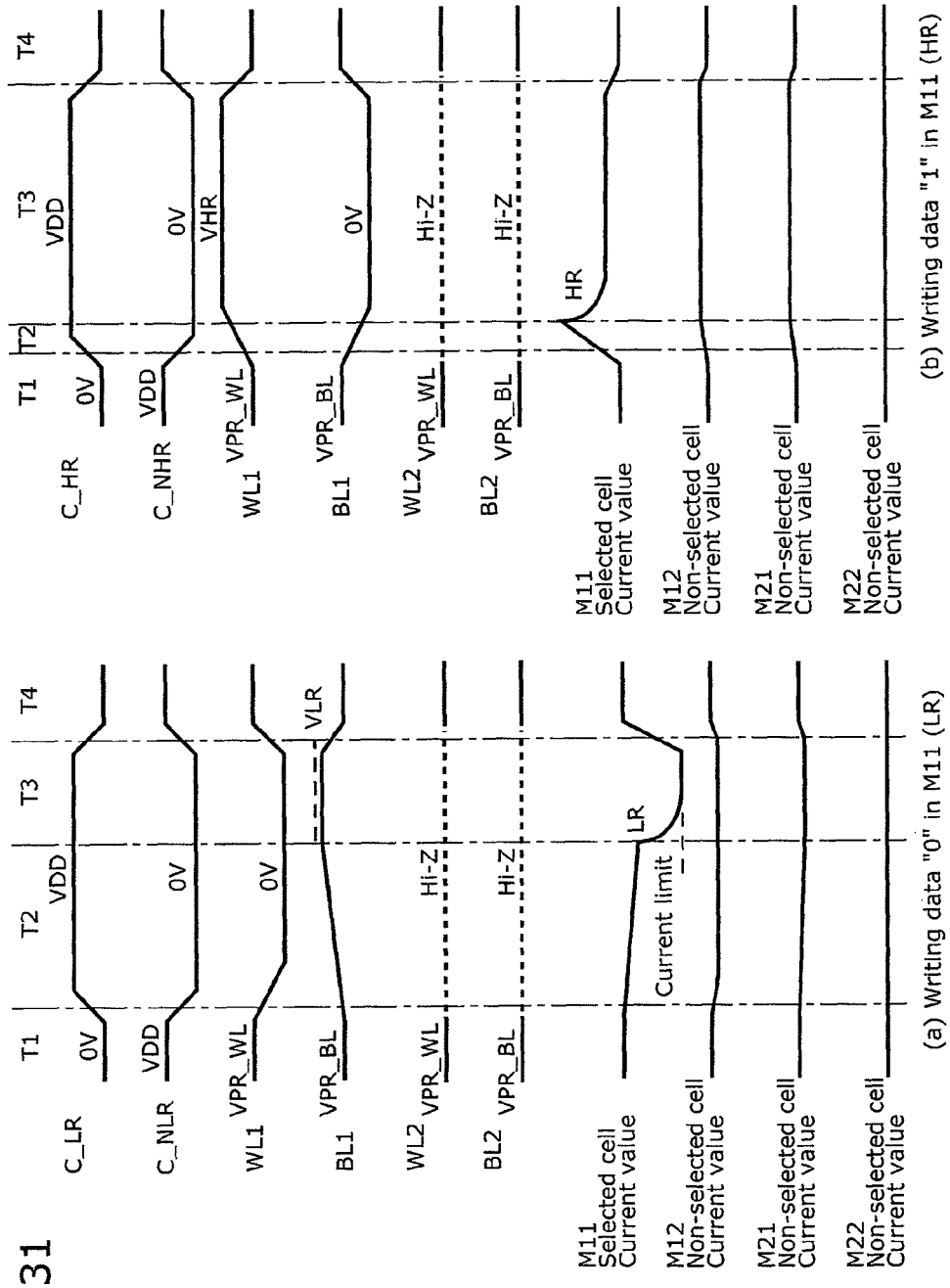
[FIG. 31]
FIGS. 31(a) and 31(b) each show behavior timing of the variable resistance nonvolatile memory device according to the first embodiment of the present invention.

The following describes the behavior divided into periods T1 to T4, with reference to FIGS. 31(a) and 31(b). In FIG. 31, VDD corresponds to the power supply voltage supplied to the variable resistance nonvolatile memory device 100.

In the cycle of writing data "0" in the memory cell M11 shown in FIG. 31(a), all the word lines (WL1 and WL2) are previously charged to voltage VPR_WL, and all the bit line (BL1 and BL2) are previously charged to voltage VPR_BL. The voltage previously charged is voltage approximately intermediate of the maximum amplitude of each of the word lines and the bit lines.

The period T2 following the period T1 is a period in which the variable resistance element R11 is still in the high resistance state, and the row selection circuit 103 selects the word line WL1 and the column selection circuit 104 selects the bit line BL1, and the selected bit line BL1 is driven to VLR with use of the first LR drive circuit 105a1 and the selected word line WL1 is driven to 0 V with use of the second LR drive circuit 105c2. Over time, the voltage of BL1 increases and the voltage of WL1 decreases, and while the voltage of the word line WL1 drops in a relatively high speed, the voltage of the bit line BL1 which is driven via the current limit circuit 105b increases gradually. The voltage of the bit line BL1 does not increase to VLR because the current limit circuit 105b is placed.

The period T3 is a period in which writing or a change in resistance occurs, causing a change to the low resistance state. In the period T3, the value of current flowing to the selected cell M11 increases, and the writing is performed from the high resistance value to the low so resistance value at a point of application, to the variable resistance element R11 (213 in FIG. 22), of a voltage having such an absolute value that the first electrode 207 has a low resistance voltage VLth of the variable resistance element with respect to the second electrode 209. As the resistance decreases, the current flowing to the memory cell M11 increases, but the value of current will not increase over a certain value because of the current limit circuit 105b. The decrease in resistance therefore stops with the certain resistance value. In FIG. 31(a), the downward direction indicates an increase in the current.

After that, in the period T4, the selection of the word line and the bit line was released, and all the word lines are previously charged to voltage VPR_WL while all the bit lines are previously charged to voltage VPR_BL, thus completing the writing of the data "0".

In the cycle of writing the data "1" in the memory cell M11 shown in FIG. 31(b), all the word lines are previously charged to voltage VPR_WL while all the bit lines are previously charged to voltage VPR_BL in the period T1. The voltage previously charged is voltage approximately intermediate of the maximum amplitude of each of the word lines and the bit lines.

The period T2 following the period T1 is a period in which the variable resistance element R11 is still in the low resistance state, and the row selection circuit 103 selects the word line WL1 and the column selection circuit 104 selects the bit line BL1, and the selected word line WL1 is driven to VHR with use of the first HR drive circuit 105c1 and the selected bit line BL1 is driven to 0 V with use of the second HR drive circuit 105a2. Over time, the voltage of WL1 increases and the voltage of BL1 decreases, and because of no current limit circuit placed, the voltage of both the word line WL1 and the bit line BL1 changes in relatively high speed.

The period T3 is a period in which writing or a change in resistance occurs, causing a change to the high resistance state. In the period T3, the value of current flowing to the selected cell M11 increases, and the writing is performed from the low resistance value to the high resistance value at a point of application, to the variable resistance element R11 (213 in FIG. 22), of a voltage having such an absolute value that the second electrode 209 has a high resistance voltage VHth of the variable resistance element with respect to the first electrode 207.

After that, in the period T4, the selection of the word line and the bit line was released, and all the word lines are previously charged to voltage VPR_WL while all the bit lines are previously charged to VPR_BL, thus completing the writing of the data "1".

It is to be noted that the structure of the memory cell Mij is not limited to the structure shown in FIG. 22 and may be one as follows which exhibits the B mode characteristics.

FIGS. 32(a) to 32(d) all show development examples of a memory cell operating in the B mode, each of which has a structure holding a variable resistance layer between an upper electrode and a lower electrode as in the case of FIG. 22 and in each of which the electrodes contains mutually different materials and the material of the upper electrode has a higher standard electrode potential than that of the lower electrode.

FIG. 32(a) shows a memory cell in which the variable resistance element 213 and the current steering element 212 are provided in contact without the second via 206.

As compared to FIG. 32(a), FIG. 32(b) shows a memory cell in which the fourth electrode 205 comprising TaN of the current steering element 212 and the first electrode comprising TaN of the variable resistance element 213 are shared. This memory cell is easy to manufacture because of the shared electrode.

FIG. 32(c) shows a memory cell in which the variable resistance element 213 and the current steering element 212 each have the same diameter as the second via 206. With the same diameter as the second via 206, this memory cell can be disposed in the minimum interval of lines, allowing for a reduction in area. This memory cell is one example in which a size of section (including the above diameter as an example), orthogonal to the stacking direction, of the variable resistance element 213 and the current steering element 212 is set to be equal to or smaller than that of the via.

As compared to FIG. 32(c), FIG. 32(d) shows a memory cell in which the second-layer line 211 contains Pt so that the second-layer line is used as the second electrode of the variable resistance element 213, and the first-layer line 201 contains TaN so that the first-layer line is used as the third electrode of the current steering element 212. In this case, it is no longer necessary to provide the second electrode of the variable resistance element 213 and the third electrode of the current steering element 212, which allows for a reduction in area. While FIG. 32(d) shows an example in which both of the second-layer line 211 and the first-layer line 201 are shared by respective ends of the memory cell, it may also be possible that only one of these is shared.

While the above describes configuration examples in which the current steering element 212, the variable resistance element 213, and the second-layer line 211 are positioned in this order on the first-layer line 201, it may also be possible in the cases of FIGS. 22, 32(a), 32(c), and 32(d) that the variable resistance element 213, the current steering element 212, and the second-layer line 211 are positioned in this order on the first-layer line 201. In such a configuration, the first electrode 207, the variable resistance layer 208, and the second electrode 209, of the variable resistance element 213, and the third electrode 203, the current steering layer 204, and the fourth electrode 205, of the current steering element 212, and the second-layer line 211 are formed in this order on the first-layer line 201.

Figure 33:
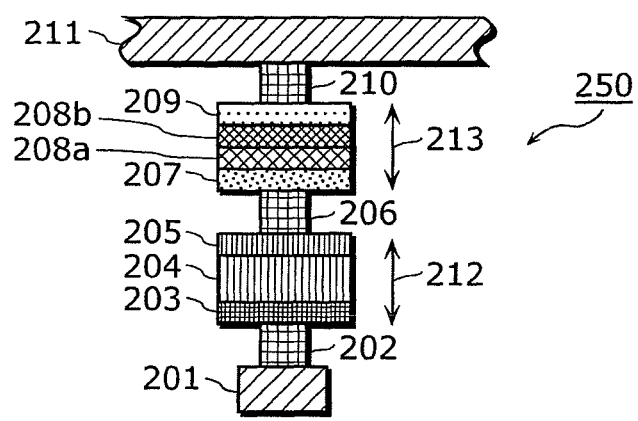
[FIG. 33]

FIG. 33 shows one example of a memory cell 250 which operates in the B mode with another structure. Parts common with FIG. 22 have the same numeric identifiers.

As shown in FIG. 33, the memory cell 250 includes, in this order, the first-layer line 201 comprising aluminum (Al), the first via 202, the third electrode 203 comprising tantalum nitride (TaN) in the current steering element, the current steering layer 204 comprising nitrogen-deficient silicon nitride, the fourth electrode 205 comprising tantalum nitride (TaN) in the current steering element, the second via 206, the first electrode 207 comprising platinum (Pt) in the variable resistance element, the first tantalum oxide layer 208a having a low oxygen content atomic percentage, the second tantalum oxide layer 208b having a high oxygen content atomic percentage, the second electrode 209 comprising platinum (Pt) in the variable resistance element, the third via 210, and the second-layer line 211 comprising aluminum (Al), and is characterized in that the second tantalum oxide layer 208b is formed in contact with the second electrode 209 that is the upper electrode of the variable resistance element.

In this configuration, as disclosed in the related application of the present invention cited in the basic data for the present invention, a change in resistance occurs in the vicinity of the interface between the second electrode 209 that is the upper electrode and the second tantalum oxide layer 208b, and this behavior corresponds to the B mode.

As the first-layer line 201 of FIG. 33 corresponds to the bit line BL1 and the second-layer line 211 of FIG. 33 corresponds to the word line WL1, the variable resistance element 213 changes to the low resistance state when a voltage of the first-layer line 201 relative to a voltage of the second-layer line 211 becomes a predetermined voltage VLth or higher, and the variable resistance element 213 changes to the high resistance state when a voltage of the second-layer line 211 relative to a voltage of the first-layer line 201 becomes a predetermined voltage VHth or higher.

FIGS. 34(a) to 34(c) all show the other examples of a memory cell operating in the B mode, each of which has a structure holding a variable resistance layer between an upper electrode and a lower electrode as in the case of FIG. 33 and in each of which the second tantalum oxide layer having a high oxygen content atomic percentage is provided in contact with the upper electrode.

FIG. 34(a) shows a memory cell in which the variable resistance element 213 and the current steering element 212 are provided in contact without the second via 206.

FIG. 34(b) shows a memory cell in which the variable resistance element 213 and the current steering element 212 each have the same diameter as the second via 206. With the same diameter as the second via 206, this memory cell can be disposed in the minimum interval of lines, allowing for a reduction in area. This memory cell is one example in which a size of section (including the above diameter as an example), orthogonal to the stacking direction, of the variable resistance element 213 and the current steering element 212 is set to be equal to or smaller than that of the via.

Figure 34:
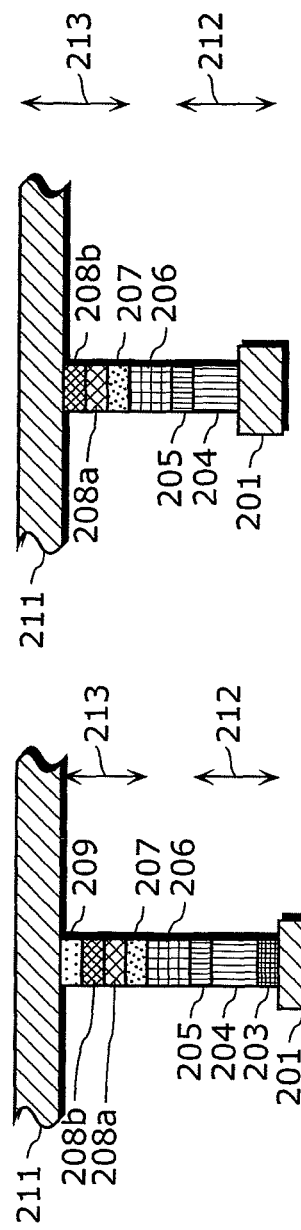
[FIG. 34]

As compared to FIG. 34(*b*), FIG. 34(*c*) shows a memory cell in which the second-layer line 211 contains Pt so that the second-layer line is used as the second electrode of the variable resistance element 213, and the first-layer line 201 contains TaN so that the first-layer line is used as the third electrode of the current steering element 212. In this case, it is no longer necessary to provide the second electrode of the variable resistance element 213 and the third electrode of the current steering element 212, which allows for a reduction in area. While FIG. 34(*c*) shows an example in which both of the second-layer line 211 and the first-layer line 201 are shared by respective ends of the memory cell, it may also be possible that only one of these is shared.

While the above describes configuration examples in which the current steering element 212, the variable resistance element 213, and the second-layer line 211 are positioned in this order on the first-layer line 201, it may also be possible in the cases of FIGS. 22, 32, 33 and 34 that the variable resistance element 213, the current steering element 212, and the second-layer line 211 are positioned in this order on the first-layer line 201. In such a configuration, the first electrode 207, the variable resistance layer 208, and the second electrode 209, of the variable resistance element 213, and the third electrode 203, the current steering layer 204, and the fourth electrode 205, of the current steering element 212, and the second-layer line 211 are formed in this order on the first-layer line 201.

Figure 32:
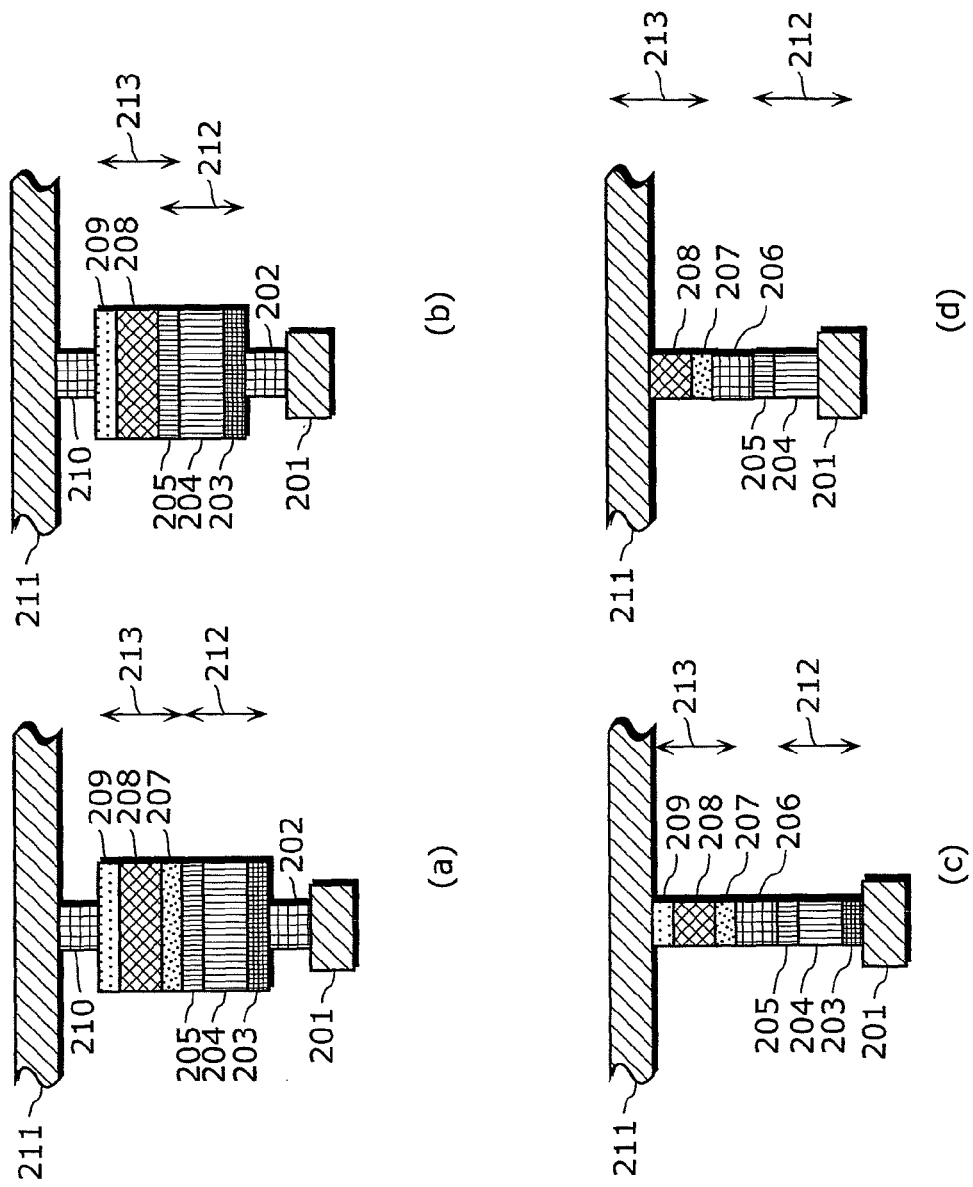
[FIG. 32]

Needless to say, it is also possible to provide a configuration which combines different electrodes and a tantalum oxide layer having a different concentration, such as a configuration in which the upper electrode contains a material having a higher standard electrode potential, like the electrode configuration of FIGS. 22 and 32(*a*) to 32(*d*), and the second tantalum oxide layer having a high oxygen content atomic percentage shown in FIGS. 33 and 34(*a*) to 34(*c*) is provided in contact with the upper electrode.

Furthermore, the third electrode 203 or the third electrode 203 and the current steering layer 204 may be formed in the same wiring pattern on the first-layer line 201. The second electrode 209 may also be formed in the same wiring pattern under the second-layer line 211.

[Variable Resistance Nonvolatile Memory Device According to Second Embodiment of the Present Invention]

Next, as the second embodiment of the present invention, a variable resistance nonvolatile memory device different from that in the first embodiment is described. The second embodiment is an embodiment which is different from the first embodiment in that the memory cell is in the A mode, and descriptions on circuits and operations which are the same as those in the first embodiment will be omitted accordingly.

Figure 35:
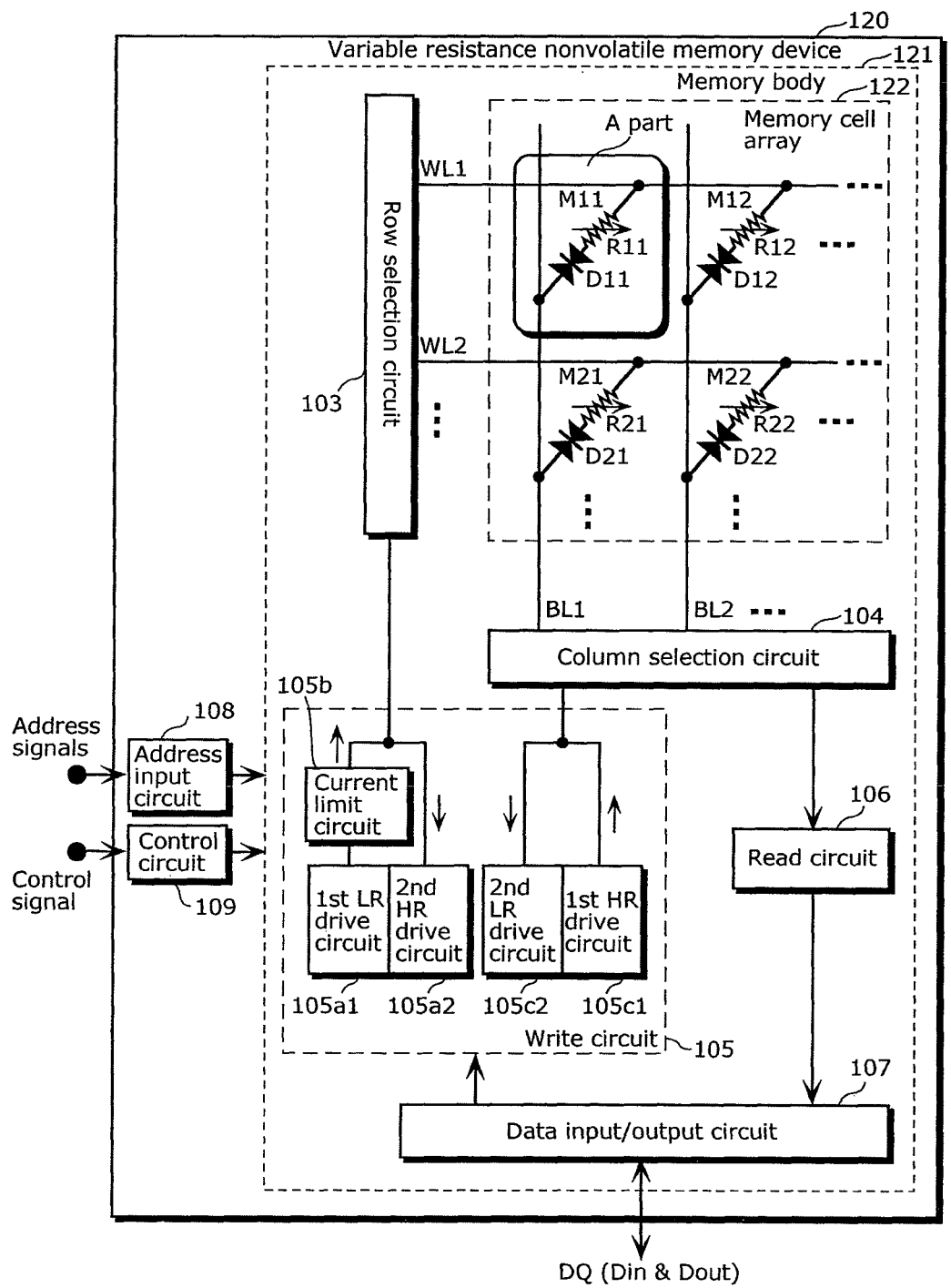
[FIG. 35]

FIG. 35 is a block diagram showing a configuration of the variable resistance nonvolatile memory device according to the second embodiment of the present invention. It shows, as the second embodiment, a configuration of a memory cell that operates in the A mode in which the variable resistance phenomenon occurs presumably in the vicinity of the lower electrode, and an optimum control circuit for the configuration.

In FIG. 35, a variable resistance nonvolatile memory device 120 includes a memory body 121 on a semiconductor substrate, and the memory body 121 includes a memory cell array 122, a row selection circuit 103, a column selection circuit 104, a write circuit 105, a read circuit 106 which detects an amount of current flowing to a selected bit line and determines whether stored data is "1" or "0", and a data input/output circuit 107 which inputs/outputs data via a terminal DQ.

An operation of the memory body 121 is controlled by output supplied thereto from an address input circuit 108 to which address signals are input from outside of the variable resistance nonvolatile memory device 120 and which selects and indicates a predetermined address, and a control circuit 109 to which a control signal is input.

The memory cell array 122 includes memory cells Mij (i and j are natural numbers satisfying i≦M and j≦N. The same applies to descriptions below.) arranged in M rows and N columns (M and N are natural numbers, and only four bits of 2 rows×2 columns are shown in FIG. 35.). In the memory cell Mij, one terminal of a variable resistance element Rij and one terminal of a current steering element Dij having both positive and negative threshold voltages are connected to each other in series. The other terminal of the variable resistance element Rij is connected to a bit line BLj, and the other terminal of the current steering element Dij is connected to a word line WLi.

In the present configuration, the bit lines BLj are composed of lines in a lower layer and arranged in the vertical direction of the sheet of drawing, and the word lines WLi are composed of lines in an upper layer and arranged in the horizontal direction of the sheet of drawing. The variable resistance element Rij is configured so as to have characteristics of the A mode in which the variable resistance phenomenon occurs in the vicinity of the lower electrode of the variable resistance element.

The word lines WLi are connected to the row selection circuit 103, and in a read or write mode, one row is selected.

The bit lines BLj are connected to the column selection circuit 104, and in a read or write mode, one column is selected.

In the write mode, the data input/output circuit 107 writes data in the variable resistance element Rij of the selected memory cell Mij so as to increase or decrease resistance, according to a write instruction of the data "0" or the data "1" of the data input signal Din. In the present embodiment, writing the data "0" corresponds to resistance-decreasing writing while writing the data "1" corresponds to resistance-increasing writing.

The write circuit 105 is connected to the data input/output circuit 107 and includes: the first LR drive circuit 105*a*1 for high voltage level driving in the writing of the data "0", i.e., the resistance-decreasing writing; a current limit circuit 105*b* to which an output of the first LR drive circuit 105*a*1 is input; and the second LR drive circuit 105*c*2 for low voltage level driving in the writing of the data "0", i.e., the resistance-decreasing writing. The write circuit 105 further includes: the first HR drive circuit 105*c*1 for driving at high voltage level in the writing of the data "1", i.e., the resistance-increasing writing; and the second HR drive circuit 105*a*2 for driving at low voltage level in the writing of the data "1", i.e., the resistance-increasing writing.

Upon resistance-decreasing writing, a signal having current limited by the current limit circuit 105*b* is provided to the selection word line WLj via the row selection circuit 103. On the other hand, upon resistance-increasing writing, the first HR drive circuit 105*c*1 having no current limiting function provides a signal to the selected bit line BLi via the column selection circuit 104, which is one of the features.

In the variable resistance nonvolatile memory device 120 thus configured, the word line WLi and the bit line BLj are an example of the first signal line and the second signal line, respectively, according to an implementation of the present invention. The first LR drive circuit 105a1, the first HR drive circuit 105c1, the second LR drive circuit 105c2, and the second HR drive circuit 105a2 are an example of the first drive circuit, the second drive circuit, the third drive circuit, and the fourth drive circuit, respectively, according to an implementation of the present invention. The current limit circuit 105b is an example of the current limit circuit according to an implementation of the present invention. The row selection circuit 103 and the column selection circuit 104 are an example of the first selection circuit and the second selection circuit according to an implementation of the present invention.

Figure 36:
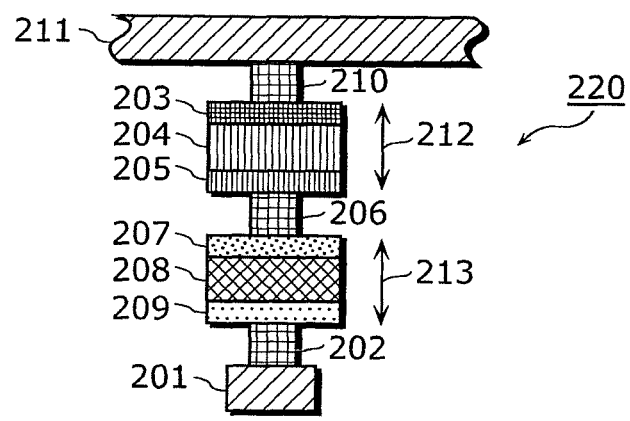
[FIG. 36]

FIG. 36 is a cross-sectional diagram showing a configuration of a memory cell M11 shown as an A part in FIG. 35.

A current steering element 212 and a variable resistance element 213 correspond respectively to a current steering element D11 and a variable resistance element R11 shown in FIG. 35.

As shown in FIG. 36, the memory cell 220 includes, in the following order: a first-layer line 201 comprising aluminum (Al); a first via 202; a second electrode 209 comprising platinum (Pt), a variable resistance layer 208 comprising oxygen-deficient tantalum oxide, and a first electrode 207 comprising tantalum nitride (TaN) in the variable resistance element; a second via 206; a fourth electrode 205 comprising tantalum nitride (TaN), a current steering layer 204 comprising nitrogen-deficient silicon nitride, and a third electrode 203 comprising TaN in the current steering element; a third via 210; and a second-layer line 211 comprising aluminum (Al), and the first electrode 207 and the second electrode 209 in the variable resistance element contain different materials.

As another feature, the second electrode 209 located in a lower layer and connected on the side of the bit line BLi contains Pt having a higher standard electrode potential than the first electrode 207 connected on the side of the word line WLj.

In the structure of this memory cell, as described above in the basic data of the present invention, the change in resistance occurs in the vicinity of the interface between the variable resistance layer 208 and the second electrode comprising Pt having a higher standard electrode potential than TaN comprised in the first electrode, and this behavior corresponds to the A mode.

As the first-layer line 201 of FIG. 36 corresponds to the bit line BL1 and the second-layer line 211 of FIG. 36 corresponds to the word line WL1, the variable resistance element 213 changes to the low resistance state when a voltage of the second-layer line 211 relative to a voltage of the first-layer line 201 becomes a predetermined voltage VLth or higher, and the variable resistance element 213 changes to the high resistance state when a voltage of the first-layer line 201 relative to a voltage of the second-layer line 211 becomes a predetermined voltage VHth or higher.

The specific circuitry layout of the write circuit 105 is the same as that shown in FIG. 23.

In the write mode, when an instruction is issued to write the data "0", that is, when the resistance-decreasing writing is instructed, C_NLR is set at low voltage level and C_LR is set at high voltage level so that the P-type MOS transistor MP1 of the first LR drive circuit 105a1 and the N-type MOS transistor MN2 of the second LR drive circuit 105c2 turn on, which form a current path for a current output from the first LR drive circuit 105a1, to flow into the second LR drive circuit 105c2 by way of a main path including the word line WLi, the memory cell Mij, and the bit line BLj.

As to the output of the current limit circuit 105b, the current is limited by the N-type MOS transistor MN3, and the output voltage VLR_O has an upper limit determined by VCL−Vth_MN3 where Vth_MN3 represents a threshold voltage of MN3. The current limit circuit 105b has the source follower characteristics as well and therefore operates as a constant power supply when the resistance-decreasing writing power supply voltage VLR is set to a predetermined level or higher.

In the write mode, when an instruction is issued to write the data "1", that is, when the resistance-increasing writing is instructed, C_NHR is set at low voltage level and C_HR is set at high voltage level so that the P-type MOS transistor MP2 of the first HR drive circuit 105a1 and the N-type MOS transistor MN1 of the second HR drive circuit 105a2 turn on, which form a current path for a current output from the first HR drive circuit 105c1, to flow into the second HR drive circuit 105a2 by way of a main path including the bit line BLj, the memory cell Mij, and the word line WLi. This current path includes no current limit circuit, with the result that the current increases monotonically as the resistance-increasing writing power-supply VHR increases.

[Operation of Variable Resistance Nonvolatile Memory Device According to Second Embodiment of the Present Invention]

An operation of the variable resistance nonvolatile memory device 120 configured as above is described.

The voltage-current relation observed when a voltage is applied to the memory cell M11 of FIG. 35 is the same as that in the first embodiment, that is, as shown in FIG. 24. In this case, however, the memory cell M11 (which is 220 in FIG. 36) operates in the A mode, which means that the polarity with which the first-layer line 201 has a high potential with respect to the second-layer line 211 in FIG. 36 is positive.

Characteristics of the write circuit 105 in the second embodiment are the same as those in the first embodiment, that is, as shown in FIG. 25, and the setting of the N-type MOS transistor MN3 in the current limit circuit 105b can be determined likewise from FIGS. 24 and 25, which therefore will not be described again.

In addition, as in the case of the first embodiment, the current limit circuit 105b may be provided on the side of the second LR drive circuit 105c2. Likewise, it may also be possible that the current limit circuit 105b is disposed between the first electrode of the variable resistance element and the write circuit 105, that the current limit circuit 105b includes a P-type MOS transistor, and that the current limit circuit 105b is disposed between the second electrode of the variable resistance element and the write circuit 105.

Next, a behavior example, in a write cycle, of the variable resistance nonvolatile memory device 120 according to the second embodiment in the case where data is written in the device is described with reference to the timing chart shown in FIG. 37.

FIGS. 37(a) and 37(b) are timing charts showing a behavior example of the nonvolatile memory device according to an embodiment of the present invention. FIG. 37(a) shows the case where data "0", i.e., low resistance state, is written, and FIG. 37(b) shows the case where data "1", i.e., high resistance, is written.

The following describes only the case where the memory cell M11 is selected and the writing and reading of data are performed. When M11 is a selected cell, M12 is a non-selected cell with a selected voltage in the word line and a non-selected voltage in the bit line, M21 is a non-selected cell with a non-selected voltage in the word line and a selected voltage in the bit line, and M22 is a non-selected cell with non-selected voltages in both of the word line and the bit line. FIGS. 37(a) and 37(b) show also current which flows to the non-selected cells M12, M21 and M22 according to current flowing to the selected M11. In the current waveform, the current flowing in the direction from the word line to the bit line, that is, in the direction from the first electrode to the second electrode of the variable resistance element has positive polarity.

Figure 37:
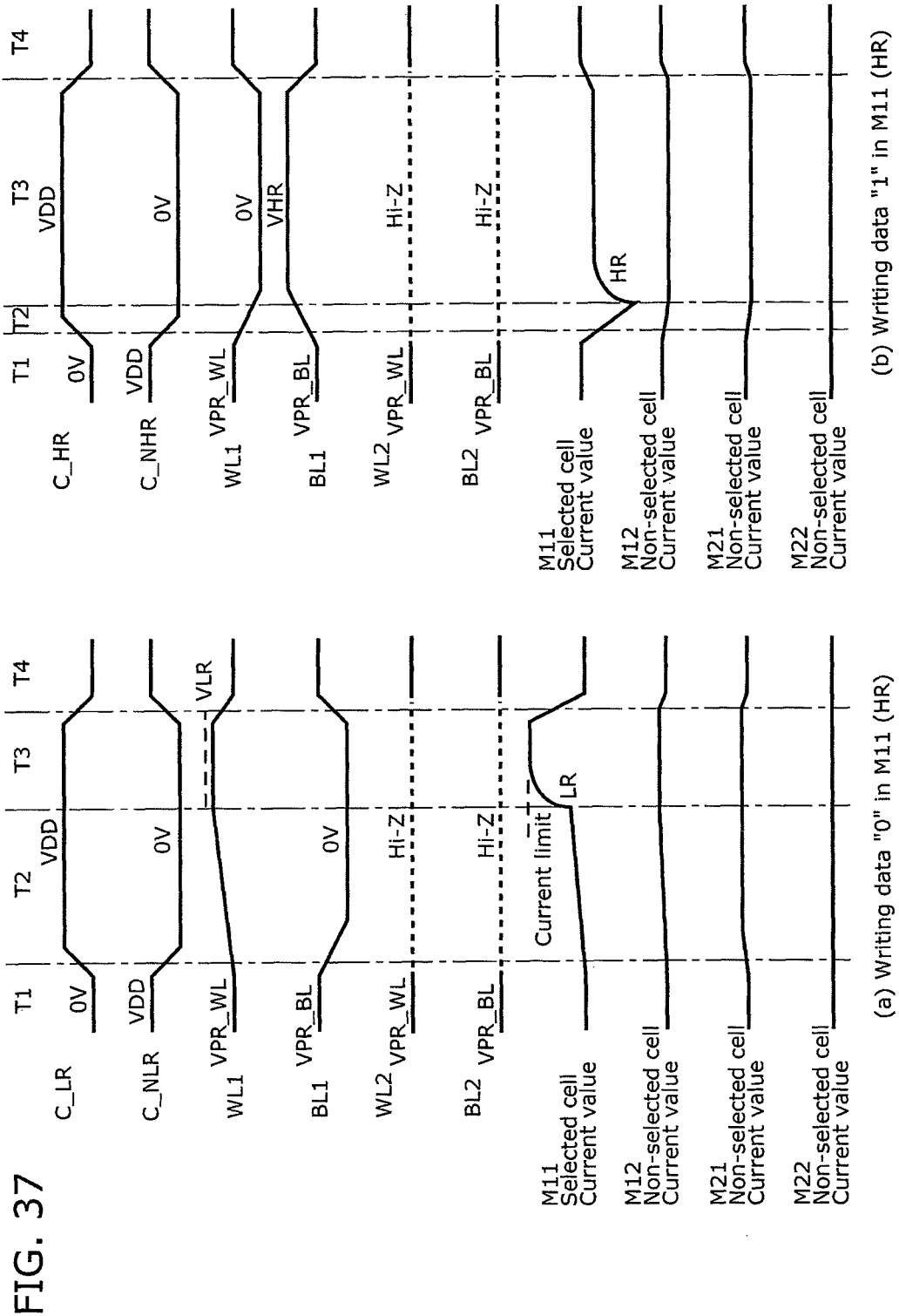
[FIG. 37]

The following describes the behavior divided into periods T1 to T4, with reference to FIG. 37. In FIG. 37, VDD corresponds to the power supply voltage supplied to the variable resistance nonvolatile memory device 120.

In the cycle of writing data "0" in the memory cell M11 shown in FIG. 37(a), all the word lines are previously charged to voltage VPR_WL, and all the bit line are previously charged to voltage VPR_BL. The voltage previously charged is voltage approximately intermediate of the maximum amplitude of each of the word lines and the bit lines.

The period T2 following the period T1 is a period in which the variable resistance element R11 is still in the high resistance state, and the row selection circuit 103 selects the word line WL1 and the column selection circuit 104 selects the bit line BL1, and the selected word line WL1 is driven to VLR with use of the first LR drive circuit 105a1 and the selected bit line BL1 is driven to 0 V with use of the second LR drive circuit 105c2. Over time, the voltage of WL1 increases and the voltage of BL1 decreases, and while the voltage of the bit line BL1 drops in a relatively high speed, the voltage of the word line WL1 which is driven via the current limit circuit 105b increases gradually.

The period T3 is a period in which writing or a change in resistance occurs, causing a change to the low resistance state. In the period T3, the value of current flowing to the selected cell M11 increases, and the writing is performed from the high resistance value to the low resistance value at a point of application, to the variable resistance element R11, of a voltage having such an absolute value that the first electrode 207 has a low resistance voltage VLth of the variable resistance element with respect to the second electrode 209. As the resistance decreases, the current flowing to the memory cell M11 increases, but the value of current will not increase over a certain value because of the current limit circuit 105b. The decrease in resistance therefore stops with the certain resistance value.

After that, in the period T4, the selection of the word line and the bit line was released, and all the word lines are previously charged to voltage VPR_WL while all the bit lines are previously charged to voltage VPR_BL, thus completing the writing of the data "0".

In the cycle of writing the data "1" in the memory cell M11 shown in FIG. 37(b), all the word lines are previously charged to voltage VPR_WL while all the bit lines are previously charged to voltage VPR_BL in the period Ti. The voltage previously charged is voltage approximately intermediate of the maximum amplitude of each of the word lines and the bit lines.

The period T2 following the period T1 is a period in which the variable resistance element R11 is still in the low resistance state, and the row selection circuit 103 selects the word line WL1 and the column selection circuit 104 selects the bit line BL1, and the selected bit line BL1 is driven to VHR with use of the first HR drive circuit 105c1 and the selected word line WL1 is driven to 0 V with use of the second HR drive circuit 105a2. Over time, the voltage of BL1 increases and the voltage of WL1 decreases, and because of no current limit circuit placed, the voltage of both the word line WL1 and the bit line BL1 changes in relatively high speed.

The period T3 is a period in which writing or a change in resistance occurs, causing a change to the high resistance state. In the period T3, the value of current flowing to the selected cell M11 increases, and the writing is performed from the low resistance value to the high resistance value at a point of application, to the variable resistance element R11, of a voltage having such an absolute value that the second electrode 209 has a high resistance voltage VHth of the variable resistance element with respect to the first electrode 207.

After that, in the period T4, the selection of the word line and the bit line was released, and all the word lines are previously charged to voltage VPR_WL while all the bit lines are previously charged to VPR_BL, thus completing the writing of the data "1".

It is to be noted that the structure of the memory cell Mij is not limited to the structure shown in FIG. 36 and may be one as follows which exhibits the A mode characteristics.

FIGS. 38(a) to 38(d) all show the other examples of a memory cell operating in the A mode, each of which has a structure holding a variable resistance layer between an upper electrode and a lower electrode as in the case of FIG. 36 and in each of which the electrodes contain mutually different materials and the material of the lower electrode has a higher standard electrode potential than that of the upper electrode.

Figure 38:
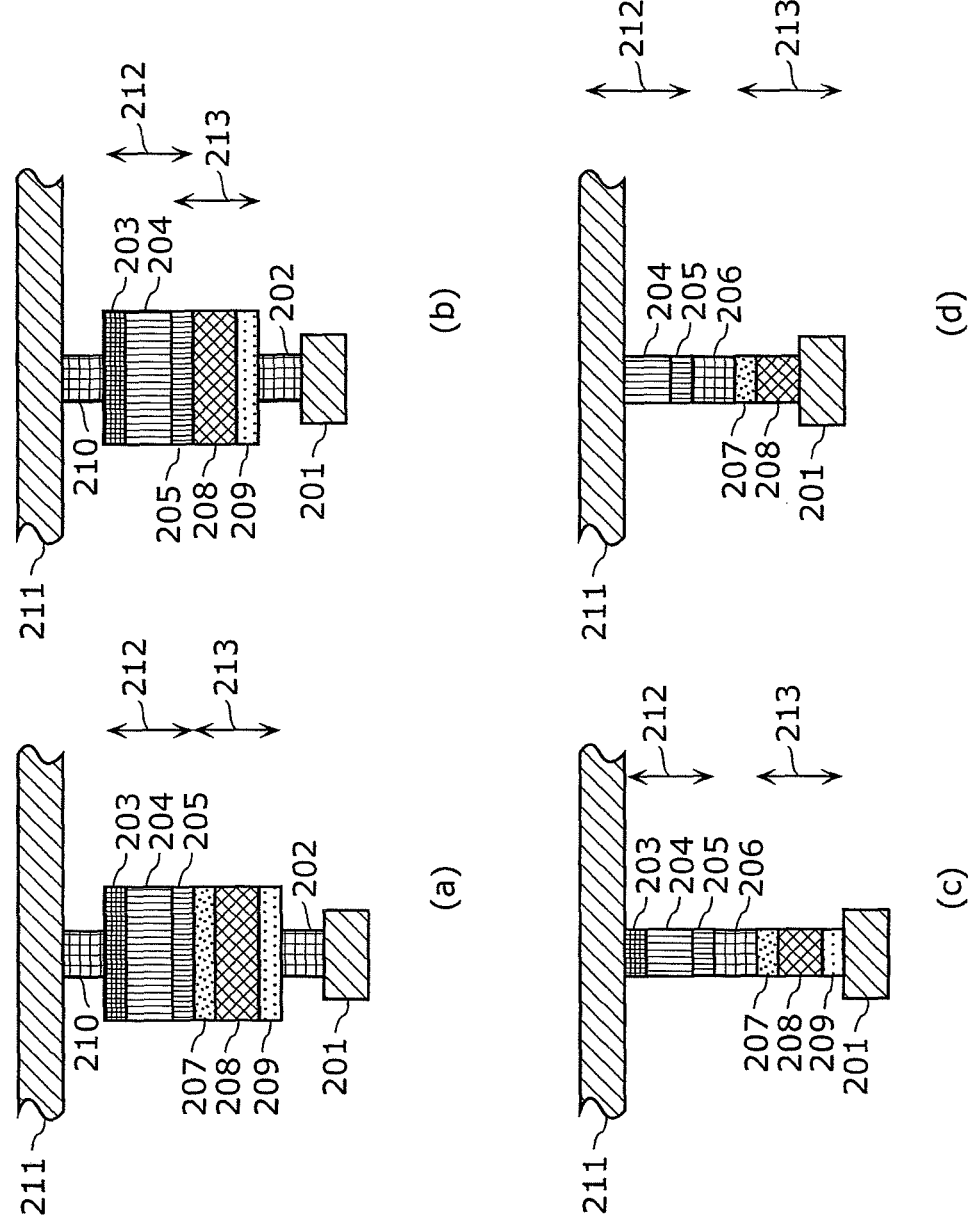
[FIG. 38]

FIG. 38(a) shows a memory cell in which the variable resistance element 213 and the current steering element 212 are provided in contact without the second via 206.

As compared to FIG. 38(a), FIG. 38(b) shows a memory cell in which the fourth electrode 205 comprising TaN of the current steering element 212 and the first electrode comprising TaN of the variable resistance element 213 are shared. This memory cell is easy to manufacture because of the shared electrode.

FIG. 38(c) shows a memory cell in which the variable resistance element 213 and the current steering element 212 each have the same diameter as the second via 206. With the same diameter as the second via 206, this memory cell can be disposed in the minimum interval of lines, allowing for a reduction in area. This memory cell is one example in which a size of section (including the above diameter as an example), orthogonal to the stacking direction, of the variable resistance element 213 and the current steering element 212 is set to be equal to or smaller than that of the via.

As compared to FIG. 38(c), FIG. 38(d) shows a memory cell in which the first-layer line 201 contains Pt so that the first-layer line is used as the second electrode of the variable resistance element 213, and the second-layer line 211 contains TaN so that the second-layer line is used as the third electrode of the current steering element 212. In this case, it is no longer necessary to provide the second electrode of the resistance variable element 213 and the third electrode of the current steering element 212, which allows for a reduction in area. While FIG. 38(d) shows an example in which both of the second-layer line 211 and the first-layer line 201 are shared by respective ends of the memory cell, it may also be possible that only one of these is shared.

While the above describes configuration examples in which the variable resistance element 213, the current steering element 212, and the second-layer line 211 are positioned in this order on the first-layer line 201, it may also be possible in the cases of FIGS. 36, 38(a), 38(c), and 38(d) that the current steering element 212, the variable resistance element 213, and the second-layer line 211 are positioned in this order on the first-layer line 201. In such a configuration, the fourth electrode 205, the current steering layer 204, and the third electrode 203, of the current steering element 212, and the second electrode 209, the variable resistance layer 208, and the first electrode 207, of the variable resistance element 213, and the second-layer line 211 are formed in this order on the first-layer line 201.

Figure 39:
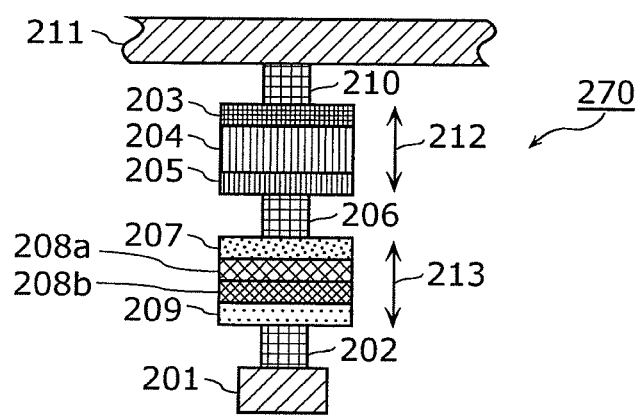
[FIG. 39]

FIG. 39 shows one example of a memory cell 270 which operates in the A mode with another structure. Parts common with FIG. 36 have the same numeric identifiers.

As shown in FIG. 39, the memory cell 270 includes, in this order, the first-layer line 201 comprising aluminum (Al), the first via 202, the second electrode 209 comprising platinum (Pt) in the variable resistance element, the second tantalum oxide layer 208b having a high oxygen content atomic percentage, the first tantalum oxide layer 208a having a low oxygen content atomic percentage, the first electrode 207 comprising platinum (Pt) in the variable resistance element, the second via 206, the fourth electrode 205 comprising tantalum nitride (TaN) in the current steering element, the current steering layer 204 comprising nitrogen-deficient silicon nitride, the third electrode 203 comprising TaN in the current steering element, the third via 210, and the second-layer line 211 comprising aluminum (Al), and is characterized in that the second tantalum oxide layer 208b is formed in contact with the second electrode 209 that is the lower electrode of the variable resistance element.

In this configuration, as disclosed in the related application of the present invention cited in the basic data for the present invention, a change in resistance occurs in the vicinity of the interface between the second electrode 209 that is the lower electrode and the second tantalum oxide layer 208b, and this behavior corresponds to the A mode.

As the first-layer line 201 of FIG. 39 corresponds to the bit line BL1 and the second-layer line 211 of FIG. 39 corresponds to the word line WL1, the variable resistance element 213 changes to the low resistance state when a voltage of the second-layer line 211 relative to a voltage of the first-layer line 201 becomes a predetermined voltage VLth or higher, and the variable resistance element 213 changes to the low resistance state when a voltage of the first-layer line 201 relative to a voltage of the second-layer line 211 becomes a predetermined voltage VHth or higher.

FIGS. 40(a) to 40(c) all show the other examples of a memory cell operating in the A mode, each of which has a structure holding a variable resistance layer between an upper electrode and a lower electrode as in the case of FIG. 39 and in each of which the second tantalum oxide layer having a high oxygen content atomic percentage is provided in contact with the lower electrode.

FIG. 40(a) shows a memory cell in which the variable resistance element 213 and the current steering element 212 are provided in contact without the second via 206.

FIG. 40(b) shows a memory cell in which the variable resistance element 213 and the current steering element 212 each have the same diameter as the second via 206. With the same diameter as the second via 206, this memory cell can be disposed in the minimum interval of lines, allowing for a reduction in area. This memory cell is one example in which a size of section (including the above diameter as an example), orthogonal to the stacking direction, of the variable resistance element 213 and the current steering element 212 is set to be equal to or smaller than that of the via.

As compared to FIG. 40(b), FIG. 40(c) shows a memory cell in which the first-layer line 201 contains Pt so that the first-layer line is used as the second electrode of the variable resistance element 213, and the second-layer line 211 contains TaN so that the second-layer line is used as the third electrode of the current steering element 212. In this case, it is no longer necessary to provide the second electrode of the variable resistance element 213 and the third electrode of the current steering element 212, which allows for a reduction in area. While FIG. 40(c) shows an example in which both of the second-layer line 211 and the first-layer line 201 are shared by respective ends of the memory cell, it may also be possible that only one of these is shared.

Figure 40:
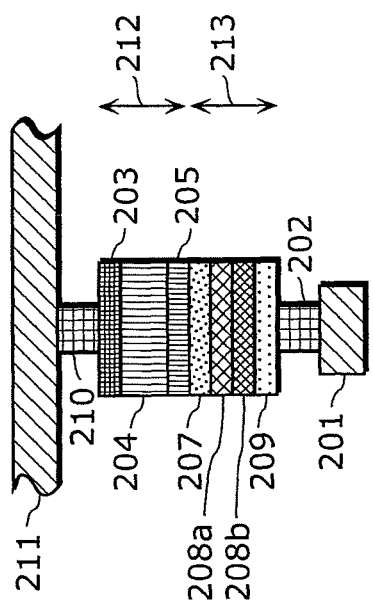
[FIG. 40]
Figure 40:
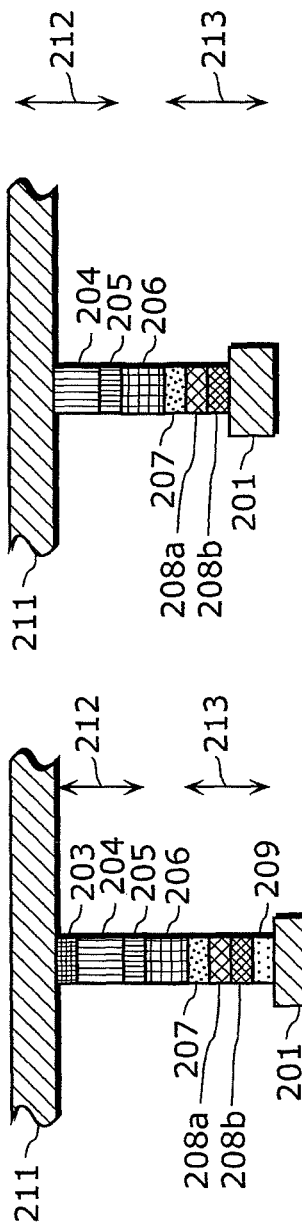
Figure 40:
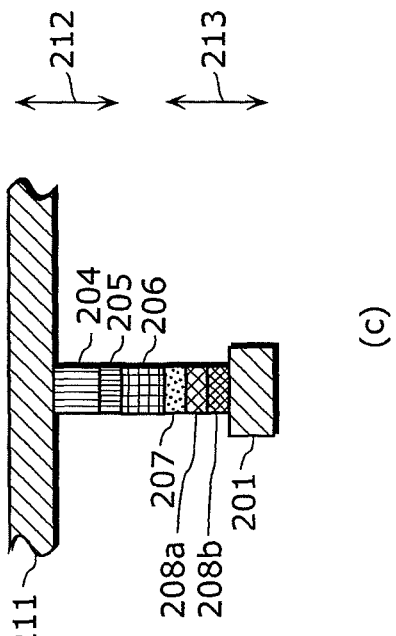
Figure 41:
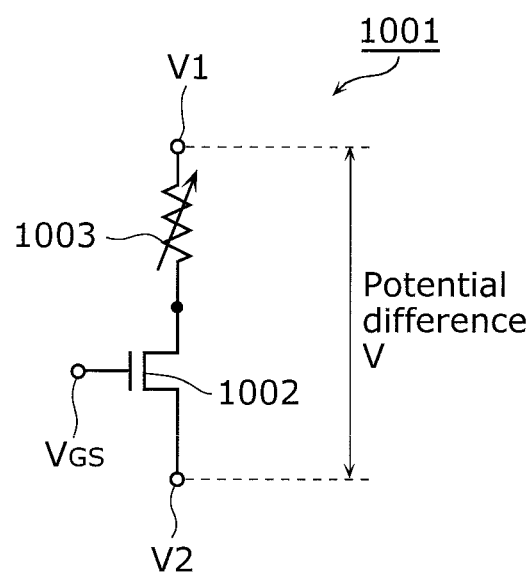
[FIG. 41]
Figure 42:
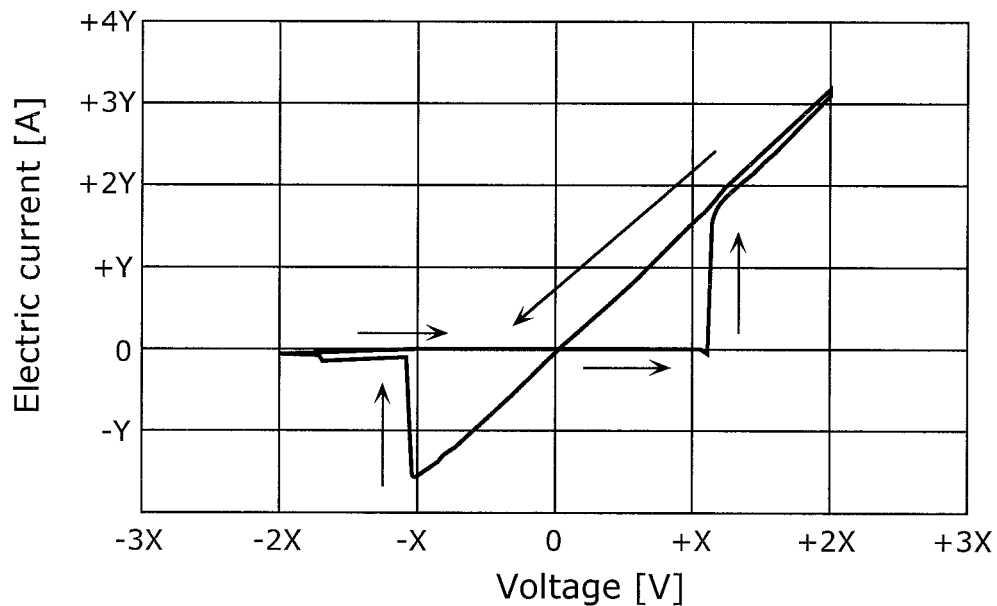
[FIG. 42]
Figure 43:
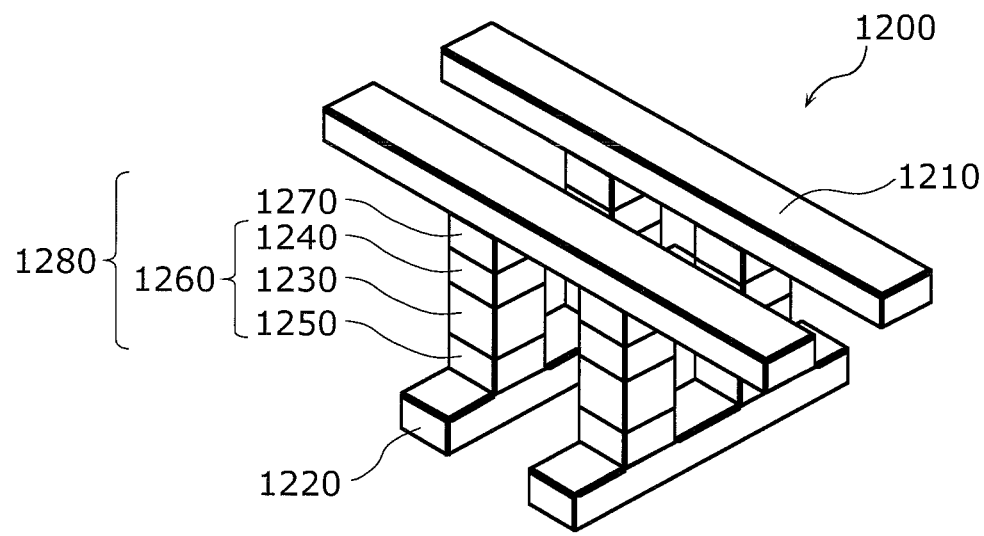
[FIG. 43]
Figure 44:
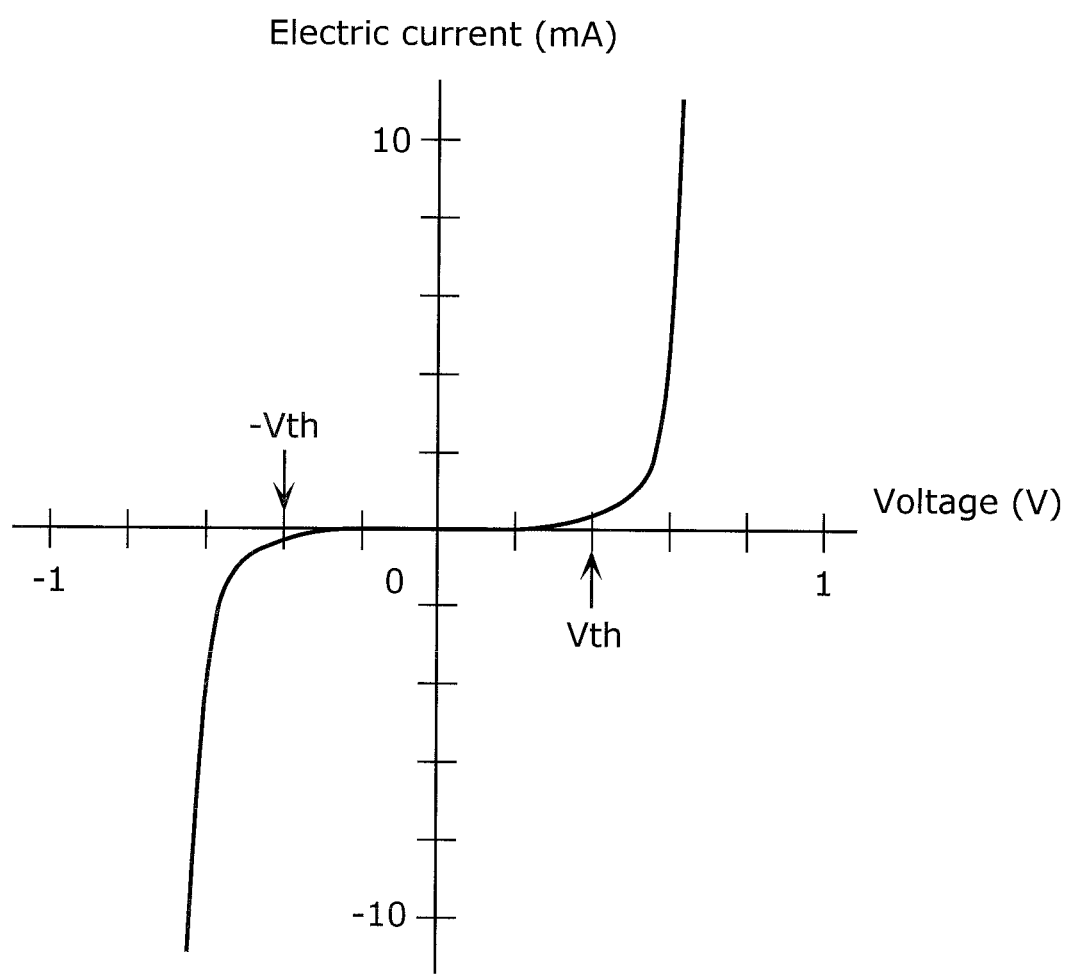
[FIG. 44]

While the above describes configuration examples in which the variable resistance element 213, the current steering element 212, and the second-layer line 211 are positioned in this order on the first-layer line 201, it may also be possible in the cases of FIGS. 39 and 40 that the current steering element 212, the variable resistance element 213, and the second-layer line 211 are positioned in this order on the first-layer line 201. In such a configuration, the fourth electrode 205, the current steering layer 204, and the third electrode 203, of the current steering element 212, and the second electrode 209, the variable resistance layer 208, and the first electrode 207, of the variable resistance element 213, and the second-layer line 211 are formed in this order on the first-layer line 201.

Needless to say, it is also possible to provide a configuration which combines different electrodes and a tantalum oxide layer having a different concentration, such as a configuration in which the lower electrode contains a material having a higher standard electrode potential, like the electrode configuration of FIGS. 36 and 38(a) to 38(d), and the second tantalum oxide layer having a high oxygen content atomic percentage shown in FIGS. 39 and 40(a) to 40(c) is provided in contact with the lower electrode. Furthermore, the third electrode 203 or the third electrode 203 and the current steering layer 204 may be formed in the same wiring pattern on the second-layer line 211. The second electrode 209 may also be formed in the same wiring pattern under the first-layer line 201.

As the transition metal oxide for the variable resistance layer, the tantalum oxide and hafnium oxide have been described in the above embodiments, but other transition metal oxides such as a zirconium oxide may be applied likewise. Furthermore, the transition metal oxide layer held between the upper and lower electrodes only needs to include an oxide layer of tantalum, hafnium, zirconium, or the like as a primary variable resistance layer which causes a change in resistance, and thus may contain a small amount of other chemical elements. It is also possible to add a small amount of other chemical elements on purpose to make a fine control on a resistance value, which is also included in the scope of the present invention. In forming a resistance film by sputtering, a small amount of an element may be mixed unintentionally due to residual gas or gas emission from a wall of a vacuumed vessel, and it is a matter of course that such a case where a small amount of a chemical element is mixed in the resistance film is also included in the scope of the present invention.

[Industrial Applicability]

The variable resistance nonvolatile memory device according to an implementation of the present invention has high reliability and stable write characteristics, and is thus useful as a nonvolatile memory device which is used in variable electronic devices such as digital home appliances, memory cards, mobile phones, and personal computers.

| [Reference Signs List] | |
| --- | --- |
| 100, 120 | Variable resistance nonvolatile memory device |
| 101, 121 | Memory body |

-continued

[Reference Signs List]

| | |
|---|---|
| 102, 122 | Memory cell array |
| 103 | Row selection circuit |
| 104 | Column selection circuit |
| 105 | Write circuit |
| 105a1 | First LR drive circuit |
| 105a2 | Second HR drive circuit |
| 105b | Current limit circuit |
| 105c1 | First HR drive circuit |
| 105c2 | Second LR drive circuit |
| 106 | Read circuit |
| 107 | Data input/output circuit |
| 108 | Address input circuit |
| 109 | Control circuit |
| 200, 220, 250, 270, 1001, 1280 | Memory cell |
| 201 | First-layer line |
| 202 | First via |
| 203 | Third electrode |
| 204 | Current steering layer |
| 205 | Fourth electrode |
| 206 | Second via |
| 207 | First electrode |
| 208, 1230, 3302 | Variable resistance layer |
| 208a | First tantalum oxide layer |
| 208b | Second tantalum oxide layer |
| 209 | Second electrode |
| 210 | Third via |
| 211 | Second-layer line |
| 212 | Current steering element |
| 213, 1003, 1260 | Variable resistance element |
| 500 | Nonvolatile memory device |
| 501 | Monocrystal silicon substrate |
| 502 | Oxide layer |
| 503, 1250, 1401, 1501, 3301 | Lower electrode |
| 504 | Oxide layer of oxygen-deficient transition metal (Ta or Hf) |
| 505, 1240, 1403, 1503, 3303 | Upper electrode |
| 506 | Element region |
| 1002 | Transistor |
| 1200 | Nonvolatile memory device |
| 1210 | Bit line |
| 1220 | Word line |
| 1270 | Diode element |
| 1402, 1502 | Oxygen-deficient Ta oxide layer |
| 1404, 1504 | Oxygen ion |

The invention claimed is:

1. A variable resistance nonvolatile memory device comprising:
a plurality of memory cells in each of which a variable resistance element and a current steering element having two terminals are connected in series, said variable resistance element changing, by application of a first voltage having a predetermined first polarity, to a low resistance state with a resistance value in a first range, and changing, by application of a second voltage having a second polarity opposite to the first polarity, to a high resistance state with a resistance value in a second range higher than the first range;
a plurality of first signal lines and a plurality of second signal lines crossing said first signal lines;
a memory cell array in which said memory cells are arranged at cross-points of said first signal lines and said second signal lines and each of said memory cells has ends connected to a set of one of said first signal lines and one of said second signal lines which crosses said first signal line;
a write circuit which generates a bipolar voltage to be applied to said memory cells through said first signal lines and said second signal lines; and
a current limit circuit placed in a path of a current flowing from said write circuit to said memory cells, said current limit circuit limiting only the current flowing in a direction for changing said memory cells to the low resistance state,
wherein in each of said memory cells,
said variable resistance element comprises: a first electrode; a second electrode; and a variable resistance layer placed between and in contact with said first electrode and said second electrode,
said variable resistance layer contains an oxide of metal as a primary variable resistance material,
said first electrode and said second electrode are made of materials of different elements, and
relations $V_t < V_2$ and $V_1 < V_2$ are satisfied where $V_1$ represents a standard electrode potential of said first electrode, $V_2$ represents a standard electrode potential of said second electrode, and $V_t$ represents a standard electrode potential of the metal primarily comprised in said variable resistance layer,
wherein each of said memory cells changes to the low resistance state when the first voltage having the first polarity such that said first signal line has a higher voltage than said second signal line is applied to said memory cell through said first signal line and said second signal line connected to said memory cell, and each of said memory cells changes to the high resistance state when the second voltage having the second polarity opposite to the first polarity is applied to said memory cell through said first signal line and said second signal line connected to said memory cell,
said write circuit comprises: a first drive circuit which generates a first drive voltage equal to or higher than the first voltage; a second drive circuit which generates a second drive voltage equal to or higher than the second voltage; a third drive circuit which generates a voltage serving as a basis for the first drive voltage; and a fourth drive circuit which generates a voltage serving as a basis for the second drive voltage,
said variable resistance nonvolatile memory device further comprises:
a first selection circuit which connects said first drive circuit and said fourth drive circuit to a selected one of said first signal lines; and
a second selection circuit which connects said second drive circuit and said third drive circuit to a selected one of said second signal lines, and
said current limit circuit is placed between said first drive circuit and said first selection circuit.

2. A variable resistance nonvolatile memory device comprising:
a plurality of memory cells in each of which a variable resistance element and a current steering element having two terminals are connected in series, said variable resistance element changing, by application of a first voltage having a predetermined first polarity, to a low resistance state with a resistance value in a first range, and changing, by application of a second voltage having a second polarity opposite to the first polarity, to a high resistance state with a resistance value in a second range higher than the first range;
a plurality of first signal lines and a plurality of second signal lines crossing said first signal lines;
a memory cell array in which said memory cells are arranged at cross-points of said first signal lines and said second signal lines and each of said memory cells has ends connected to a set of one of said first signal lines and one of said second signal lines which crosses said first signal line;

a write circuit which generates a bipolar voltage to be applied to said memory cells through said first signal lines and said second signal lines; and a plurality of current limit circuits, each of which is placed in a path of a current flowing from said write circuit to corresponding ones of said memory cells and limits only the current flowing in a direction for changing said corresponding memory cells to the low resistance state, wherein in each of said memory cells, said variable resistance element comprises: a first electrode; a second electrode; and a variable resistance layer placed between and in contact with said first electrode and said second electrode, said variable resistance layer contains an oxide of metal as a primary variable resistance material, said first electrode and said second electrode are made of materials of different elements, and relations $V_t < V_2$ and $V_1 < V_2$ are satisfied where $V_1$ represents a standard electrode potential of said first electrode, $V_2$ represents a standard electrode potential of said second electrode, and $V_t$ represents a standard electrode potential of the metal primarily comprised in said variable resistance layer, wherein each of said memory cells changes to the low resistance state when the first voltage having the first polarity such that said first signal line has a higher voltage than said second signal line is applied to said memory cell through said first signal line and said second signal line connected to said memory cell, and each of said memory cells changes to the high resistance state when the second voltage having the second polarity opposite to the first polarity is applied to said memory cell through said first signal line and said second signal line connected to said memory cell, said write circuit comprises: a first drive circuit which generates a first drive voltage equal to or higher than the first voltage; a second drive circuit which generates a second drive voltage equal to or higher than the second voltage; a third drive circuit which generates a voltage serving as a basis for the first drive voltage; and a fourth drive circuit which generates a voltage serving as a basis for the second drive voltage, said variable resistance nonvolatile memory device further comprises:

a first selection circuit which connects said first drive circuit and said fourth drive circuit to a selected one of said first signal lines; and a second selection circuit which connects said third drive circuit and said second drive circuit to a selected one of said second signal lines, and wherein each of said current limit circuits is placed between said first selection circuit and a corresponding one of said first signal lines.

3. A variable resistance nonvolatile memory device comprising:

a plurality of memory cells in each of which a variable resistance element and a current steering element having two terminals are connected in series, said variable resistance element changing, by application of a first voltage having a predetermined first polarity, to a low resistance state with a resistance value in a first range, and changing, by application of a second voltage having a second polarity opposite to the first polarity, to a high resistance state with a resistance value in a second range higher than the first range;

a plurality of first signal lines and a plurality of second signal lines crossing said first signal lines;

a memory cell array in which said memory cells are arranged at cross-points of said first signal lines and said second signal lines and each of said memory cells has ends connected to a set of one of said first signal lines and one of said second signal lines which crosses said first signal line;

a write circuit which generates a bipolar voltage to be applied to said memory cells through said first signal lines and said second signal lines; and a current limit circuit placed in a path of a current flowing from said write circuit to said memory cells, said current limit circuit limiting only the current flowing in a direction for changing said memory cells to the low resistance state, wherein in each of said memory cells, said variable resistance element comprises: a first electrode; a second electrode; and a variable resistance layer placed between and in contact with said first electrode and said second electrode, said variable resistance layer contains an oxide of metal as a primary variable resistance material, said first electrode and said second electrode are made of materials of different elements, and relations $V_t < V_2$ and $V_1 < V_2$ are satisfied where $V_1$ represents a standard electrode potential of said first electrode, $V_2$ represents a standard electrode potential of said second electrode, and $V_t$ represents a standard electrode potential of the metal primarily comprised in said variable resistance layer, wherein each of said memory cells changes to the low resistance state when the first voltage having the first polarity such that said first signal line has a higher voltage than said second signal line is applied to said memory cell through said first signal line and said second signal line connected to said memory cell, and each of said memory cells changes to the high resistance state when the second voltage having the second polarity opposite to the first polarity is applied to said memory cell through said first signal line and said second signal line connected to said memory cell, said write circuit comprises: a first drive circuit which generates a first drive voltage equal to or higher than the first voltage; a second drive circuit which generates a second drive voltage equal to or higher than the second voltage; a third drive circuit which generates a voltage serving as a basis for the first drive voltage; and a fourth drive circuit which generates a voltage serving as a basis for the second drive voltage, said variable resistance nonvolatile memory device further comprises:

a first selection circuit which connects said first drive circuit and said fourth drive circuit to a selected one of said first signal lines; and a second selection circuit which connects said third drive circuit and said second drive circuit to a selected one of said second signal lines, and said current limit circuit is placed between said third drive circuit and said second selection circuit.

4. A variable resistance nonvolatile memory device comprising:

a plurality of memory cells in each of which a variable resistance element and a current steering element having two terminals are connected in series, said variable resistance element changing, by application of a first voltage having a predetermined first polarity, to a low resistance state with a resistance value in a first range, and changing, by application of a second voltage having a second polarity opposite to the first polarity, to a high resistance state with a resistance value in a second range higher than the first range;

a plurality of first signal lines and a plurality of second signal lines crossing said first signal lines;

a memory cell array in which said memory cells are arranged at cross-points of said first signal lines and said second signal lines and each of said memory cells has ends connected to a set of one of said first signal lines and one of said second signal lines which crosses said first signal line;

a write circuit which generates a bipolar voltage to be applied to said memory cells through said first signal lines and said second signal lines; and a plurality of current limit circuits, each of which is placed in a path of a current flowing from said write circuit to corresponding ones of said memory cells and limits only the current flowing in a direction for changing said corresponding memory cells to the low resistance state, wherein in each of said memory cells, said variable resistance element comprises: a first electrode; a second electrode; and a variable resistance layer placed between and in contact with said first electrode and said second electrode, said variable resistance layer contains an oxide of metal as a primary variable resistance material, said first electrode and said second electrode are made of materials of different elements, and relations $V_t < V_2$ and $V_1 < V_2$ are satisfied where $V_1$ represents a standard electrode potential of said first electrode, $V_2$ represents a standard electrode potential of said second electrode, and $V_t$ represents a standard electrode potential of the metal primarily comprised in said variable resistance layer, wherein each of said memory cells changes to the low resistance state when the first voltage having the first polarity such that said first signal line has a higher voltage than said second signal line is applied to said memory cell through said first signal line and said second signal line connected to said memory cell, and each of said memory cells changes to the high resistance state when the second voltage having the second polarity opposite to the first polarity is applied to said memory cell through said first signal line and said second signal line connected to said memory cell, said write circuit comprises: a first drive circuit which generates a first drive voltage equal to or higher than the first voltage; a second drive circuit which generates a second drive voltage equal to or higher than the second voltage; a third drive circuit which generates a voltage serving as a basis for the first drive voltage; and a fourth drive circuit which generates a voltage serving as a basis for the second drive voltage, said variable resistance nonvolatile memory device further comprises:

a first selection circuit which connects said first drive circuit and said fourth drive circuit to a selected one of said first signal lines; and a second selection circuit which connects said third drive circuit and said second drive circuit to a selected one of said second signal lines, and wherein each of said current limit circuits is placed between said second selection circuit and a corresponding one of said second signal lines.

5. The variable resistance nonvolatile memory device according to claim 1, wherein in each of said memory cells, said current steering element comprises: a third electrode; a fourth electrode; and a current steering layer placed between and in contact with said third electrode and said fourth electrode, said first electrode is connected to said first signal line, said second electrode is connected to said third electrode, and said fourth electrode is connected to said second signal line, or said third electrode is connected to said first signal line, said fourth electrode is connected to said first electrode, and said second electrode is connected to said second signal line.

6. The variable resistance nonvolatile memory device according to claim 2, wherein in each of said memory cells, said current steering element comprises: a third electrode; a fourth electrode; and a current steering layer placed between and in contact with said third electrode and said fourth electrode, said first electrode is connected to said first signal line, said second electrode is connected to said third electrode, and said fourth electrode is connected to said second signal line, or said third electrode is connected to said first signal line, said fourth electrode is connected to said first electrode, and said second electrode is connected to said second signal line.

7. The variable resistance nonvolatile memory device according to claim 3, wherein in each of said memory cells, said current steering element comprises: a third electrode; a fourth electrode; and a current steering layer placed between and in contact with said third electrode and said fourth electrode, said first electrode is connected to said first signal line, said second electrode is connected to said third electrode, and said fourth electrode is connected to said second signal line, or said third electrode is connected to said first signal line, said fourth electrode is connected to said first electrode, and said second electrode is connected to said second signal line.

8. The variable resistance nonvolatile memory device according to claim 4, wherein in each of said memory cells, said current steering element comprises: a third electrode; a fourth electrode; and a current steering layer placed between and in contact with said third electrode and said fourth electrode, said first electrode is connected to said first signal line, said second electrode is connected to said third electrode, and said fourth electrode is connected to said second signal line, or said third electrode is connected to said first signal line, said fourth electrode is connected to said first electrode, and said second electrode is connected to said second signal line.

9. The variable resistance nonvolatile memory device according to claim 1, wherein said current limit circuit comprises an N-type MOS transistor.

10. The variable resistance nonvolatile memory device according to claim 2,
wherein each of said current limit circuits comprises an N-type MOS transistor.

11. The variable resistance nonvolatile memory device according to claim 3,
wherein said current limit circuit comprises an N-type MOS transistor.

12. The variable resistance nonvolatile memory device according to claim 1,
wherein said current limit circuit comprises an N-type MOS transistor, and
when said variable resistance element is set to have a resistance value which is, among resistance values in the first range, larger than a third resistance value that is set when a third voltage is applied to said memory cell, and smaller than a fourth resistance value that is set when a fourth voltage smaller than the third voltage is applied to said memory cell,
a gate voltage of said N-type MOS transistor is set to be (i) larger than a value obtained by adding an absolute value of a threshold voltage of said N-type MOS transistor to the fourth voltage, (ii) smaller than a value obtained by adding the absolute value of the threshold voltage of said N-type MOS transistor to the third voltage, and (iii) equal to or lower than the first drive voltage.

13. The variable resistance nonvolatile memory device according to claim 2,
wherein each of said current limit circuits comprises an N-type MOS transistor, and
when said variable resistance element is set to have a resistance value which is, among resistance values in the first range, larger than a third resistance value that is set when a third voltage is applied to said memory cell, and smaller than a fourth resistance value that is set when a fourth voltage smaller than the third voltage is applied to said memory cell,
a gate voltage of said N-type MOS transistor is set to be (i) larger than a value obtained by adding an absolute value of a threshold voltage of said N-type MOS transistor to the fourth voltage, (ii) smaller than a value obtained by adding the absolute value of the threshold voltage of said N-type MOS transistor to the third voltage, and (iii) equal to or lower than the first drive voltage.

14. The variable resistance nonvolatile memory device according to claim 3,
wherein said current limit circuit comprises an N-type MOS transistor, and
when said variable resistance element is set to have a resistance value which is, among resistance values in the first range, larger than a third resistance value that is set when a third voltage is applied to said memory cell, and smaller than a fourth resistance value that is set when a fourth voltage smaller than the third voltage is applied to said memory cell,
a gate voltage of said N-type MOS transistor is set to be (i) larger than a value obtained by subtracting the third voltage from the first drive voltage and adding up an absolute value of a threshold voltage of said N-type MOS transistor, and (ii) smaller than a value obtained by subtracting the fourth voltage from the first drive voltage and adding up the absolute value of the threshold voltage of said N-type MOS transistor.

15. The variable resistance nonvolatile memory device according to claim 2,
wherein each of said current limit circuits comprises an N-type MOS transistor, and said N-type MOS transistor is used as said current limit circuits and said first selection circuit when a selection signal is provided to a gate of said N-type MOS transistor.

16. The variable resistance nonvolatile memory device according to claim 1,
wherein said current limit circuit comprises a P-type MOS transistor.

17. The variable resistance nonvolatile memory device according to claim 3,
wherein said current limit circuit comprises a P-type MOS transistor.

18. The variable resistance nonvolatile memory device according to claim 4,
wherein each of said current limit circuits comprises a P-type MOS transistor.

19. The variable resistance nonvolatile memory device according to claim 1,
wherein said current limit circuit comprises a P-type MOS transistor, and
when said variable resistance element is set to have a resistance value which is, among resistance values in the first range, larger than a third resistance value that is set when a third voltage is applied to said memory cell, and smaller than a fourth resistance value that is set when a fourth voltage smaller than the third voltage is applied to said memory cell,
a gate voltage of said P-type MOS transistor is set to be (i) larger than a value obtained by subtracting an absolute value of a threshold voltage of said P-type MOS transistor from the fourth voltage, and (ii) smaller than a value obtained by subtracting the absolute value of the threshold voltage of said P-type MOS transistor from the third voltage.

20. The variable resistance nonvolatile memory device according to claim 3,
wherein said current limit circuit comprises a P-type MOS transistor, and
when said variable resistance element is set to have a resistance value which is, among resistance values in the first range, larger than a third resistance value that is set when a third voltage is applied to said memory cell, and smaller than a fourth resistance value that is set when a fourth voltage smaller than the third voltage is applied to said memory cell,
a gate voltage of said P-type MOS transistor is set to be (i) larger than a value obtained by subtracting the third voltage and an absolute value of a threshold voltage of said P-type MOS transistor from the first drive voltage, (ii) smaller than a value obtained by subtracting the fourth voltage and the threshold voltage of said P-type MOS transistor from the first drive voltage, and (iii) equal to or higher than a reference voltage of the first drive voltage.

21. The variable resistance nonvolatile memory device according to claim 4,
wherein each of said current limit circuits comprises a P-type MOS transistor, and
when said variable resistance element is set to have a resistance value which is, among resistance values in the first range, larger than a third resistance value that is set when a third voltage is applied to said memory cell, and smaller than a fourth resistance value that is set when a fourth voltage smaller than the third voltage is applied to said memory cell,
a gate voltage of said P-type MOS transistor is set to be (i) larger than a value obtained by subtracting the third voltage and an absolute value of a threshold voltage of said P-type MOS transistor from the first drive voltage, (ii) smaller than a value obtained by subtracting the fourth voltage and the threshold voltage of said P-type MOS transistor from the first drive voltage, and (iii) equal to or higher than a reference voltage of the first drive voltage.

22. The variable resistance nonvolatile memory device according to claim 4,
wherein each of said current limit circuits comprises a P-type MOS transistor, and
said P-type MOS transistor is used as said current limit circuits and said second selection circuit when a selection signal is provided to a gate of said P-type MOS transistor.

23. The variable resistance nonvolatile memory device according to claim 12,
wherein the third resistance value is a minimum resistance value in the first range, and
a current flowing to said memory cell when said variable resistance element is set at the third resistance value is equal to or less than a maximum current that said current steering element is resistant to breakage.

24. The variable resistance nonvolatile memory device according to claim 13,
wherein the third resistance value is a minimum resistance value in the first range, and
a current flowing to said memory cell when said variable resistance element is set at the third resistance value is equal to or less than a maximum current that said current steering element is resistant to breakage.

25. The variable resistance nonvolatile memory device according to claim 14,
wherein the third resistance value is a minimum resistance value in the first range, and
a current flowing to said memory cell when said variable resistance element is set at the third resistance value is equal to or less than a maximum current that said current steering element is resistant to breakage.

26. The variable resistance nonvolatile memory device according to claim 19,
wherein the third resistance value is a minimum resistance value in the first range, and
a current flowing to said memory cell when said variable resistance element is set at the third resistance value is equal to or less than a maximum current that said current steering element is resistant to breakage.

27. The variable resistance nonvolatile memory device according to claim 20,
wherein the third resistance value is a minimum resistance value in the first range, and
a current flowing to said memory cell when said variable resistance element is set at the third resistance value is equal to or less than a maximum current that said current steering element is resistant to breakage.

28. The variable resistance nonvolatile memory device according to claim 21,
wherein the third resistance value is a minimum resistance value in the first range, and
a current flowing to said memory cell when said variable resistance element is set at the third resistance value is equal to or less than a maximum current that said current steering element is resistant to breakage.

29. The variable resistance nonvolatile memory device according to claim 12,
wherein the fourth resistance value is a maximum resistance value in the first range and is a maximum resistance value that the low resistance value and the high resistance value can be distinguished using a read circuit.

30. The variable resistance nonvolatile memory device according to claim 13,
wherein the fourth resistance value is a maximum resistance value in the first range and is a maximum resistance value that the low resistance value and the high resistance value can be distinguished using a read circuit.

31. The variable resistance nonvolatile memory device according to claim 14,
wherein the fourth resistance value is a maximum resistance value in the first range and is a maximum resistance value that the low resistance value and the high resistance value can be distinguished using a read circuit.

32. The variable resistance nonvolatile memory device according to claim 19,
wherein the fourth resistance value is a maximum resistance value in the first range and is a maximum resistance value that the low resistance value and the high resistance value can be distinguished using a read circuit.

33. The variable resistance nonvolatile memory device according to claim 20,
wherein the fourth resistance value is a maximum resistance value in the first range and is a maximum resistance value that the low resistance value and the high resistance value can be distinguished using a read circuit.

34. The variable resistance nonvolatile memory device according to claim 21,
wherein the fourth resistance value is a maximum resistance value in the first range and is a maximum resistance value that the low resistance value and the high resistance value can be distinguished using a read circuit.

35. The variable resistance nonvolatile memory device according to claim 1,
wherein said current limit circuit comprises an N-type or P-type MOS transistor, and
relations W2/L2>WC/LC and W4/L4>WC/LC are satisfied where WC and LC represent a gate width and a gate length, respectively, of said MOS transistor, W2 and L2 represent a gate width and a gate length, respectively, of said MOS transistor in said second drive circuit, and W4 and L4 represent a gate width and a gate length, respectively, of said MOS transistor in said fourth drive circuit.

36. The variable resistance nonvolatile memory device according to claim 2,
wherein each of said current limit circuits comprises an N-type or P-type MOS transistor, and
relations W2/L2>WC/LC and W4/L4>WC/LC are satisfied where WC and LC represent a gate width and a gate length, respectively, of said MOS transistor, W2 and L2 represent a gate width and a gate length, respectively, of said MOS transistor in said second drive circuit, and W4 and L4 represent a gate width and a gate length, respectively, of said MOS transistor in said fourth drive circuit.

37. The variable resistance nonvolatile memory device according to claim 3,
wherein said current limit circuit comprises an N-type or P-type MOS transistor, and
relations W2/L2>WC/LC and W4/L4>WC/LC are satisfied where WC and LC represent a gate width and a gate length, respectively, of said MOS transistor, W2 and L2 represent a gate width and a gate length, respectively, of said MOS transistor in said second drive circuit, and W4 and L4 represent a gate width and a gate length, respectively, of said MOS transistor in said fourth drive circuit.

38. The variable resistance nonvolatile memory device according to claim 4,
wherein each of said current limit circuits comprises an N-type or P-type MOS transistor, and
relations W2/L2>WC/LC and W4/L4>WC/LC are satisfied where WC and LC represent a gate width and a gate length, respectively, of said MOS transistor, W2 and L2 represent a gate width and a gate length, respectively, of said MOS transistor in said second drive circuit, and W4 and L4 represent a gate width and a gate length, respectively, of said MOS transistor in said fourth drive circuit.

* * * * *